(12) United States Patent
Sakamoto et al.

(10) Patent No.: US 8,837,223 B2
(45) Date of Patent: Sep. 16, 2014

(54) NONVOLATILE SEMICONDUCTOR MEMORY DEVICE AND METHOD FOR MANUFACURING THE SAME

(75) Inventors: Wataru Sakamoto, Yokkaichi (JP); Fumitaka Arai, Yokkaichi (JP); Takashi Kobayashi, Yokkaichi (JP); Ken Komiya, Yokkaichi (JP); Shinichi Sotome, Yokkaichi (JP); Tatsuya Kato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 13/600,991

(22) Filed: Aug. 31, 2012

(65) Prior Publication Data

US 2013/0235666 A1    Sep. 12, 2013

(30) Foreign Application Priority Data

Nov. 21, 2011 (JP) ................................. 2011-253928
Nov. 24, 2011 (JP) ................................. 2011-255910
Mar. 19, 2012 (JP) ................................. 2012-062726
Mar. 26, 2012 (JP) ................................. 2012-069040

(51) Int. Cl.
| | | |
|---|---|---|
| G11C 16/04 | (2006.01) | |
| G11C 16/34 | (2006.01) | |
| G11C 11/56 | (2006.01) | |
| H01L 21/28 | (2006.01) | |
| H01L 29/788 | (2006.01) | |
| G11C 16/10 | (2006.01) | |

(52) U.S. Cl.
CPC ............ *G11C 16/04* (2013.01); *G11C 16/0483* (2013.01); *G11C 16/3459* (2013.01); *G11C 16/10* (2013.01); *G11C 11/5628* (2013.01); *H01L 21/28273* (2013.01); *H01L 29/788* (2013.01)

USPC ............ 365/185.17; 365/185.05; 365/185.25; 365/189.08; 365/189.16

(58) Field of Classification Search
USPC ............. 365/185.17, 185.05, 185.25, 189.08, 365/189.16
See application file for complete search history.

(56) References Cited

U.S. PATENT DOCUMENTS

| | | | |
|---|---|---|---|
| 7,015,550 B2 | 3/2006 | Sugimae | |
| 7,020,025 B2 | 3/2006 | Sato | |

(Continued)

FOREIGN PATENT DOCUMENTS

| | | |
|---|---|---|
| JP | 2006-504280 A | 2/2006 |
| JP | 2008-257781 A | 10/2008 |

(Continued)

OTHER PUBLICATIONS

Office Action issued Apr. 22, 2014 in Japanese Patent Application No. 2012-062726 with English translation.

(Continued)

*Primary Examiner* — Pho M Luu
(74) *Attorney, Agent, or Firm* — Oblon, Spivak, McClelland, Maier & Neustadt, L.L.P.

(57) ABSTRACT

A nonvolatile semiconductor memory device according to an embodiment includes: a memory cell array in which a plurality of NAND cell units are arranged, the NAND cell units including a plurality of memory cells, and select gate transistors, the memory cell including a semiconductor layer, a gate insulating film, a charge accumulation layer, and a control gate; and a control circuit. The control circuit adjusts a write condition of each of the memory cells in accordance with write data to each of the memory cells and memory cells adjacent to the memory cells within the data to be written.

20 Claims, 62 Drawing Sheets

(56) References Cited

U.S. PATENT DOCUMENTS

| | | | |
|---|---|---|---|
| 7,026,684 | B2 | 4/2006 | Sakuma |
| 7,054,195 | B2 * | 5/2006 | Matsunaga ............... 365/185.11 |
| 7,078,763 | B2 | 7/2006 | Arai |
| 7,382,652 | B2 * | 6/2008 | Shiga et al. ............... 365/185.17 |
| 7,505,312 | B2 | 3/2009 | Matsunaga |
| 7,649,777 | B2 * | 1/2010 | Ichige et al. ............... 365/185.17 |
| 7,652,948 | B2 * | 1/2010 | Lee et al. .................. 365/230.08 |
| 7,713,819 | B2 | 5/2010 | Okajima |
| 7,768,844 | B2 | 8/2010 | Takase |
| 7,907,446 | B2 | 3/2011 | Shimizu |
| 7,936,004 | B2 | 5/2011 | Kito |
| 8,013,382 | B2 | 9/2011 | Morikado |
| 8,339,857 | B2 * | 12/2012 | Edahiro ................... 365/185.17 |
| 8,541,830 | B1 * | 9/2013 | Nagashima et al. ........... 257/315 |
| 8,624,317 | B2 * | 1/2014 | Arai et al. ..................... 257/324 |
| 2007/0159881 | A1 | 7/2007 | Sato |
| 2007/0189073 | A1 | 8/2007 | Aritome |
| 2008/0006885 | A1 | 1/2008 | Arai |
| 2010/0181612 | A1 | 7/2010 | Kito |
| 2012/0217571 | A1 | 8/2012 | Arai |
| 2013/0248968 | A1 | 9/2013 | Nagashima et al. |

FOREIGN PATENT DOCUMENTS

| | | |
|---|---|---|
| JP | 2009-260196 | 11/2009 |
| JP | 2009-295232 | 12/2009 |
| JP | 2009-545093 | 12/2009 |
| JP | 2010-123210 A | 6/2010 |
| JP | 2010-212604 | 9/2010 |
| JP | 2010-539630 | 12/2010 |
| JP | 2013-201306 A | 10/2013 |

OTHER PUBLICATIONS

Office Action issued May 20, 2014 in Japanese Patent Application No. 2012-069040 with English translation.

* cited by examiner

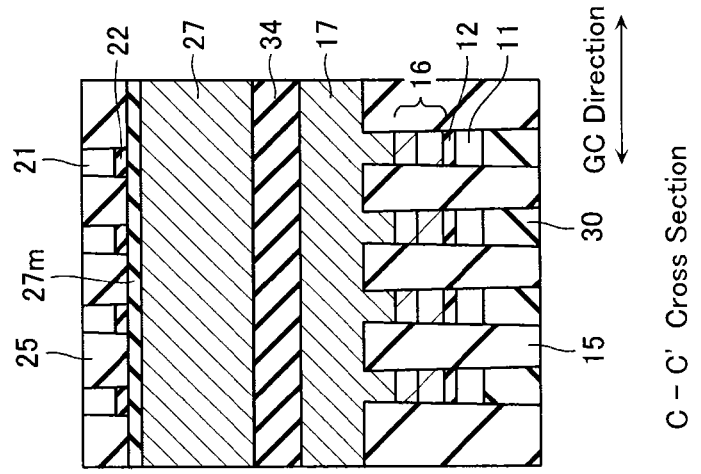
FIG. 6C C-C' Cross Section
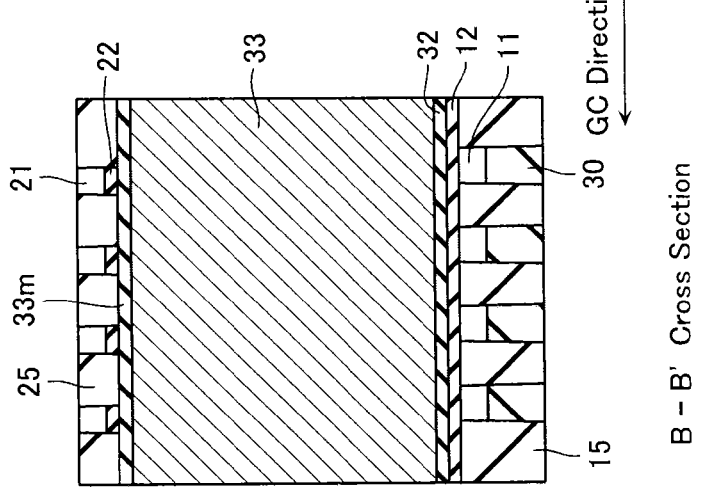
FIG. 6B B-B' Cross Section
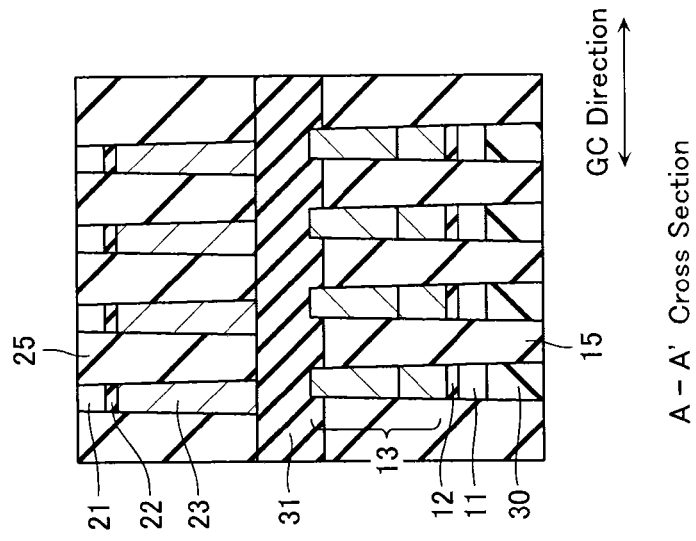
FIG. 6A A-A' Cross Section FIG. 16A
Distribution After Erasing
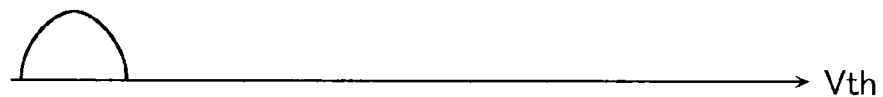
FIG. 16B
Weak Writing for Grouping
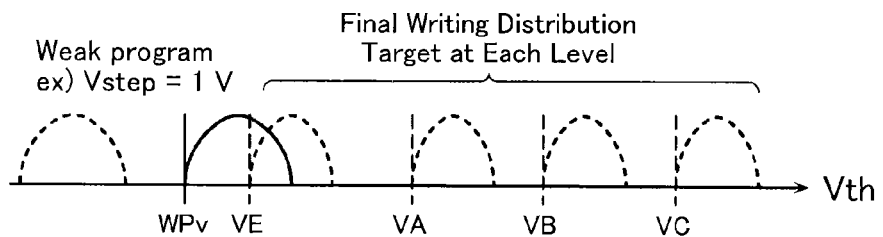
FIG. 17
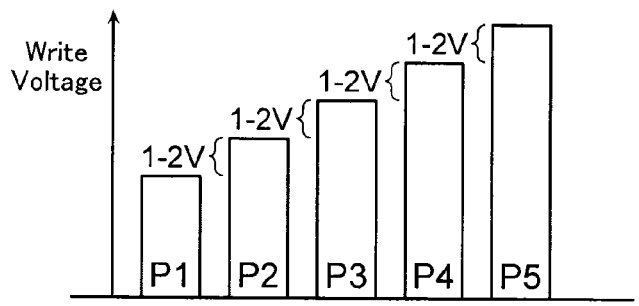
FIG. 18
|  | Group | | | |
|---|---|---|---|---|
|  | GR1 | GR2 | GR3 | GR4 |
| E | P1 | P1 | P2 | P3 |
| A | P2 | P2 | P3 | P4 |
| B | P2 | P3 | P4 | P5 |
| C | P3 | P4 | P5 | P5 |
Writing Data

| BL_{n+1} \ BL_{n-1} | C | B | A | E |
|---|---|---|---|---|
| C | 2 | 2 | 1 | 1 |
| B | 2 | 1 | 1 | 0 |
| A | 1 | 1 | 0 | 0 |
| E | 1 | 0 | 0 | 0 |

GC Direction

GC Direction

GC Direction

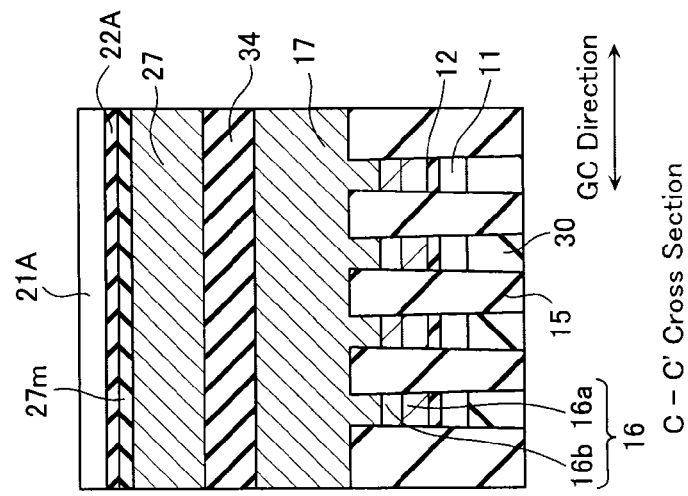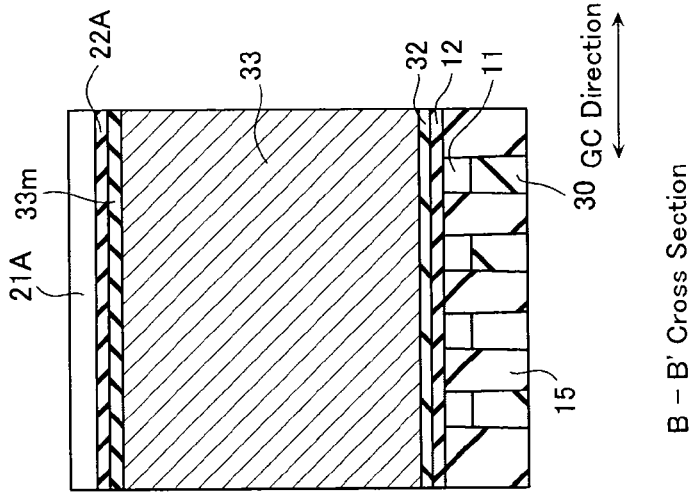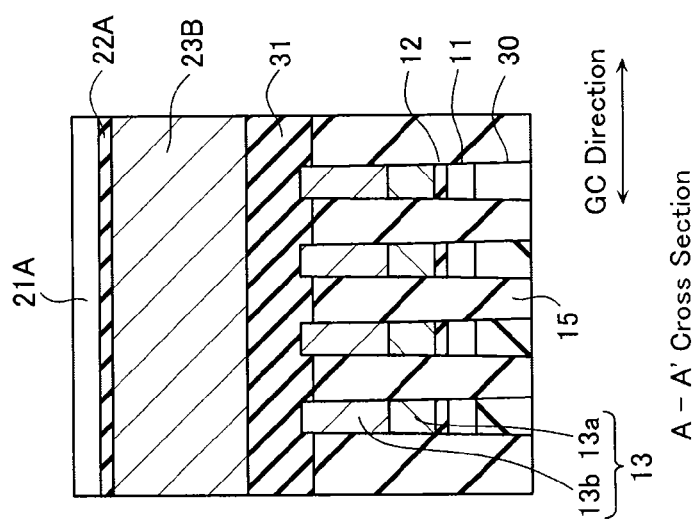

A - A' Cross Section

A - A' Cross Section

A - A' Cross Section

A - A' Cross Section

A – A' Cross Section

A - A' Cross Section

A - A' Cross Section

NONVOLATILE SEMICONDUCTOR MEMORY DEVICE AND METHOD FOR MANUFACURING THE SAME

CROSS-REFERENCE TO RELATED APPLICATIONS

This application is based on and claims the benefit of priority from the prior Japanese Patent Application No. 2011-253928, filed on Nov. 21, 2011, the prior Japanese Patent Application No. 2011-255910, filed on Nov. 24, 2011, the prior Japanese Patent Application No. 2012-062726, filed on Mar. 19, 2012 and the prior Japanese Patent Application No. 2012-069040, filed on Mar. 26, 2012, the entire contents of which are incorporated herein by reference.

BACKGROUND

1. Field

Embodiments described herein relate generally to a nonvolatile semiconductor memory device and a method for manufacturing the same.

2. Description of the Related Art

NAND type flash memories are known as electrically rewritable and highly integrable nonvolatile semiconductor memory devices. Memory transistors of conventional NAND type flash memories have a stacked-gate structure in which a charge accumulation layer (floating gate) and a control gate are stacked via an insulation film. A NAND cell unit is configured by a plurality of memory transistors connected in series in a column direction with adjoining ones sharing their source and drain, and select gate transistors provided at the ends of the column of memory transistors. One end of the NAND cell unit is connected to a bit line, and the other end thereof is connected to a source line. A memory cell array is configured by NAND cell units arranged in a matrix. NAND cell units arranged in a row direction are referred to as a NAND cell block. The gates of select gate transistors arranged in the same row are connected to the same select gate line, and the control gates of memory transistors arranged in the same row are connected to the same word line. When N memory transistors are connected in series in the NAND cell unit, the number of word lines included in one NAND cell block is N.

As the size of such NAND type flash memory decreases, the distance between memory cells decreases in the NAND type flash memory, and this enhances the proximity effect caused by increase of inter-cell capacity of memory cells, which widens the distribution of a threshold value of a memory cell, and as a result, this enhances disturbs and makes it difficult to ensure various kinds of retention margins.

Additionally, as for these memory cells, simply stacking them means a simple increase in the number of step of manufacturing, and it is hence difficult to reduce the bit cost while ensuring an increase in the cell capacity that is balanced with the cost increase. Simple stacking is effective only by a bit cost shrink ratio=1/the number of stacked layers, i.e., the division by the number of layers, which means that the shrink ratio is small when the number of layers is large, leading to a high bit cost. Therefore, in the cell structure seeking a shrink by stacking, an object from a practical standpoint is to restrict the number of steps and the cost.

BRIEF DESCRIPTION OF THE DRAWINGS

FIGS. 6A to 6C are cross-sectional diagrams taken along A-A', B-B', and C-C' of FIG. 4.

FIGS. 16A and 16B are schematic views for explaining weak-writing according to the method.

FIG. 17 is a schematic view for explaining pulse allocation according to the method.

FIG. 18 is a schematic view for explaining pulse allocation according to the method.

FIGS. 40A to 40C are cross-sectional diagrams illustrating a step of manufacturing the memory cell array.

DETAILED DESCRIPTION

Figure 1:
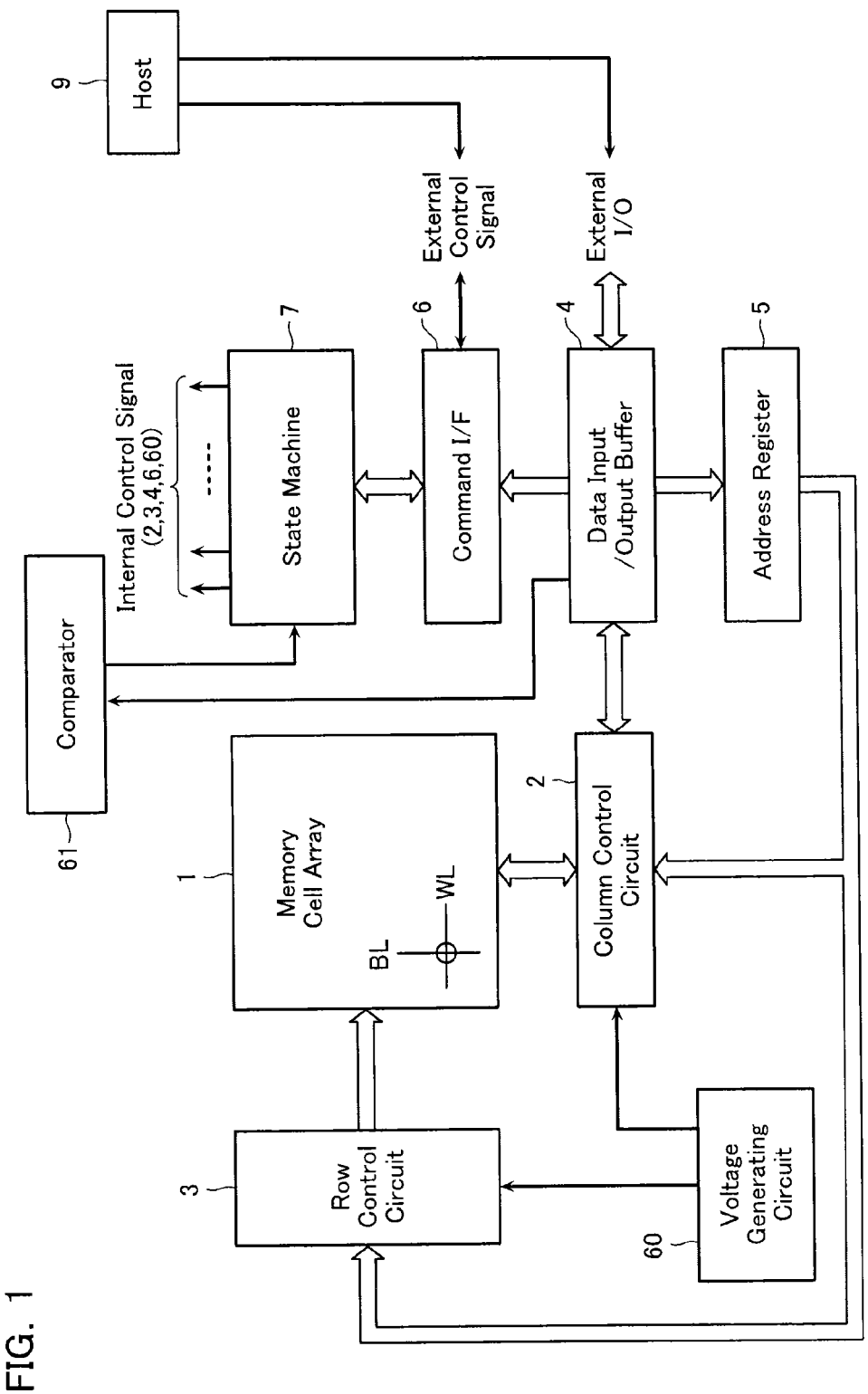
FIG. 1 is a block diagram illustrating overall configuration of a nonvolatile semiconductor memory device according to the first embodiment.

A nonvolatile semiconductor memory device according to an embodiment includes a memory cell array in which a plurality of NAND cell units are arranged in a second direction intersecting a first direction, the NAND cell units including a plurality of memory cells connected in series in the first direction, source line side select gate transistors which are connected between the plurality of memory cells and the source line, and bit line side select gate transistors which are connected between the plurality of memory cells and the bit line, the memory cell including a semiconductor layer, a gate insulating film formed on the semiconductor layer, a charge accumulation layer formed on the gate insulating film, and a control gate which extends in the second direction and which faces the charge accumulation layer via an inter-gate insulating film, and a control circuit for writing data to the memory cell in units of pages, wherein the plurality of memory cells arranged in the second direction as a page, wherein during write operation to the plurality of memory cells in units of pages, the control circuit adjusts a write condition of each of the memory cells in accordance with write data to each of the memory cells and write data to a memory cell adjacent to each of the memory cells in a page to be written.

A nonvolatile semiconductor memory device according to another embodiment includes a first memory cell array layer including first NAND cell units having a plurality of first memory cells connected in series in a first direction, the first memory cell including a first semiconductor layer, a first gate insulating film formed on the first semiconductor layer, and a first charge accumulation layer formed on the first gate insulating film, a first insulating film formed on the first memory cell array layer, a second memory cell array layer formed on the first insulating film and including second NAND cell units having a plurality of second memory cells connected in series in the first direction, and the second memory cell including a second charge accumulation layer, a second gate insulating film formed on the second charge accumulation layer, and a second semiconductor layer formed on the second gate insulating film, control gates formed via an inter-gate insulating film at both sides, in the first direction, of the first and second charge accumulation layers positioned the latter above the former via the first insulating film, the control gate extending in a second direction intersecting the first direction, lower contacts located at both ends of the first NAND cell unit, the lower contacts being formed in a same layer as the first charge accumulation layer, and being connected to the first semiconductor layer, and upper contacts located at both ends of the second NAND cell unit, wherein the second semiconductor layer and the lower contact are connected by the upper contact.

A nonvolatile semiconductor memory device according to an embodiment includes a first memory cell array layer including first NAND cell units having a plurality of first memory cells connected in series in a first direction, first source line side select gate transistors which are connected between the plurality of first memory cells and the source line, and first bit line side select gate transistors which are connected between the plurality of first memory cells and the bit line, the first memory cell including a first semiconductor layer, a first gate insulating film formed on the first semiconductor layer, and a first charge accumulation layer formed on the first gate insulating film, wherein the first source line side select gate transistor and the first bit line side select gate transistor include the first semiconductor layer, the first gate insulating film, and the first select gate formed on the first gate insulating film, a first insulating film formed on the first memory cell array layer, a second memory cell array layer formed on the first insulating film and including second NAND cell units having a plurality of second memory cells connected in series in the first direction, second source line side select gate transistors which are connected between the plurality of second memory cells and the source line, and second bit line side select gate transistors which are connected between the plurality of second memory cells and the bit line, the second memory cell including a second charge accumulation layer, a second gate insulating film formed on the second charge accumulation layer, and a second semiconductor layer formed on the second gate insulating film, wherein the second source line side select gate transistor and the second bit line side select gate transistor include the second select gate, the second gate insulating film, the second semiconductor layer formed on the second gate insulating film, control gates formed via an inter-gate insulating film at both sides, in the first direction, of the first and second charge accumulation layers positioned the latter above the former via the first insulating film, the control gate extending in a second direction intersecting the first direction, and an auxiliary gate formed via the inter-gate insulating film at both sides, in the first direction, of the first and second select gates positioned the latter above the former via the first insulating film, the control gate extending in the second direction, wherein a auxiliary transistor is constituted by the first and second semiconductor layers, the first and second gate insulating films, and the auxiliary gate.

A method for manufacturing a nonvolatile semiconductor memory device according to an embodiment includes forming a first gate insulating film and a first gate forming layer on a first semiconductor layer, forming a first trench, which extends in a second direction intersecting a first direction, in the first gate forming layer, the first gate insulating film, and the first semiconductor layer, forming a second gate forming layer on a surface of the first gate forming layer and a surface of the first semiconductor layer exposed from the first trench, forming second trenches, extending in the first direction with a certain cycle in the second direction, in the second gate forming layer, the first gate forming layer, the first gate insulating film, and the first semiconductor layer, filling a first element isolating insulating film in the second trenches, and forming a first insulating film on the first gate forming layer and the first element isolating insulating film, forming a third gate forming layer on the first insulating film, forming a plurality of third trenches, extending in the second direction, in the third gate forming layer, the first insulating film, the second gate forming layer, and the first gate forming layer, and forming a first charge accumulation layer, a first select gate, and a lower contact in the first and second gate forming layers, and filling control gates in the third trenches after an inter-gate insulating film is formed in the third trenches.

A method for manufacturing a nonvolatile semiconductor memory device according to another embodiment includes forming a first gate insulating film and a charge accumulation layer forming layer on a first semiconductor layer, forming trenches extending, in the first direction with a certain interval in a second direction intersecting the first direction, in the charge accumulation layer forming layer, the first gate insulating film, and the first semiconductor layer, and filling a first element isolating insulating film, forming a first insulating film on the charge accumulation layer forming layer and the first element isolating insulating film, and further forming a charge accumulation layer forming layer on the first insulating film, forming a plurality of trenches, extending in the second direction, in the first insulating film and the charge accumulation layer forming layer formed via the first insulating film, and covering the trenches with an inter-gate insulating film, and filling a control gate and an auxiliary gate into the inter-gate insulating film.

Embodiments will now be explained with reference to the attached drawings.

1. First Embodiment

1-1. Configuration

[1-1-1. Overall Configuration]

FIG. 1 is a block diagram illustrating overall configuration of a nonvolatile semiconductor memory device according to a first embodiment of the present invention.

This nonvolatile semiconductor memory device includes a memory cell array 1 having a plurality of NAND strings in each of which a plurality of memory cells MC are NAND-connected.

At a position adjacent to the memory cell array 1 in a direction of a bit line BL, a column control circuit 2 is provided. The column control circuit 2 controls bit lines BL of the memory cell array 1 to erase data in memory cells, write data to memory cells, and read data from memory cells.

At a position adjacent to the memory cell array 1 in a direction of a word line WL, a row control circuit 3 is provided. The row control circuit 3 selects a word line WL of the memory cell array 1 to apply a voltage required to erase data in memory cells, write data to memory cells, and read data from memory cells.

The data input/output buffer 4 is connected to an external host 9 via an I/O line, and the data input/output buffer 4 receives write data, receives an erase instruction, outputs read data, and receives address data and command data. The data input/output buffer 4 transmits received write data to the column control circuit 2, and receives data, which have been read from the column control circuit 2, to the outside. An address provided from the outside to the data input/output buffer 4 is transmitted via an address register 5 to the column control circuit 2 and the row control circuit 3.

A command provided from the host 9 to the data input/output buffer 4 is transmitted to a command/interface 6. The command/interface 6 receives an external control signal from the host 9, determines whether data which are input into the data input/output buffer 4 are write data, a command, or an address, and when the data are determined to be the command, command/interface 6 transfers the data to a state machine 7 as a received command signal.

The state machine 7 manages this entire nonvolatile memory. The state machine 7 receives the command from the host 9 via the command/interface 6, and manages reading, writing, erasing, input/output of data, and the like.

The external host 9 can also receive status information managed by the state machine 7, and determine operation result. This status information is also used for controlling writing and erasing.

The data input/output buffer 4 is connected to a comparator 61 for detecting and adding write data received by the data input/output buffer 4 and transferring it to the state machine 7. A logic circuit such as an adding circuit can be used as the comparator 61.

With the state machine 7, a voltage generating circuit 60 is controlled. With this control, the voltage generating circuit 60 can output pulses having any given voltage with any given timing. At the write operation, the state machine 7 can adjust a writing voltage using group information held in a cache and write schedule data held in the data input/output buffer 4, explained later, and adjust a verify voltage by looking up information which is output from the comparator 61.

The formed pulses can be transferred to any wire selected by the column control circuit 2 and the row control circuit 3. When a memory cell array 1 is formed in a wire layer, peripheral circuit devices other than the memory cell array 1 can be formed on a Si substrate immediately below the memory array 1, and accordingly, this nonvolatile memory can be formed to have substantially the same chip size as the size of area of the memory cell array 1.

[1-1-2. Memory Cell Array]

Subsequently, a configuration of the memory cell array 1 of the nonvolatile semiconductor memory device according to the first embodiment will be explained while it is compared with a comparative example.

As a cell structure for securing coupling between a floating gate (charge accumulation layer) and a control gate, the present embodiment has not the stacked-gate structure but a gate structure in which control gates are embedded at both sides of a floating gate to let the floating gate couple with the control gates on both sides thereof.

Figure 2:
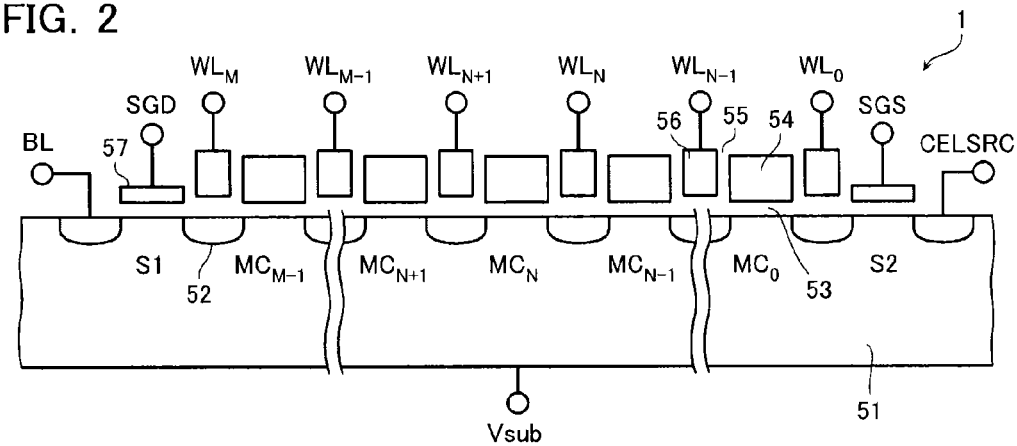
FIG. 2 is a schematic cross-sectional diagram illustrating a memory cell array structure according to a comparative example.
Figure 3:
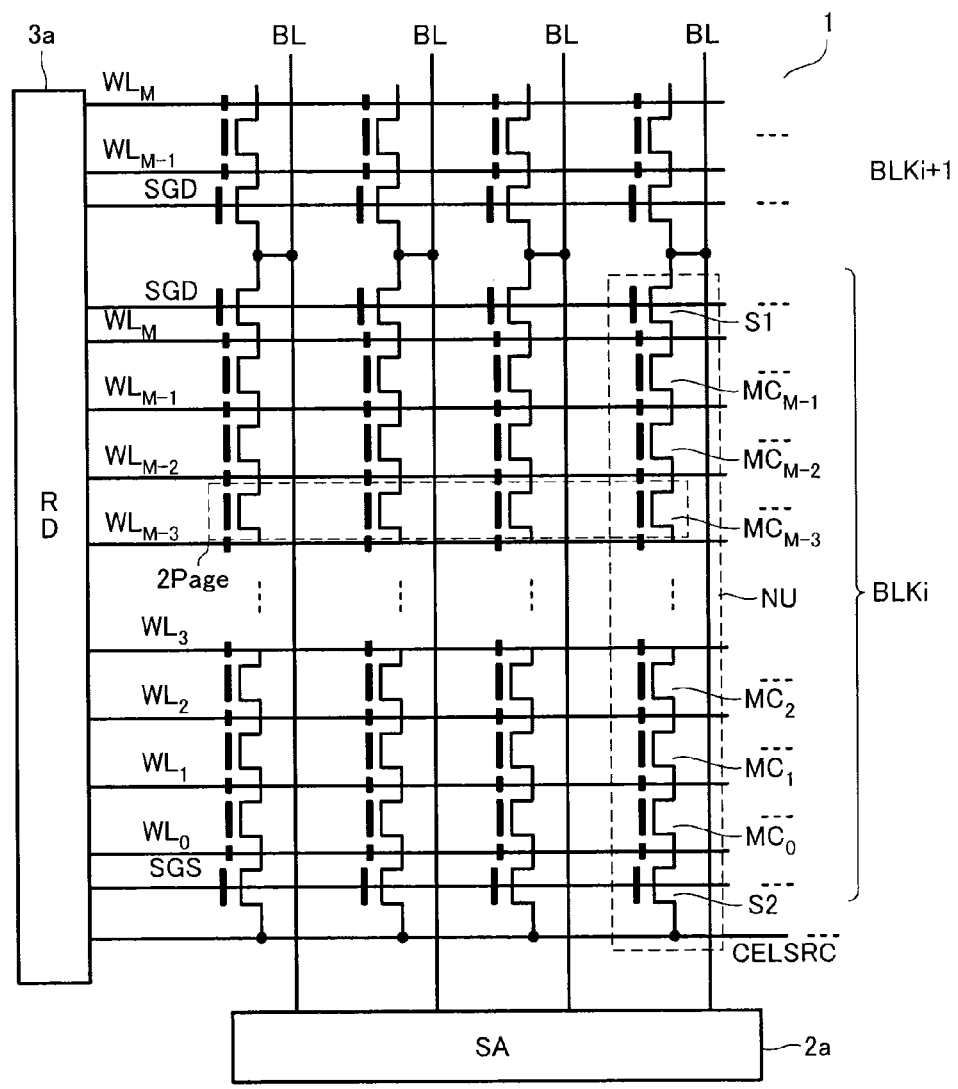
FIG. 3 is an equivalent circuit diagram of the memory cell array.

FIG. 2 is a figure illustrating a structure of the memory cell array 1 according to the comparative example. FIG. 3 is a circuit diagram of the memory cell array 1.

The memory cell array 1 includes a plurality of NAND cell units NU each including: a NAND string configured by M number of electrically-rewritable nonvolatile memory cells MC0 to MCM-1 connected in series; and select gate transistors S1 and S2 connected to both ends of the NAND string. One end of the NAND cell unit NU (that is on the select gate transistor S1 side) is connected to a bit line BL, and the other end thereof (that is on the select gate transistor S2 side) is connected to a common source line CELSRC. The gate electrodes of the select gate transistors S1 and S2 are connected to select gate lines SGD and SGS. The control gate electrodes provided on both sides of the memory cells MC0 to MCM-1 are connected to word lines WL0 to WLM respectively. The bit lines BL are connected to a sense amplifier circuit 2a included in the column control circuit 2, and the word lines WL0 to WLM and the select gate lines SGD and SGS are connected to a row decoder circuit 3a included in the row control circuit 3.

N type diffusion layers 52 to function as sources and drains of MOSFETs constituting the memory cells MC are formed in a p-type well 51 formed in a substrate. Floating gates (FG) 54 are formed above the well 51 via a gate insulating film 53 functioning as a tunnel insulating film. The floating gates 54 function as charge accumulation layers. Control gates (CG) 56 are formed on both sides of the floating gates 54 via an inter-gate insulating film (IPD) 55. The control gates 56 constitute the word lines WL. The select gate transistors S1 and S2 have select gates 57 above the well 51 via the gate insulating film 53. The select gates 57 constitute the select gate lines SGS and SGD. The memory cells MC and the select gate transistors S1 and S2 are NAND-connected such that adjoining ones share their drain and source.

[1-1-3. Memory Cell]

In the case of 1 bit/cell where data of 1 bit is stored in one memory cell MC, data of 1 page are stored in the memory cells MC formed along a pair of word lines WL perpendicular to a NAND cell unit NU. In the case of 2 bits/cell where data of 2 bits are stored in one memory cell MC, data of 2 pages (an upper page UPPER and a lower page LOWER) are stored in the memory cells MC formed along word lines WL. Likewise, this can be applied to a configuration in which, in the case of 4 bits/cell where data of 4 pages are stored in one memory cell MC, data of 4 pages are stored in the memory cells MC formed along word lines WL. In the present embodiment, the 2 bits/cell method is employed. Alternatively, 1 bit/cell method, 3 bits/cell method, and 4 bits/cell method can also be employed.

[1-1-4. Memory Block]

One block BLK includes a plurality of NAND cell units NU that share word lines WL. One block BLK forms a unit of data erasing operation. In one memory cell array 1, the number of word lines WL in one block BLK is M+1, and when 2 bits/cell method is employed, and the number of effective memory cells M (the number of memory cells except dummy cells) per NAND cell unit in one block is 64, the number of pages in one block is 128 pages (M×2=128 pages). When write data into a writing target memory cell MC, the voltage of the control gates 56 on both sides of the floating gate 54 is raised to a certain writing voltage, and other control gates 56 in the NAND cell unit NU are set to alternate low and high voltages which decrease toward both ends of the NAND cell unit NU, thereby preventing non-selected memory cells from being written erroneously.

[1-1-5. Memory Cell Array Structure According to the First Embodiment]

Subsequently, the memory cell array structure according to the first embodiment will be explained.

Figure 4:
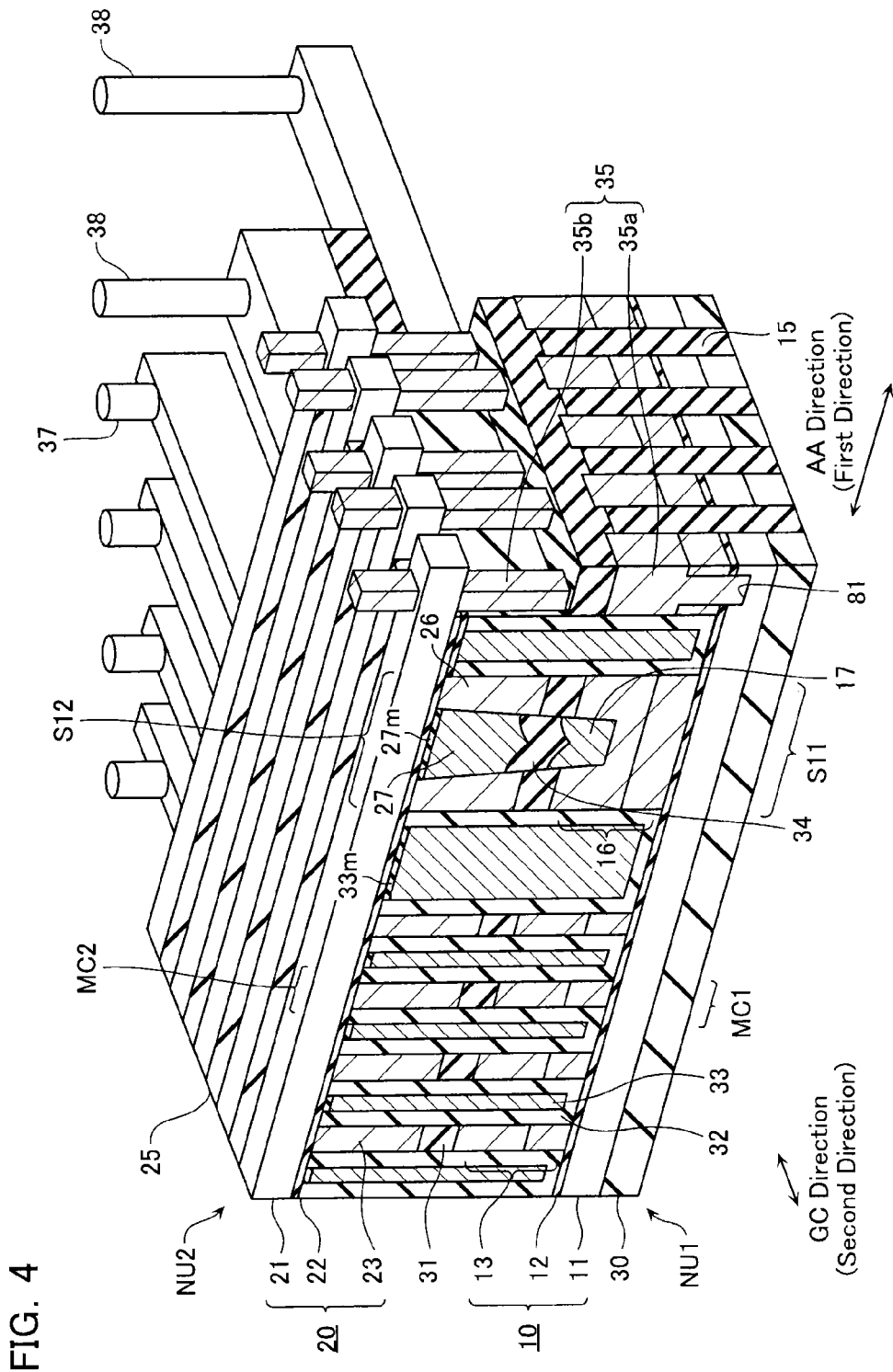
FIG. 4 is a perspective diagram illustrating a memory cell array structure according to the first embodiment.
Figure 5:
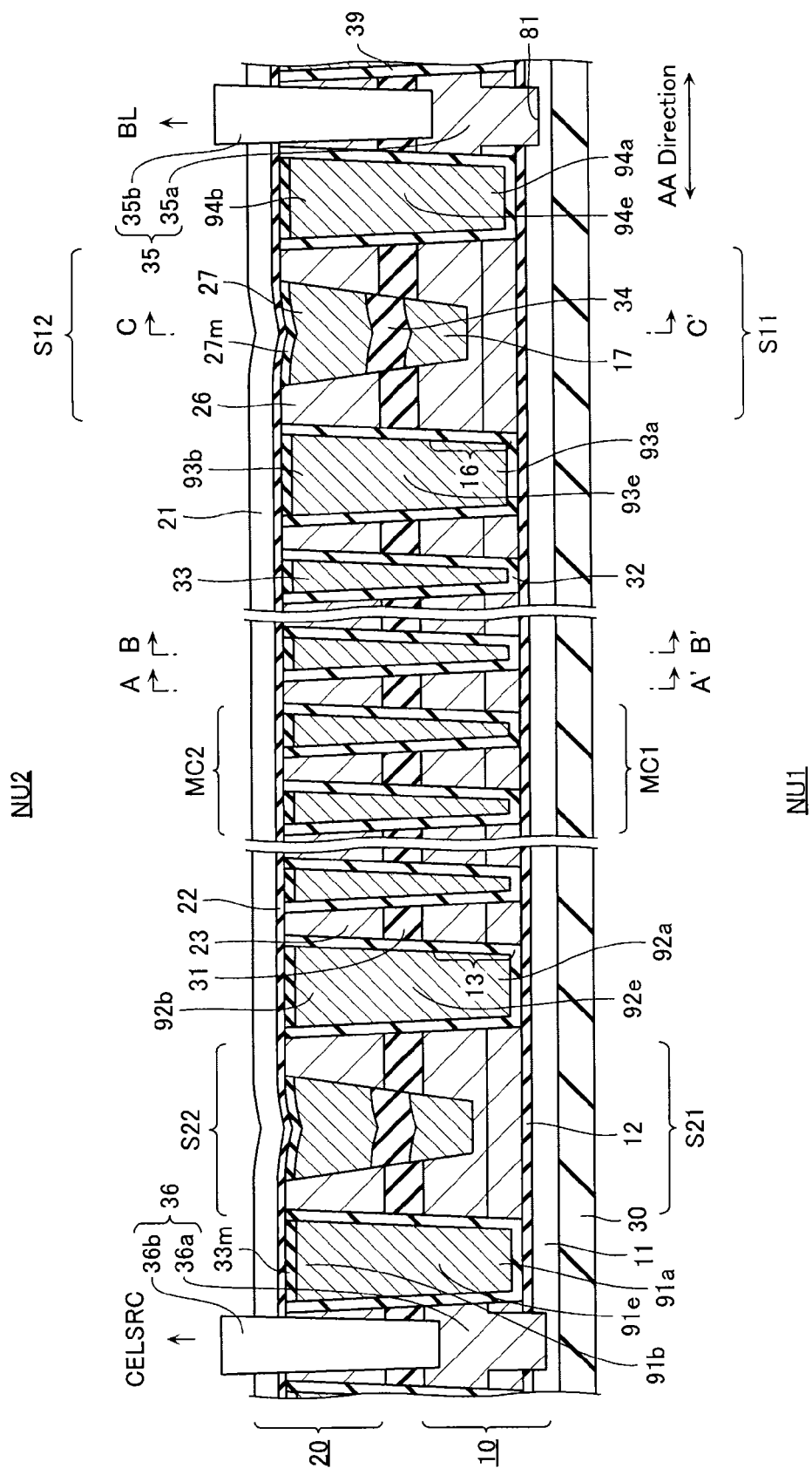
FIG. 5 is a cross-sectional diagram illustrating a structure of the memory cell array taken in a GC direction.

FIG. 4 is a perspective diagram of the memory cell array structure according to the first embodiment. FIG. 5 is a cross-sectional diagram of FIG. 4 seen from the GC (gate) direction. FIGS. 6A to 6C are cross-sectional diagrams of FIG. 4 taken along lines A-A', B-B', and C-C' and seen from the AA (active area) direction of FIG. 4. Note that the drawings are illustrated with some components omitted, in order to make the internal structure visible.

In this memory cell array structure, the memory cell array structure shown in FIG. 2 are stacked upside down, and control gates are shared by these upper and lower memory cell array layers.

That is, as shown in FIGS. 4, 5, a first semiconductor layer 11 and second semiconductor layer 21 to constitute bodies to form channels are provided above an insulating base 30, and between them, a first floating gate 13 (charge accumulation layer) to face the upper surface of the first semiconductor layer 11 via a first gate insulating film 12 and a second floating gate (charge accumulation layer) 23 to face the lower surface of the second semiconductor layer 21 via a second gate insulating film 22 are stacked such that the latter is provided above the former via a first insulating layer 31. As is clear from the A-A' cross section of FIG. 6A, the semiconductor layers 11, 21, the gate insulating films 12, 22, and the floating gates 13, 23 are insulated and isolated from each other in the GC direction (second direction) via element isolating insulating films 15, 25 extending in the AA direction (first direction).

A plurality of stacks of floating gates 13 and 23 are formed at certain intervals in the AA direction along the semiconductor layers 11 and 21 so as to form a NAND array. Control gates 33 extending in the GC direction are formed on AA-direction both sides of each stack of floating gates 13 and 23 via an inter-gate insulating film (IPD: Inter-Poly Dielectric film) 32. The control gate 33 is provided commonly for the lower and upper floating gates 13 and 23 so as to couple with these floating gates 13 and 23 from their sides. A mask material 33m is provided between the control gate 33 and the second gate insulating film 22. The lower first semiconductor layer 11, the first gate insulating film 12, the first floating gate 13, the inter-gate insulating film 32, and the control gates 33 are included in the configuration of a lower first memory cell MC1. The upper second semiconductor layer 21, the second gate insulating film 22, the second floating gate 23, the inter-gate insulating film 32, and the control gate 33 are included in the configuration of an upper second memory cell MC2.

First select gates 16 and second select gates 26 to form select gate transistors S11, S12, S21, S22 are provided at positions adjoining the control gates 33 which are located at both ends of the arrangement of stacks of floating gates 13 and 23. The select gates 16, 26 are stacked the latter above the former via the first insulating layer 31, and face the semiconductor layers 11, 21 via the gate insulating films 12, 22, respectively. First select gate lines 17 extending in the GC direction are embedded in the first select gates 16, and second select gate lines 27 and mask materials 27m extending in the GC direction are embedded in the second select gates 26. The select gate line 17 and the select gate line 27 are insulated and isolated from each other via a layer isolating insulating film 34.

The lower first NAND cell unit NU1 includes the lower NAND-connected memory cell MC1 and the select gate transistors S11, S21, and the first memory cell array layer 10 includes a plurality of NAND cell units NU1 arranged in the GC direction via a first element isolating insulating film 15. The upper second NAND cell unit NU2 includes the upper NAND-connected memory cell MC2 and the select gate transistors S12, S22, and the second memory cell array layer 20 includes a plurality of NAND cell units NU2 arranged in the GC direction.

Figure 7:
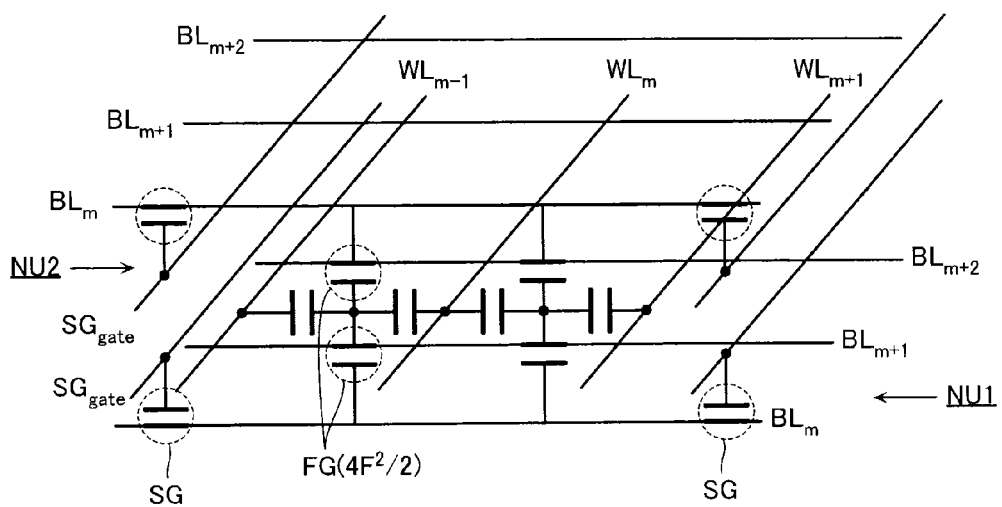
FIG. 7 is an equivalent circuit diagram of the memory cell array.

According to the above configuration, the floating gates 13, 23 of vertically corresponding memory cells MC1 and MC2 of the lower and upper NAND cell units NU1 and NU2 are simultaneously driven by coupling with the word lines WL on both sides to be connected to a common bit line BL, as their equivalent circuit is shown in FIG. 7. In contrast, the select gate transistors S11 to S22 are provided independently for the lower and upper bit lines BL, and can selectively activate the NAND cell unit NU1 or NU2 by either one being selected.

[1-1-6. Auxiliary Transistor]

As illustrated in FIG. 5, the nonvolatile semiconductor memory device according to the present embodiment includes a first auxiliary gate 91e between the source line contact 36 and the source line side select gate transistors S21, S22. A first lower auxiliary transistor 91a is formed between it and the first semiconductor layer 11, and a first upper auxiliary transistor 91b is formed between it and the second semiconductor layer 21. Likewise, a second auxiliary gate 92e is provided between the source line side select gate transistors S21, S22 and the first, second floating gates 13, 23. A third auxiliary gate 93e is provided between the first, second floating gates 13, 23 and the bit line side select gate transistors S11, S12. A fourth auxiliary gate 94e is provided between the bit line side select gate transistors S11, S12 and the bit line contact 35. A second lower auxiliary transistor 92a and a second upper auxiliary transistor 92b; a third lower auxiliary transistor 93a and a third upper auxiliary transistor 93b; and a fourth lower auxiliary transistor 94a and a fourth upper auxiliary transistor 94b are formed between the first semiconductor layer 11 and the second semiconductor layer 21.

[1-1-7. Contact]

A bit line contact 35 shared between the NAND cell units NU1 and NU2 and extending vertically to connect to an unillustrated bit line BL is formed in the semiconductor layers 11 and 21 at one end of the NAND cell units NU1 and NU2. A source line contact 36 shared between the NAND cell units NU1 and NU2 and extending vertically to connect to an unillustrated source line is formed in the semiconductor layers 11 and 21 at the other end of the NAND cell units NU1 and NU2. A word line contact 37 is formed at an end of the control gate 33, and a select gate line contact 38 is formed at an end of the select gate lines 17 and 27.

The bit line contact 35 includes a lower contact 35a and an upper contact 35b. Likewise, the source line contact 36 includes a lower contact 36a and an upper contact 36b. The lower contacts 35a, 36a are connected to the first semiconductor layer 11 via a first trench 81 made in the first gate insulating film 12. In the present embodiment, the lower contacts 35a, 36a are formed at the same time as the first floating gate 13 and the first select gate 16 are formed as explained later. Therefore, the widths of the lower contacts 35a, 36a and the first semiconductor layer 11 in the GC direction are substantially the same. The lower contacts 35a, 36a are made of the same material as that of the first floating gate 13, and are formed in the same linear manner with the same cycle and with the same interval as the first semiconductor layer 11 via the first element isolating insulating film 15. The upper contacts 35b, 36b penetrate through the second semiconductor layer 21, the second gate insulating film 22, and the first insulating film 31, and are formed to connect to the upper portions of the lower contacts 35a, 36a. The upper contacts 35b, 36b are also made of the same material as the first floating gate 13.

[1-1-8. Advantages of the Configuration of the Memory Cell Array According to the Present Embodiment]

According to the above configuration, the floating gates 13, 23 of vertically corresponding memory cells MC1 and MC2 of the lower and upper NAND cell units NU1 and NU2 are simultaneously driven by coupling with the word lines WL on both sides to be connected to a common bit line BL. In contrast, the select gate transistors S11 to S22 are provided independently for the lower and upper bit lines BL, and can selectively activate the NAND cell unit NU1 or NU2 by either one being selected.

At both sides of the lower and upper floating gates 13, 23, the control gate 33 common to them are provided, which are hardly affected by proximity effect in the AA direction and the diagonal direction due to the shield effect. On the other hand, they are affected by the proximity effect in the GC direction, i.e., the direction in which the control gate 33 extends, but this will be reduced by operation described below.

1-2. Operation

[1-2-1. Write Operation According to Comparative Example]

Subsequently, operation method of a nonvolatile semiconductor memory device according to the comparative example will be explained. In the explanation below, write data to the memory cell MC will be denoted as data E, A, B, and C in the ascending order.

Figure 8:
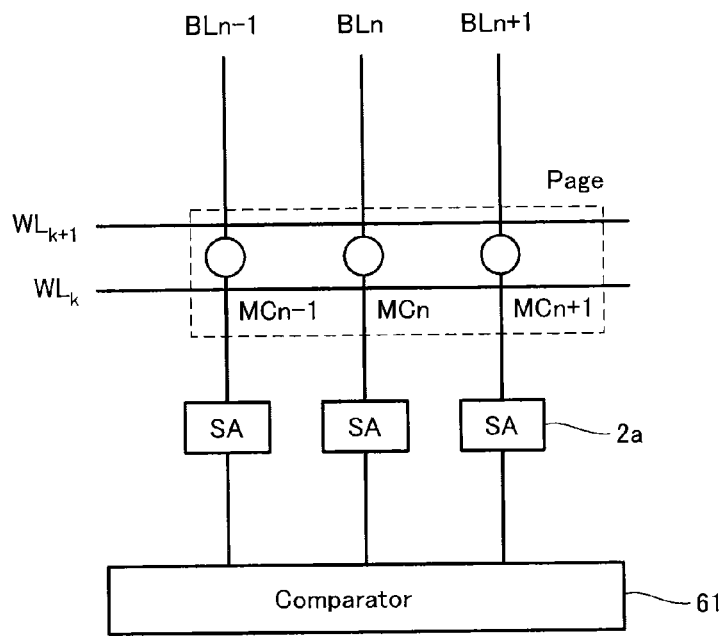
FIG. 8 is a schematic view for explaining an adjusting method of a verification level according to the comparative example.

As illustrated in FIG. 8, in memory cells MCn−1, MCn, MCn+1 included in the same page and respectively connected to bit lines BLn−1, BLn, BLn+1, the memory cell MCn is denoted as a memory cell in question, and the memory cells MCn−1, MCn+1 at both sides in the word line WL direction are denoted as adjacent memory cells MCn−1, MCn+1. When write data are written to the memory cell MCn in question, a voltage of the control gate 56 constituting the word lines WLk, WLk+1 at both sides of the floating gate 54 of the memory cell MCn is raised to a certain writing voltage. At this occasion, selectively writing is performed by applying, for example, a potential VDD (power supply voltage) to bit lines connected to non-selected memory cells in the same page so as to make the non-selected memory cells in a non-selected state, and for example, a potential 0V is applied to a bit line connected to selected memory cells so as to make the selected memory cells in a selected state. A potential 0V or Vpass, which is a potential between the writing voltage and 0V, is applied to control gates other than the control gates 56 at both sides of the memory cell MCn, so as to reduce the voltage, thereby preventing erroneous writing to the memory cells other than the writing target page.

[1-2-2. Adjusting Method of Verification Level]

[1-2-2-1. Adjusting Method of Verification Level According to Comparative Example]

In the configuration such as the configuration of the memory cell array 1 according to the present embodiment, word lines WL are provided at both sides in the bit line direction of the floating gate 54, and these word lines WL operate as shield lines. As a result, the proximity effect exerted onto the memory cells MC adjacent in the bit line direction is suppressed during the write operation. Therefore, in the memory cell array 1 having the above configuration, if the proximity effect exerted onto the memory cells MC adjacent in the word line direction is suppressed, the controllability can be improved effectively.

Figure 9A:
FIGS. 9A to 9C are schematic views for explaining influence of proximity effect of the nonvolatile semiconductor memory device according to the comparative example.
Figure 9B:
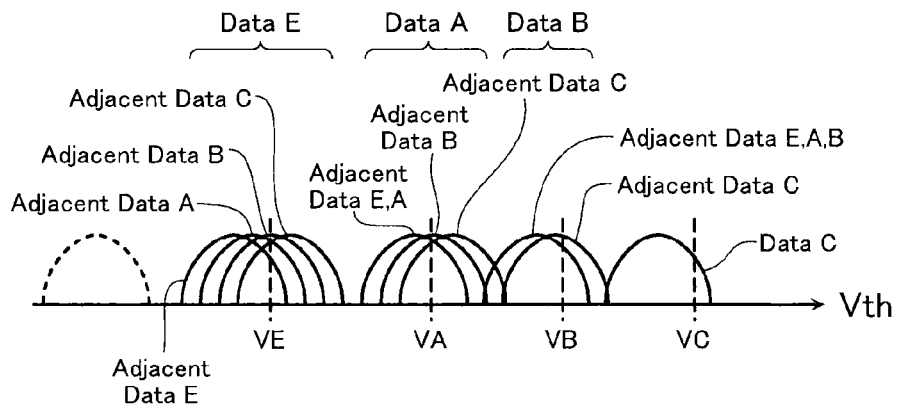
Figure 9C:
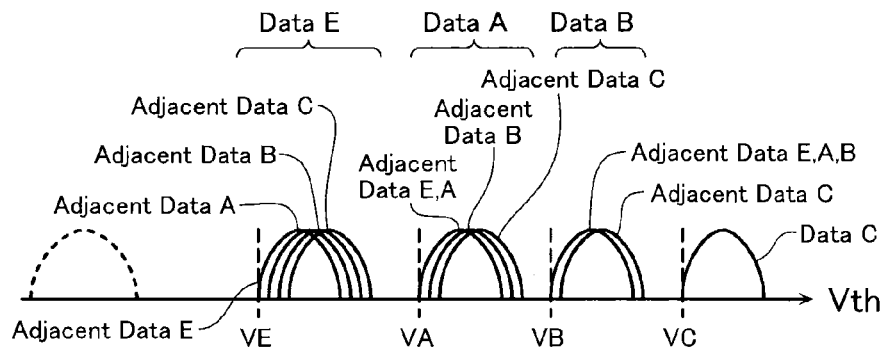

The proximity effect exerted onto the memory cells MC adjacent in the word line direction will be explained with reference to FIGS. 9A to 9C. FIGS. 9A to 9C show a histogram for explaining how a threshold value distribution is affected by the above proximity effect when writing process is done in two steps including foggy writing and fine writing. In the explanation below, threshold values corresponding to write data to the memory cell MC will be denoted as data E, A, B, and C in the ascending order.

FIG. 9A illustrates a threshold value distribution of a plurality of memory cells MC when erase operation is performed before write operation. FIG. 9B illustrates a threshold value distribution when first writing (foggy writing) is performed after erase operation. FIG. 9C illustrates a threshold value distribution when second writing (fine writing) is performed after the first writing. As illustrated in the figures, when write data to the selected memory cell MCn are equal to or more than write data to adjacent memory cells MCn−1 and MCn+1, proximity effect from the adjacent memory cells MCn−1, MCn+1 to the selected memory cell MCn hardly occurs. However, when write data to the selected memory cell MCn are less than write data to adjacent memory cells MCn−1 and MCn+1, proximity effect occurs according to the difference of the write data, which increases the threshold value distribution. As the write data to the selected memory cell MCn are lower or write data to the adjacent memory cells MCn−1 and MCn+1 are higher, the proximity effect becomes more significant.

[1-2-2-2. First Adjusting Method of Verification Level]

Figure 10A:
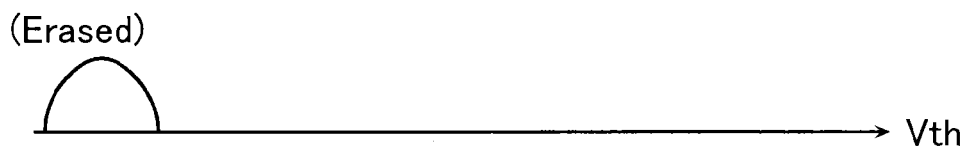
FIGS. 10A to 10C are schematic views for explaining a first adjusting method of a verification level according to the first embodiment.
Figure 10B:
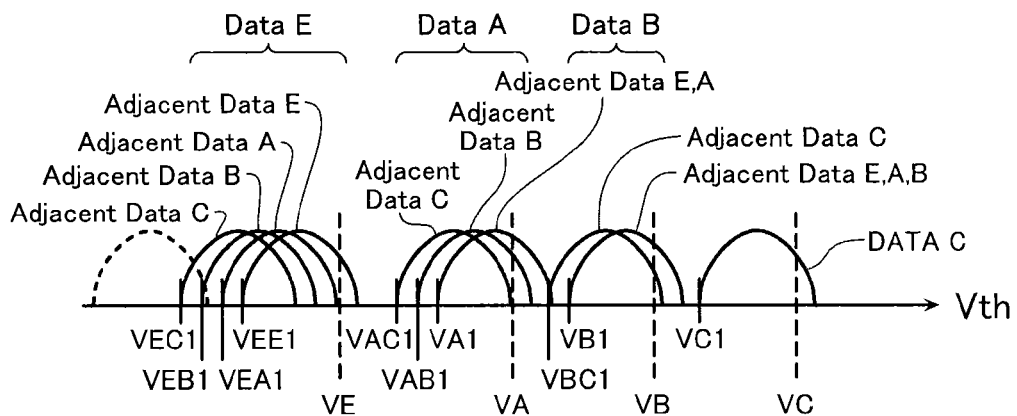
Figure 10C:
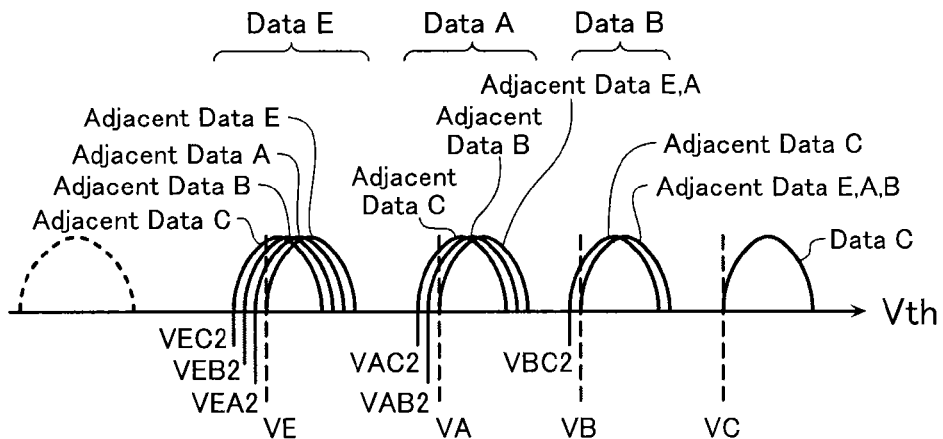

In order to solve the problem of variation of the threshold value due to the above proximity effect, the semiconductor memory device according to present embodiment is configured such that a write condition of the selected memory cell MC receiving high degree of proximity effect from the adjacent memory cells MCn−1, MCn+1, is adjusted, i.e., write verification level is set at a lower level than usual. FIGS. 10A to 10C show a histogram for explaining write operation according to the present embodiment. FIG. 10A illustrates a threshold value distribution of a plurality of memory cells MC when erase operation is performed before write operation.

FIG. 10B illustrates a write verification level that is set for the first writing (foggy writing) after the erase operation, and a threshold value distribution of a selected memory cell MCn obtained as a result. In the write operation according to the present embodiment, the write verification level of the selected memory cell MCn is set on the basis of the write data to the selected memory cell MCn and the write data to the adjacent memory cells MCn−1 and MCn+1. More specifically, the higher the write levels of the adjacent memory cells MCn−1, MCn+1 are, the smaller the write verification level of the selected memory cell MCn is set. For example, when data A are written to the selected memory cell MCn, the write verification level is set as follows. In a case where data C are written to adjacent memory cells MCn−1, MCn+1, a write verification level VAC1 is set at a smaller value than a write verification level VA1 in a case where data E are written to the adjacent memory cell MCn+1.

FIG. 10C illustrates a write verification level that is set for the second writing finer than the first writing, which is performed after the first writing and also illustrates a threshold value distribution of the selected memory cell MCn obtained therefrom. In the second writing, the threshold value voltage for the selected memory cell MCn is also adjusted according to the same method as the first writing. However, a difference between verification levels in the second writing is set smaller than that in the first writing. For example, the difference between VAC2 and VA2 is set smaller than the difference between VAC1 and VA1.

According to the above adjusting of the write verification level, even when the threshold value level is changed by the proximity effect from the adjacent memory cells MCn−1, MCn+1, the threshold value distribution varies in a converging direction, and therefore, the threshold value distribution can be prevented from expanding.

In the present embodiment, only the effect of the adjacent memory cells MCn−1 and MCn+1 is considered. However, as the memory cell array 1 becomes finer, it may be necessary to consider the effect of the memory cells MCn−2 and MCn+2 which are further adjacent to the adjacent memory cells MCn−1 and MCn+1 in some cases. It is to be understood that the above adjusting of the write condition can also be applied even in such case.

Figures 11, 12:
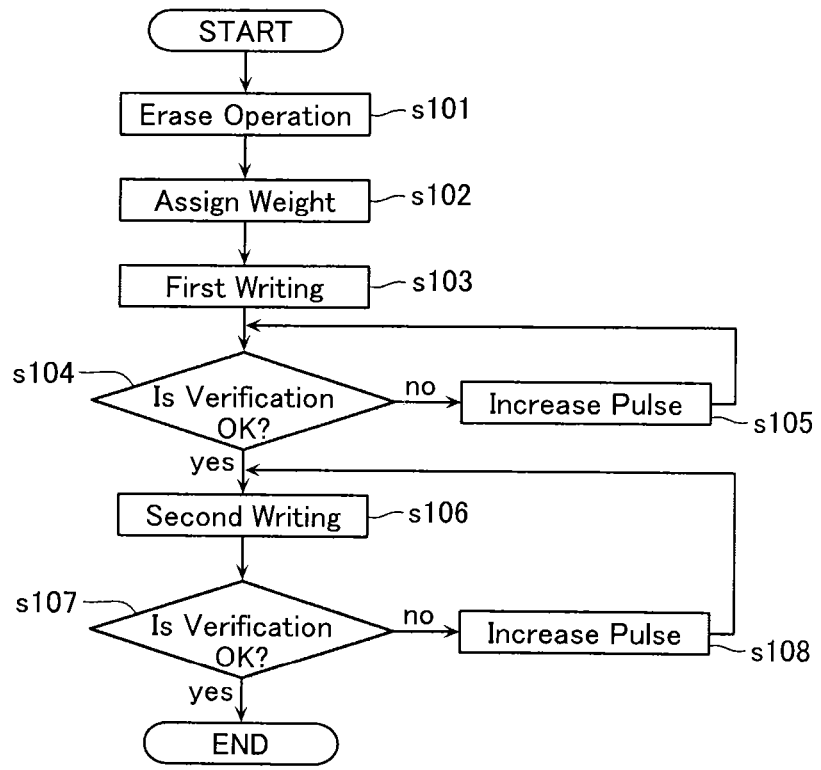
FIG. 11 is a flowchart illustrating an example of write operation characteristics according to the method.
FIG. 12 is a figure illustrating an example of weight assigning method according to the method.

Subsequently, the above write operation will be explained using a more specific example. FIG. 11 is a flowchart illustrating an example of write operation according to the present embodiment.

In the write operation according to the present embodiment, first, erase operation is performed on a plurality of memory cells MC included in a certain erase unit at a time (step S101), and subsequently, a weight is assigned to a very voltage to the selected memory cell MCn in accordance with write data to the adjacent memory cells MCn−1 and MCn+1 (step S102).

A weight is assigned to the threshold value voltage as follows. The comparator 61 performs computation processing on one page of write data held in the data input/output buffer 4, and outputs it to the state machine 7 as weight data. In the present embodiment, computation processing performed by the comparator 61 is a combination of simple adding processing and the like. More specifically, for each memory cell MCn, a write verification level of the selected memory cell MCn is determined on the basis of write data to the adjacent memory cells MCn−1 and MCn+1.

The state machine 7 obtains one page of weight data in accordance with one page of write data held in the data input/output buffer 4 in step S2, and sets the write verification level using this. In the present embodiment, 2 bits/cell method (4 values) is employed, and therefore, there are sixteen combinations of adjacent memory cells MCn−1 and MCn+1 (4×4=16). Therefore, the weight may be set to sixteen levels, but in the present embodiment, as illustrated in FIG. 12, the weight is set to seven levels in accordance with the write data to the adjacent memory cells MCn−1 and MCn+1.

The proximity effect to the selected memory cell MCn caused by the write operation to the adjacent memory cells MCn−1 and MCn+1 becomes more significant as the write data to the selected memory cell MCn become smaller. Therefore, even with the same weight assigning, different weights can be assigned in accordance with write data to the selected memory cell MCn. More specifically, when the write data to the selected memory cell MCn are low (for example, in a case of data E), weight assigning can be strongly reflected, and when the write data to the selected memory cell MCn are high (for example, in a cases of data C), weight assigning can be reflected weakly as compared with a case where the write data are low.

Subsequently, the first writing is performed (steps S103 to S105). In the first writing, a write pulse is applied to selected word lines WLk, WLk+1 (step S103), and verification is performed using write data to which weights are assigned in step S102 (step S104). When the verification is not completed, the voltage of the write pulse is raised, and the write pulse is applied again, and the verification is repeated (step S105).

In the present embodiment, there are four kinds of write data (data E, A, B, C), and seven levels of weights are prepared for each piece of write data. Therefore, in one verification of each level, seven types of pulse voltages are applied, for each of which read operation is performed. Therefore, the more the number of weights are, the higher the accuracy of write operation becomes, but it takes more time to perform the verification according to the increased number of weights, and therefore, it may be possible to adjust the number of weights in view of this point. It should be noted that the verification of the write data E can be omitted.

Subsequently, the second writing is performed (steps S106 to S108). The second writing is done in the same manner as the first writing, but the verification voltage of the first writing is different from the verification voltage of the second writing (see FIG. 4), and therefore, it is necessary to change the verification voltage.

According to the write operation described above, the adjacent effect caused during the write operation is reduced, and a nonvolatile semiconductor memory device with high degree of controllability can be provided. In the write operation according to the present embodiment, the proximity effect is reduced by performing the computation processing on write data in the same page, and therefore, it is not necessary to have a cache and the like for reading data in a subsequent page of data. Therefore, the comparator 61 can also be configured by a relatively simple logic circuit, and the size of the circuit substantially does not increase. Further, it is not necessary to read data of a subsequent page from the cache and write data of a subsequent page to the cache.

[1-2-2-3. Second Adjusting Method of Verification Level]

Subsequently, the second adjusting method of the verification level will be explained. The second adjusting method of the verification level is basically the same as the first adjusting method of the verification level, but in the second adjusting method of the verification level, the verification is performed using weights only in the second writing. Using this second adjusting method of the verification level, the verification time in the first writing is reduced while the accuracy of the second writing is maintained, so that the speed of the operation can be improved.

Alternatively, verification using weights can be done only in the first writing.

[1-2-3. Adjusting Method of Application Pulse]
[1-2-3-1. Adjusting Method of Application Pulse According to Comparative Example]

Subsequently, an example of write operation shown in [1-2-1. Write Operation according to Comparative Example] will be explained in more details.

Figure 13:
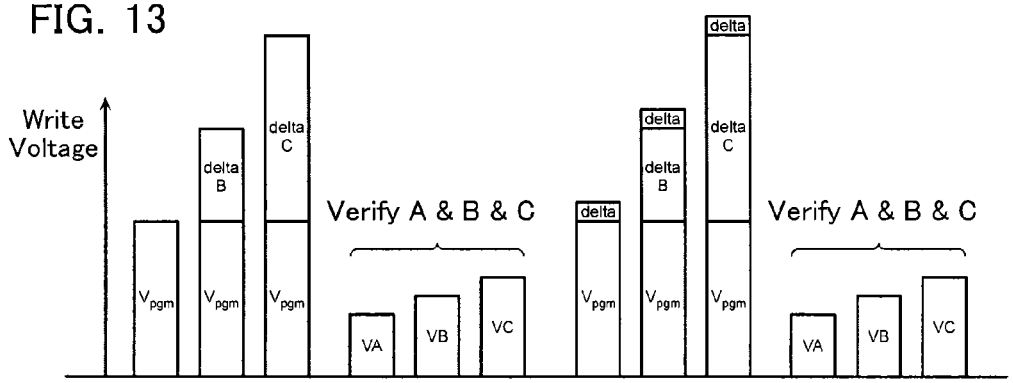
FIG. 13 is a schematic view for explaining an adjusting method of an application pulse according to the comparative example.

FIG. 13 is a figure illustrating an example of a data write pulse and a verification pulse applied in the comparative example. The write pulse is divided for each level of data and provided to the memory cells MC. First, a memory cell MC to which the data E within a written page is written is changed to a write inhibit state, and a write pulse from the data E to the data A, B, C is applied to memory cells MC to which the data A, B, C are written. Subsequently, memory cells MC to which the data E, A are written are changed to the write inhibit state, and a stepped-up pulse for writing the data B, C is applied to memory cells MC to which the data B, C are written. Finally, memory cells MC to which the data E, A, B are written are changed to the write inhibit state, and a further stepped-up pulse for writing the data C is applied to the memory cells MC to which the data C is written.

Subsequently, write verification of the data A is executed, then write verification of the data B is executed, and at last, write verification of the data C is executed.

Thereafter, the write pulse is increased by a predetermined voltage, and the same write pulse application and verification operation are repeated.

In a memory cell array having a gate structure in which control gates are embedded at both sides of a floating gate to let the floating gate couple with the control gates on both sides thereof, a coupling ratio between the floating gates is larger than that of the stacked-gate structure. Therefore, in the write method according to the above comparative example, for example, when the data E are written to the memory cell MCn in question and the data C are written to the adjacent memory cells MCn−1 and MCn+1, the memory cell in question may be written erroneously due to the proximity effect.

[1-2-3-2. First Adjusting Method of Application Pulse]

In order to solve the above problem, the first adjusting method of the application pulse according to the present embodiment is as follows. 1. Weak-writing explained later is performed in advance on memory cells in a page to be written, and the memory cells are divided into groups in accordance with the writing speed. 2. A write pulse applied to each memory cell is selected in accordance with the result of grouping and data to be written to adjacent memory cells.

Figure 14:
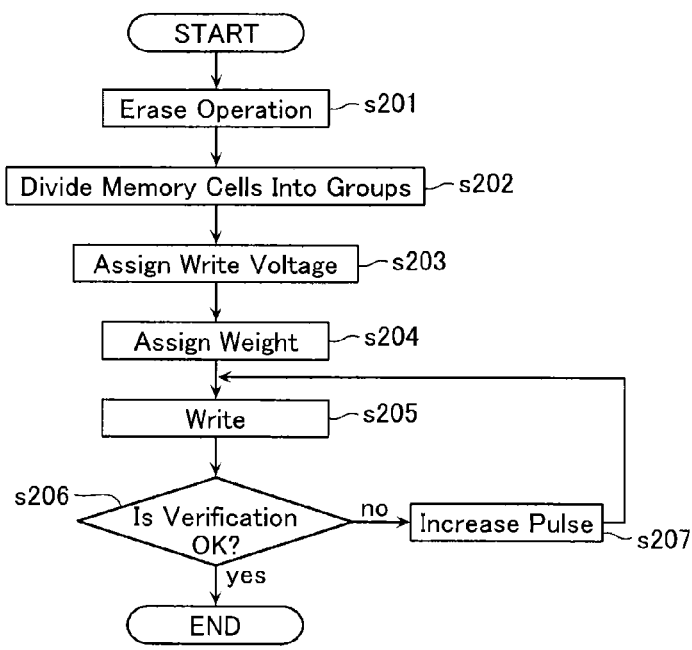
FIG. 14 is a flowchart illustrating a first adjusting method of an application pulse of the nonvolatile semiconductor memory device according to the first embodiment.

FIG. 14 is a flowchart illustrating an example of write operation according to the present embodiment.

In the write operation according to the present embodiment, first, erase operation is performed on a plurality of memory cells MC included in a certain erase unit at a time (step S201), and subsequently, memory cells to be subjected to the write operation are divided into a plurality of groups (step S202).

Figure 15:
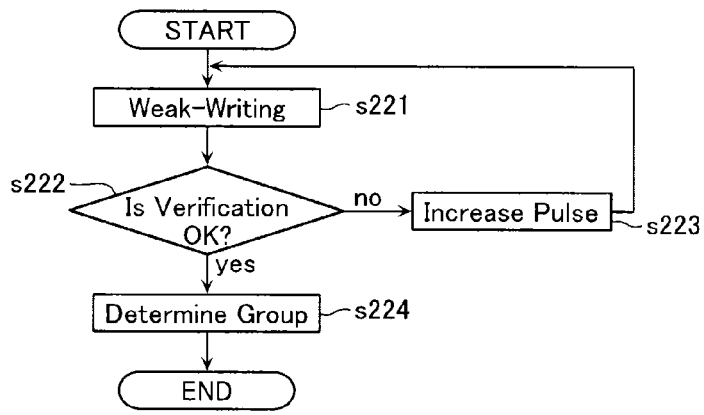
FIG. 15 is a flowchart illustrating grouping according to the method.

FIG. 15 is a flowchart illustrating an example of grouping method. In the present embodiment, the grouping is done in accordance with the write speed of the selected memory cell MCn.

During the grouping, first, weak-writing is performed on the selected memory cell MCn using a certain weak-writing voltage (step S221). When the verification has not been completed, the weak-writing voltage is increased, and the weak-writing and the verification are repeated (steps S222, S223).

FIGS. 16A and 16B are figures illustrating a threshold value distribution after the weak-writing. A weak-writing verification level WPv is set between an erase level and a verification level VE of the data E, and while a writing voltage Vpgm is successively stepped-up, the writing voltage Vpgm is measured when it is more than the weak-writing verification level WPv.

When the weak-writing verification is completed in step S222, the groups of the memory cells MC are determined on the basis of the writing voltage Vpgm at the completion of the verification (step S224). For example, when the writing voltage at the completion of the weak-writing verification is equal to or less than 10 V, the memory cell MC is put into a group GR1 in which the writing speed is the highest. When the weak-writing voltage at the completion of the verification is equal to or less than 11 V, the memory cell MC is put into a group GR2 in which the writing speed is the second highest. When the weak-writing voltage at the completion of the verification is equal to or less than 12 V, the memory cell MC is put into a group GR3 in which the writing speed is the third highest. When the weak-writing voltage at the completion of the verification is equal to or more than 12 V, the memory cell MC is put into a group GR4 in which the writing speed is the lowest.

It should be noted that the group information thus determined may be held in a cache provided in the state machine 7, or may be held in another location such as a portion of the memory cell array 1. In the present embodiment, the memory cell MC is divided into four groups, but how many groups the memory cells MC are divided into may be adjusted as necessary.

Subsequently, using the write data written to the selected memory cell MCn and the group information calculated in step S202, writing voltage to the selected memory cell MCn is assigned (step S203). In the present embodiment, as illustrated in FIG. 17, writing process is performed using writing voltages P1 to P5 having five levels of strengths each having a potential difference of 1 V to 2 V. For example, as illustrated in FIG. 18, the writing voltages may be assigned as follows. The higher the writing speed of the group is, the lower voltage is assigned. The lower the writing speed of the group is, the higher voltage is assigned. The smaller the threshold value voltage of the write data is, the lower voltage is set. The larger the threshold value voltage of the write data is, the higher voltage is set.

In the present embodiment, a writing voltage (for example, P3) assigned when certain write data (for example, data A) are written to a memory cell MC which belongs to a certain group (for example, GR3) overlaps with a writing voltage (for example, P3) assigned when other data (for example, data B) of which threshold value voltage is higher than that of the certain write data or other data (for example, data E) of which threshold value voltage is lower than that of the certain write data are written to a memory cell MC which belongs to another group (for example, GR2) of which write speed is faster than that of the certain group or another group (for example, GR4) of which write speed is slower than that of the certain group. In this manner, the writing voltage is set, so that the types of the generated voltages can be reduced, and the circuit configuration can be simplified.

Subsequently, a weight is assigned to the writing voltage to the selected memory cell MCn in accordance with write data to the adjacent memory cells MCn−1 and MCn+1 (step S204).

Figures 19, 20:
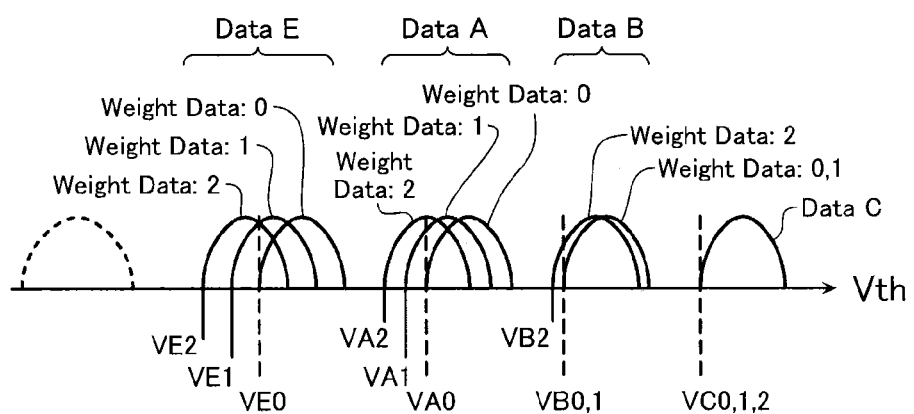
FIG. 19 is a schematic view for explaining weight assigning according to the method.
FIG. 20 is a schematic view for explaining a second adjusting method of an application pulse according to the first embodiment.

A weight is assigned to the writing voltage as follows. The comparator 61 performs computation processing on one page of write data held in the data input/output buffer 4, and outputs it to the state machine 7 as weight data. In the present embodiment, computation processing performed by the comparator 61 is a simple adding processing. More specifically, for each memory cell MCn, write data to the adjacent memory cells MCn−1 and MCn+1 are added to make one page of weight data. In the present embodiment, 2 bits/cell method (4 values) is employed, and therefore, there are sixteen combinations of adjacent memory cells MCn−1 and MCn+1 (4×4=16). Therefore, the weight may be set to sixteen levels, but in the present embodiment, as illustrated in FIG. 19, the weight is set to three levels (in the figure, 0, 1, 2) in accordance with the write data to the adjacent memory cells MCn−1 and MCn+1.

The state machine 7 assigns a weight to the value of the writing voltage assigned in step S203, in accordance with weight data. More specifically, the voltage applied to each memory cell is re-selected from writing voltages P1 to P5 in accordance with the weight data. For example, in the present embodiment, when data C are written to the adjacent memory cells MCn−1 and MCn+1, the weight data of the memory cell in question are "2" (see FIG. 19). Therefore, when a write voltage P5 is assigned to the memory cell in question in step S203, a write voltage P3 is assigned to the memory cell in question again.

The proximity effect to the memory cell MCn in question caused by the write operation to the adjacent memory cells MCn−1 and MCn+1 becomes more significant as the write data to the memory cell MCn in question become smaller. Therefore, even with the same weight assigning, different weights can be assigned in accordance with write data to the selected memory cell MCn. More specifically, when the write data to the selected memory cell MCn are low (for example, in a case of data E), weight assigning can be strongly reflected, and when the write data to the selected memory cell MCn are high (for example, in a cases of data C), weight assigning can be reflected weakly as compared with a case where the write data are low.

Subsequently, memory cells in the selected page are written (step S205 to S207). More specifically, first, a voltage P1 is applied to the memory cells MC in the page to which the writing voltages P1 to P5 are assigned. Subsequently, a memory cell MC to which the writing voltage P1 is assigned is changed to the write inhibit state, and the writing voltage P2 is applied to the memory cells MC to which the writing voltages P2 to P5 are assigned. Likewise, thereafter, the write voltages P1 to P5 are applied successively to the selected memory cells in the page in accordance with assigning of the writing voltages P1 to P5 (step S205). Thereafter, the verification is performed four times in accordance with four types of write data E, A, B, C (step S206). When the writing is determined not to have finished, the writing voltages P1 to P5 are increased by a predetermined voltage, and the writing voltage application and the verification are repeated (step S207). It should be noted that the verification of the write data E can be omitted.

According to the above write operation, the grouping in accordance with the write speed of the memory cell MC enables adjustment of an applied voltage in accordance with the characteristics of each memory cell MC, so that the controllability can be improved, and the writing time can be reduced. In the nonvolatile semiconductor memory device according to the present embodiment, the adjacent effect caused during the write operation is reduced, and a nonvolatile semiconductor memory device with high degree of controllability can be provided.

[1-2-3-3. Second Adjusting Method of Application Pulse]

Subsequently, the second adjusting method of the application pulse will be explained. The second adjusting method of the application pulse is basically the same as the first adjusting method of the application pulse. However, in the second adjusting method of the application pulse, not only the writing voltage but also the verification voltage is adjusted in accordance with weight data. More specifically, for example, when the weight data are set as shown in FIG. 19 like the first embodiment, verification voltage is set at a lower value than a defined value in accordance with the weight data as illustrated in FIG. 20.

In the present embodiment, nine types of verification voltages are used (in the ascending order, 1. VC0,1,2 (i.e. a verification voltage in a case where data C are written to a cell in question and where the weight data of the cell in question are 0, 1, 2. The same hereinafter), 2. VB0,1, 3. VB2, 4. VA0, 5. VA1, 6. VA2, 7. VE0, 8. VE1, 9. VE2). In the present embodiment, when the original verification voltage of the memory cell in question is low, e.g., data E are written to the memory cell in question, then the decrement of the verification voltage according to the weight data is set at a large value, and when the original verification voltage of the memory cell in question is high, e.g., data B, C are written to the memory cell in question, then the decrement of the verification voltage according to the weight data is set at a small value. The writing voltage applied to the memory cell in question is more than the writing voltage applied to the adjacent memory cell, the assigning of a weight to the verification voltage may be omitted. In the present embodiment, when the data C are written to the memory cell in question, the assigning of a weight to the verification voltage is omitted. When the data B are written to the memory cell in question, a weight is assigned only when the weight data are "2". When the data A, E are written to the memory cell in question, the verification voltage is adjusted in accordance with the weight data "1", "2". In the present embodiment, the verification voltage is adjusted on the basis of the weight data which are output from the comparator 61. Alternatively, for example, the verification voltage may also be adjusted by comparing the writing voltages P1 to P5 applied to each of the memory cell MC in question and the adjacent memory cells MC.

[1-2-4. Control of Auxiliary Gate]

Subsequently, operation of the auxiliary gate will be explained. When a certain electrode (first electrode) of electrodes such as a channel (body), a floating gate, a bit line, and a source line is at a first potential, and another electrode (second electrode) is at a second potential different from the first potential, malfunction such as GIDL (Gate Induced Drain Leakage) and SCE may occur if the potential difference generated between the first electrode and the second electrode is more than a certain value. This kind of problem occurs more significantly as the insulation film provided between the above electrodes becomes thinner.

The nonvolatile semiconductor memory device according to the present embodiment applies a third voltage for alleviating a potential difference generated between the first electrode and the second electrode to one of the first to fourth auxiliary gates 91e to 94e which is adjacent to the first electrode and the second electrode with the insulating film interposed therebetween (third electrode). When the third voltage is applied, malfunction such as GIDL and SCE can be suppressed. It should be noted that the third voltage is considered to be set at a value between the first voltage value and the second voltage value.

[1-2-4-1. Control of the Auxiliary Gate During Write Operation]

Figure 21:
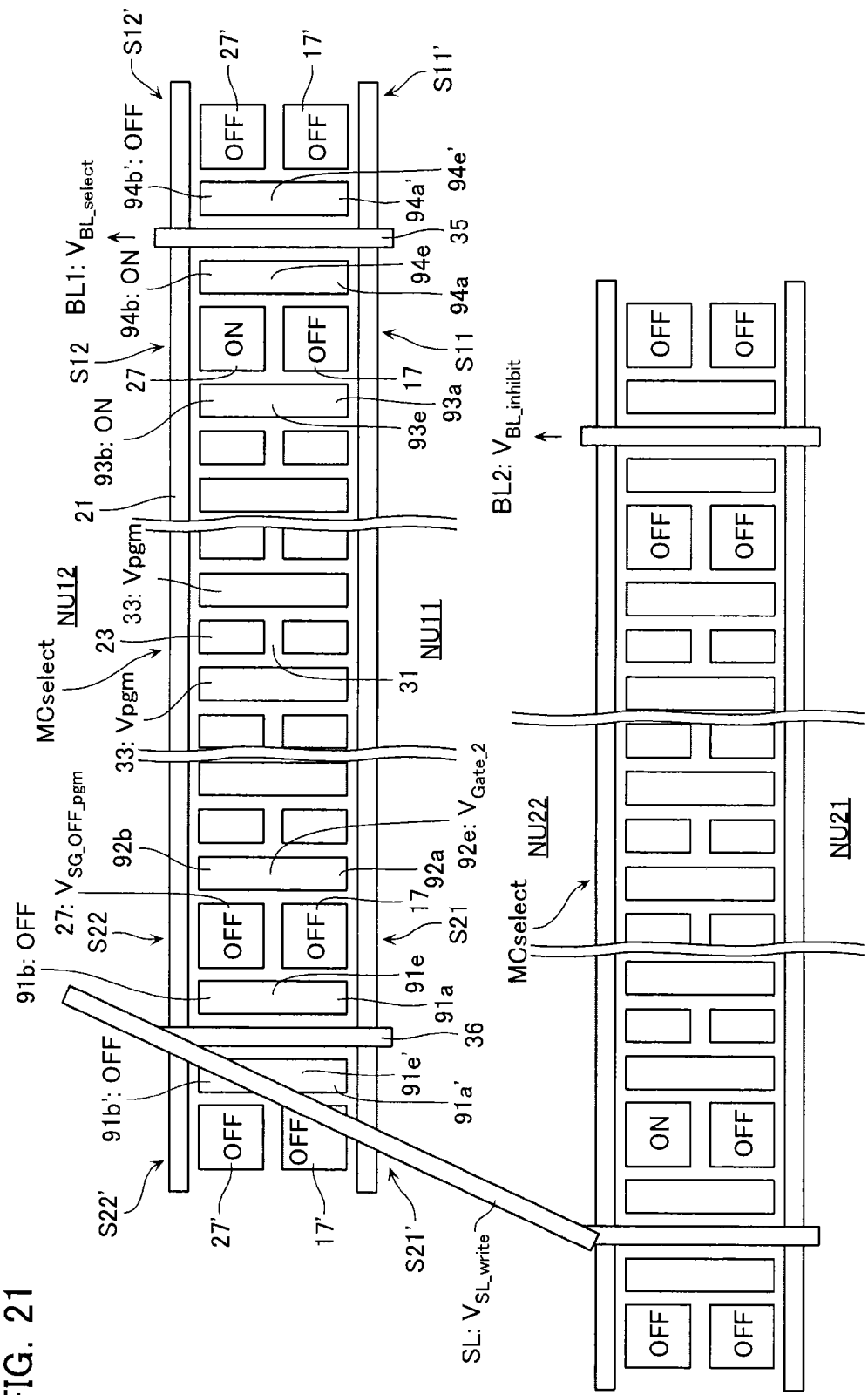
FIG. 21 is a schematic view illustrating write operation of the nonvolatile semiconductor memory device.

FIG. 21 is a schematic view for explaining write operation performed by the nonvolatile semiconductor memory device according to the present embodiment. Hereinafter, a selected NAND cell unit including a selected memory cell MCselect to be subjected to write operation is denoted as NU12, a non-selected NAND cell unit connected to the NAND cell unit NU12 via the first insulating film 31 is denoted as NU11, and non-selected NAND cell units which are adjacent to the NAND cell units NU11 and NU12 via the element isolating insulation films 15 and 25 (FIG. 4) in the GC direction and which are connected to the same source line SL are denoted as NU21 and NU22, respectively.

At the write operation, first, a selected bit line voltage VBL_select (for example, 0V) is applied to the selected bit line BL1 connected to the selected NAND cell unit NU12, and a non-selected bit line voltage VBL_inhibit (for example, Vdd) is applied to the non-selected bit line BL2. A source line voltage VSL_write (for example, 0V) is applied to the source line SL.

The fourth upper auxiliary transistor 94b, the bit line side select gate transistor S12, and the third upper auxiliary transistor 93b are made into conductive state, and the source line side select gate transistor S22 is made into cutoff state. Accordingly, the selected bit line voltage VBL_select is transferred to the second semiconductor layer 21 operating as the channel (body) of the selected NAND cell unit. Further, the writing voltage Vpgm is applied to a pair of control gates 33 adjacent to both sides, in the AA direction, of the second floating gate 23 of the selected memory cell MCselect, so that the potential of the floating gate 23 of the selected memory cell MCselect is raised, and write operation is performed with a potential difference between the floating gate 23 and the second semiconductor layer 21.

In the above write operation, when a difference between a channel (body) potential of the non-selected NAND cell units NU11, NU21, and NU22 capacitively coupling with the control gates and a voltage VSG_OFF_pgm applied to the gates (select gate lines 17 and 27) of the source line side select gate transistors S21 and S22 is more than the certain voltage value, GIDL occurs in the channel (body) of the source line side select gate transistor of the non-selected NAND cell units NU11, NU21, and NU22, and this may cause malfunction.

Therefore, in the present embodiment, a voltage VGate_2 between the voltage VSG_ON_pgm and the voltage VSG_OFF_pgm applied to the gate of the select gate transistor of the selected NAND cell unit NU12 is further applied to the second auxiliary gate 92e, so that this alleviates the potential difference from the body potential voltage VSG_OFF_pgm of the non-selected NAND cell units NU11, NU21, and NU22, and the above problem is prevented.

In the present embodiment, the potential for making into the cutoff state, the first upper auxiliary transistor 91b, a fourth upper auxiliary transistor 94b' of the NAND cell unit adjacent to the selected NAND cell unit NU12 in the AA direction via the bit line contact 35, and a first upper auxiliary transistor 91b' of the NAND cell unit adjacent to the selected NAND cell unit NU12 in the AA direction via the source line contact 36 is applied to the auxiliary gates 91e, 94e' and 91e', thus preventing SCE from occurring.

[1-2-4-2. Operation of the Auxiliary Gate During Reading Operation]

Figure 22:
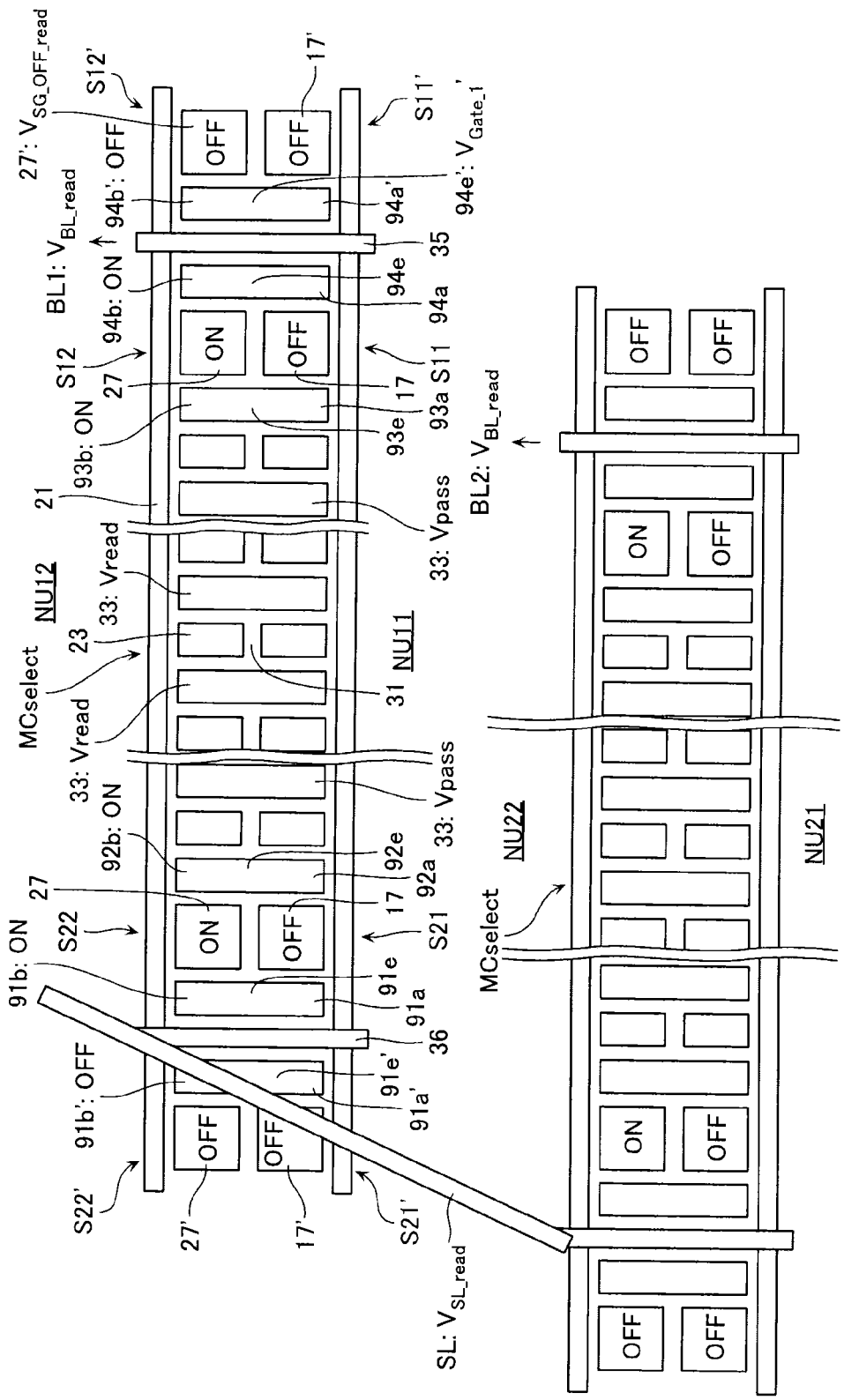
FIG. 22 is a schematic view illustrating read operation of the nonvolatile semiconductor memory device.

FIG. 22 is a schematic view for explaining read operation performed by the nonvolatile semiconductor memory device according to the present embodiment. In FIG. 22, an example in which read operation is performed on the NAND cell units NU12 and NU22 will be explained.

At the reading operation, first, a reading voltage VBL_read is applied to the selected bit lines BL1 and BL2, and a source line voltage VSL_read is applied to the source line SL. The fourth upper auxiliary transistor 94b, the bit line side select gate transistor S12, the third upper auxiliary transistor 93b, the second upper auxiliary transistor 92b, the source line side select gate transistor S22, and the first upper auxiliary transistor 91b are made into conductive state. A reading voltage Vread is applied to a pair of control gates 33 adjacent to both sides of the floating gate 23 in the AA direction, and a voltage Vpass is applied to the other control gates so as to make the memory cell MC into conductive state. Thus, read operation is performed.

In the above read operation, when a difference between the read voltage VBL_read applied to the bit lines BL1 and BL2 and the voltage VSG_OFF_read applied to a bit line side selected source line 27' of the NAND cell unit adjacent to the selected NAND cell unit NU12 in the AA direction via the bit line contact 35 is more than the certain voltage value, GIDL may occur in the bit line side select gate transistor S12', and this may cause malfunction. Therefore, in the present embodiment, a voltage VGate_1' between the read voltage VBL_read and the voltage VSG_OFF_read is further applied to the fourth auxiliary gate 94'e, so that this alleviates the potential difference between the read voltage VBL_read and the voltage VSG_OFF_read, and the above problem is prevented.

In the present embodiment, the first upper auxiliary transistor 91b' is made into cutoff state, thus preventing SCE from occurring.

[1-2-4-3. Operation of the Auxiliary Gate During Erase Operation]

Figure 23:
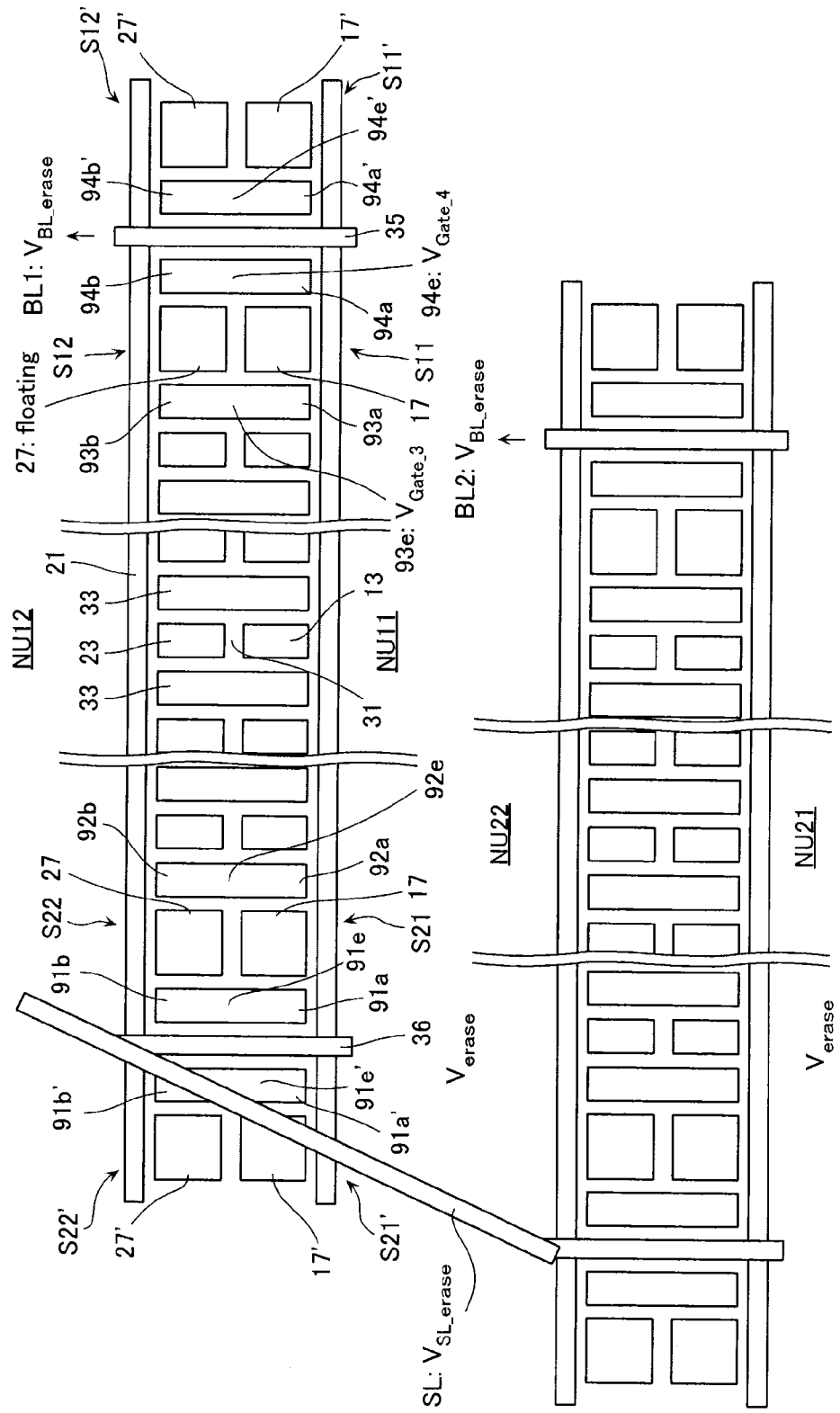
FIG. 23 is a schematic view illustrating erase operation of the nonvolatile semiconductor memory device.

FIG. 23 is a schematic view for explaining erase operation performed by the nonvolatile semiconductor memory device according to the present embodiment. In FIG. 23, an example in which erase operation is performed on the NAND cell units NU12 and NU22 is explained.

During the erase operation, first, an erase voltage Verase is given to a p-type semiconductor layer provided on a silicon substrate, not shown. The bit line contact 35 and the source line contact 36 are made of an n-type semiconductor just like the floating gates 13 and 23, and therefore, the bit lines BL1 and BL2 in open state are charged to the voltage VBL_erase.

A voltage VWL is applied to the word line (control gate line 33), and the second bit line side select gate line 27 is made into floating state.

A potential VGate_4 lower than the erase voltage VBL_erase is applied to the fourth auxiliary gate 94e, so that GIDL is caused, and the potential of the second semiconductor layer 21 is raised by holes h+ generated by the GIDL. When the potential of the semiconductor layer 21 is raised by a certain amount or more, electrons are pulled out from the floating gates 23 capacitively coupled with the control gate lines 33, and the erase operation is completed.

In the above erase operation, the potential of the second bit line side select gate line 27 is reduced by the capacitive coupling with the fourth auxiliary gate 94e, but when the potential difference from the second semiconductor layer 21 is more than the certain value, dielectric breakdown may occur between the first bit line side select gate line 17 and the second semiconductor layer 21. Therefore, in the present embodiment, the potential VGate_3 is applied to the third upper auxiliary gate 93e, and the potential of the second bit line side select gate line 27 is raised, so that this alleviates the potential difference from the second semiconductor layer 21, and the above problem is prevented.

1-3. Method for Manufacturing Memory Cell Array Structure

Subsequently, a method for manufacturing the memory cell array structure according to the present embodiment will be explained.

First, there are some conceivable variations regarding the formation of a peripheral circuit region. When the formation is on a bulk silicon substrate, it is necessary to form the peripheral circuits first. At this time, it is also possible to simultaneously form the memory cell arrays according to the present embodiment on the bulk silicon substrate. In the present embodiment, the NAND cell units NU1 and NU2 are provided sterically. Hence, an example of forming NAND cell units NU1 and NU2 on a silicon substrate will be explained. The method for forming peripheral circuit transistors is the same as an ordinary method. That is, first, a channel is formed on a silicon substrate. Then, gate oxide films (both a low voltage oxide film and a high voltage oxide film) are formed on the silicon substrate. Then, after a gate electrode and a mask material for AA (active area) formation are stacked, an STI trench is formed. Then, after the STI trench is filled, a mask material for GC (gate) formation is stacked, GC electrodes are formed, and a side wall insulating film is formed. After this, a source/drain diffusion layer is formed, an inter-GC insulating film is embedded, and the surface is planarized.

After the peripheral circuits are formed, the memory cell array according to the present embodiment is formed as their overlying layer. FIG. 24 to FIG. 43 are diagrams showing the method for manufacturing the memory cell array according to the present embodiment.

Figure 24:
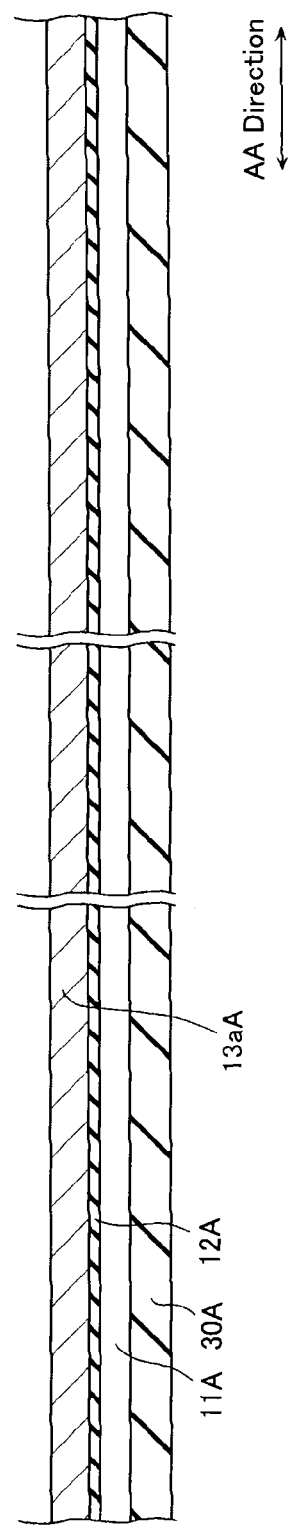
FIG. 24 is a cross-sectional diagram illustrating a step of manufacturing the memory cell array.

First, as shown in FIG. 24, an insulating film 30A made of SiO2 is formed on a silicon substrate, not shown, and the following layers are stacked sequentially thereon: a first semiconductor layer 11A made of polysilicon, a first gate insulating film 12A made of SiO2, and a first gate forming layer 13aA using polysilicon. The first semiconductor layer 11A to become a channel (body) is basically made of polysilicon, but may be made of monocrystal silicon. In the present embodiment, by using polysilicon for the channel (body) so as to form an SOI structure, it becomes unnecessary to form an STI in the silicon substrate, which realizes a cell structure that is more suitable for stacking. Since formation of the gate insulating film 12A is carried out on the semiconductor layer 11A made of polysilicon, it is done by using not a thermally-oxidized film, but a CVD (Chemical Vapor Deposition) or an ALD (Atomic Layer Deposition) oxide film. Note that although the first semiconductor layer 11A is provided by film formation as described above, it may instead be a silicon substrate as it is.

Figure 25:
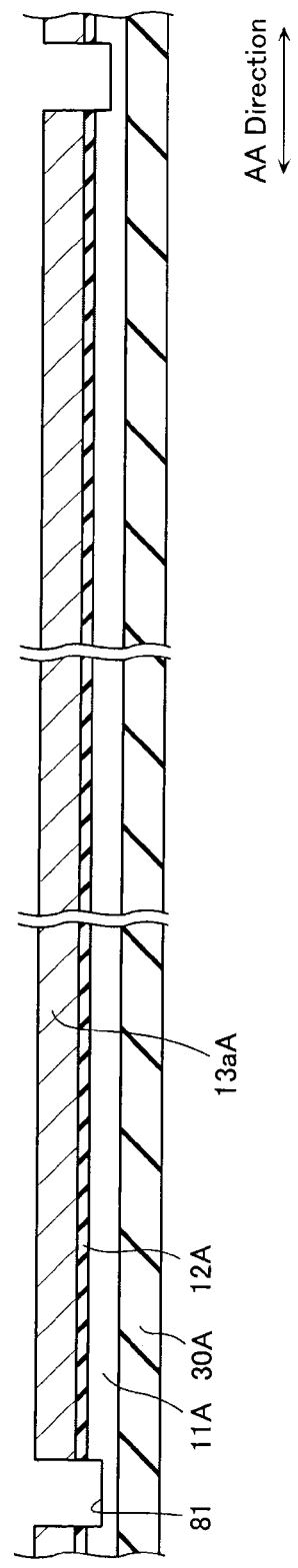
FIG. 25 is a cross-sectional diagram illustrating a step of manufacturing the memory cell array.
Figure 26:
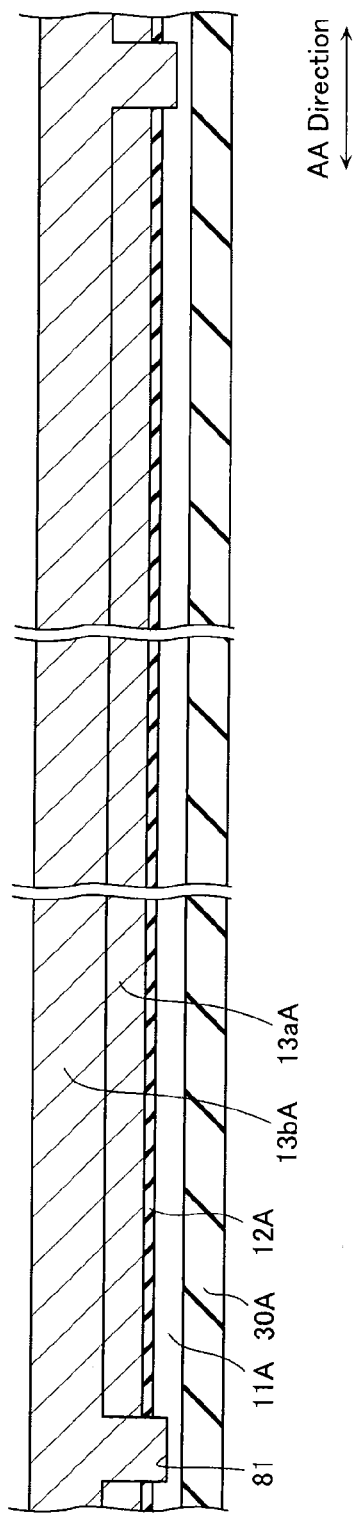
FIG. 26 is a cross-sectional diagram illustrating a step of manufacturing the memory cell array.

Subsequently, as illustrated in FIG. 25, a first trench 81 extending in the GC direction is provided to the first gate forming layer 13aA, the first gate insulating film 12A, and the surface of the first semiconductor layer 11A. Subsequently, as illustrated in FIG. 26, a second gate forming layer 13bA is formed in a portion of the surface of the first floating gate forming layer 13aA and the first semiconductor layer 11A that is exposed by the first trench 81.

Figure 27:
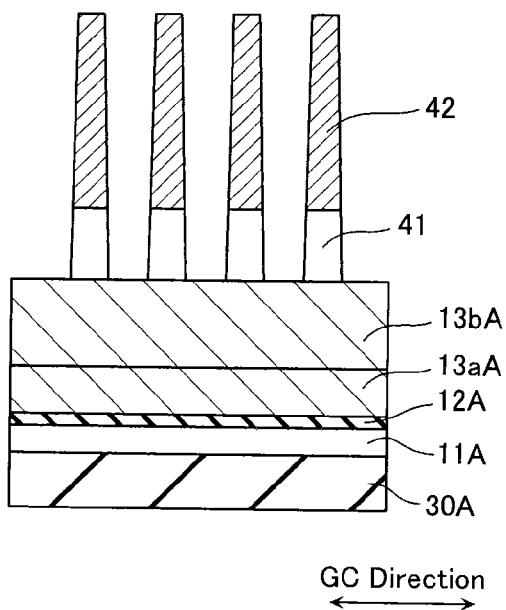
FIG. 27 is a cross-sectional diagram illustrating a step of manufacturing the memory cell array.
Figure 28:
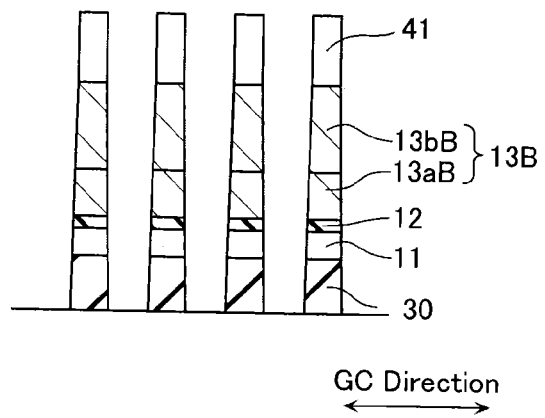
FIG. 28 is a cross-sectional diagram illustrating a step of manufacturing the memory cell array.

After the layers up to the second gate forming layer 13bA are formed, mask materials 41 and 42 for AA pattern formation made of, e.g., SiN and SiO2 are patterned onto the second gate forming layer 13bA as illustrated in FIG. 27. Subsequently, RIE (Reactive Ion Etching) using the mask materials 41 and 42 is carried out to selectively etch the stack of layers to the bottom of the insulating layer 30A to form second trenches, thereby forming the AA pattern as shown in FIG. 28. Accordingly, the floating gate forming layer 13B, the first gate insulating film 12, the first semiconductor layer 11, and the insulating film 30 are formed.

Figure 29:
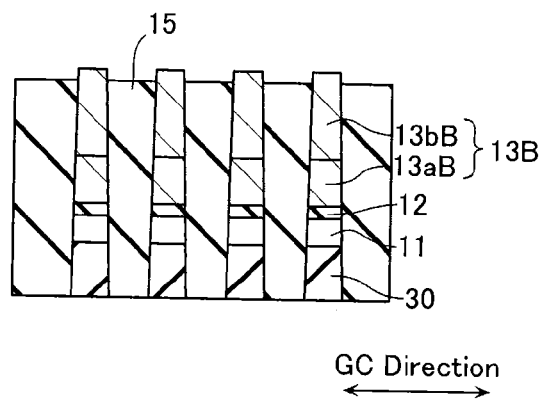
FIG. 29 is a cross-sectional diagram illustrating a step of manufacturing the memory cell array.
Figure 30:
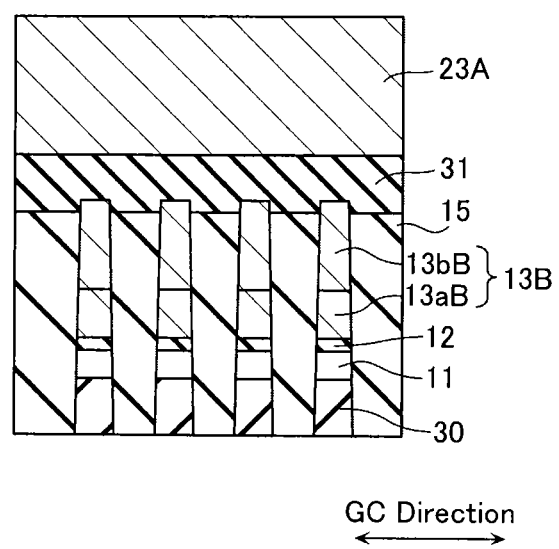
FIG. 30 is a cross-sectional diagram illustrating a step of manufacturing the memory cell array.

Subsequently, as illustrated in FIG. 29, the trenches formed by the AA pattern formation are filled with the first element isolating insulating film 15 made of SiO2, and using the polysilicon forming the first gate forming layer 13B as a stopper, planarizing process is performed with CMP (Chemical Mechanical Polishing). Further, the upper surface of the first element isolating insulating layer 15 is setback by etch back. Subsequently, as illustrated in FIG. 30, a first insulating layer 31 for isolating the upper layer from the lower layer is formed on the first element isolating insulating layer 15 and the first gate forming layer 13B, and a third gate forming layer 23A made of polysilicon is formed on the first insulating layer 31.

Figure 31:
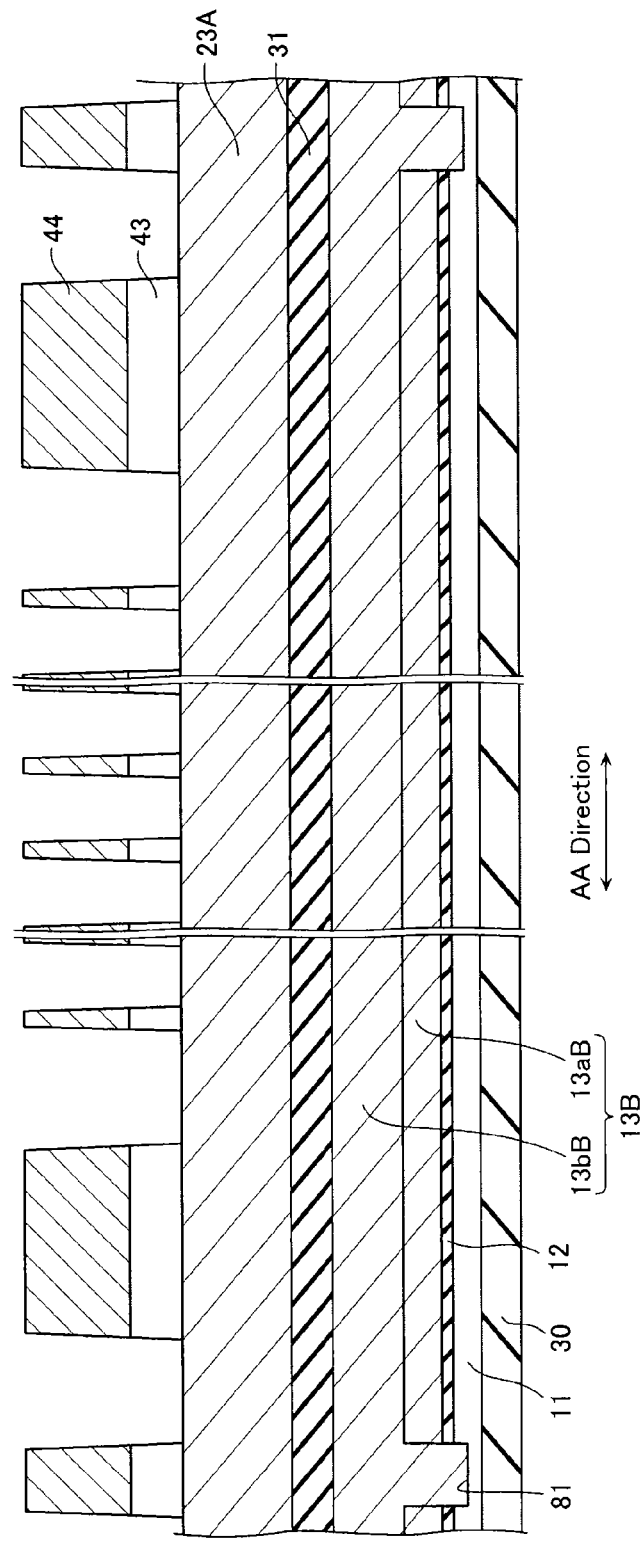
FIG. 31 is a cross-sectional diagram illustrating a step of manufacturing the memory cell array.
Figure 32:
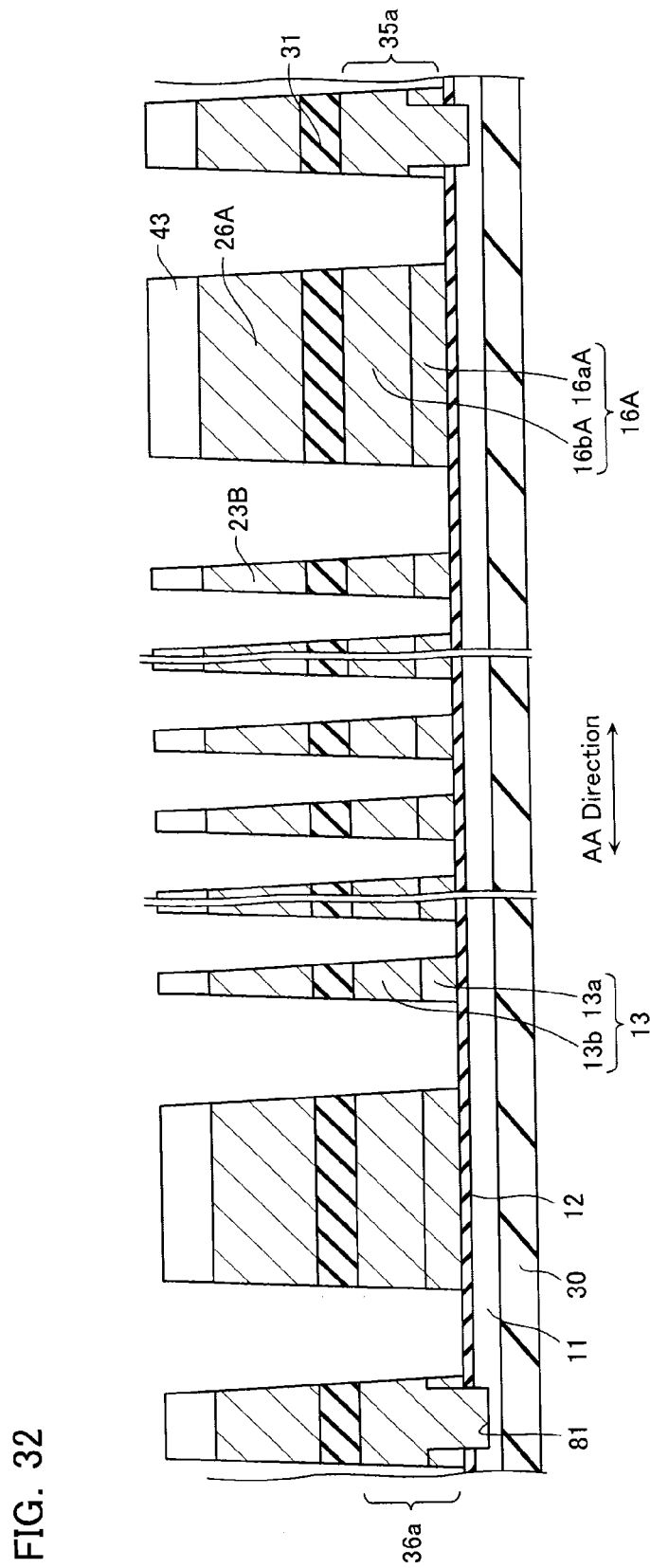
FIG. 32 is a cross-sectional diagram illustrating a step of manufacturing the memory cell array.

Then, as shown in FIG. 31, mask materials 43 and 44 for GC pattern formation made of, e.g., SiN and SiO2 are patterned onto the third gate forming layer 23A. Then, as shown in FIG. 32, the stack of layers is selectively etched to the top of the gate insulating film 12 by RIE using the mask materials 43 and 44, to form third trenches and thereby form the GC pattern. As a result, the first floating gate 13, the third gate forming layer 23B, the first select gate forming layer 16A, the second select gate forming layer 26A, and the lower contacts 35a and 36a are formed. It is preferred that this GC pattern formation be carried out by an etching process having a high selectivity toward the gate insulating film 12 of the lower layer and that the semiconductor layer 11 of the lower layer be not etched.

Figure 33:
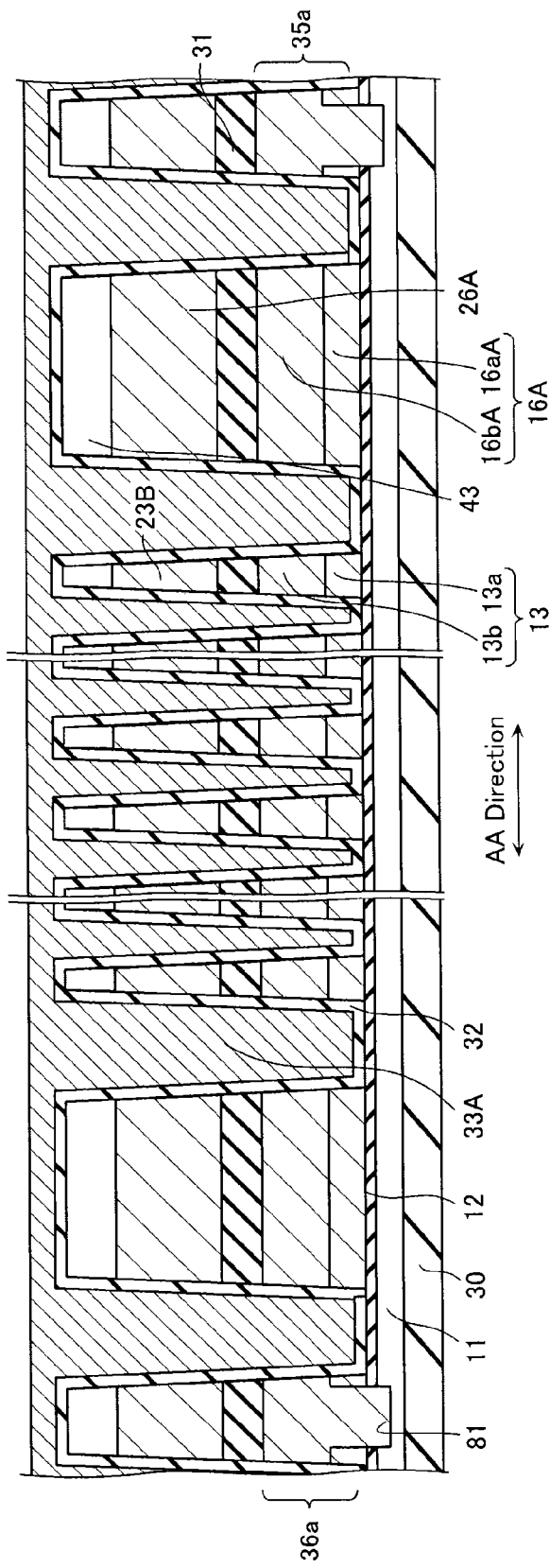
FIG. 33 is a cross-sectional diagram illustrating a step of manufacturing the memory cell array.

Then, as shown in FIG. 33, after an inter-gate insulating film (IPD) 32 made of SiO2 is formed, the trenches of the GC pattern are filled with a control gate forming layer 33A. The control gate forming layer 33A may be made of polysilicon or metal (W, etc.), metal silicide (WSi, etc.).

Figure 34:
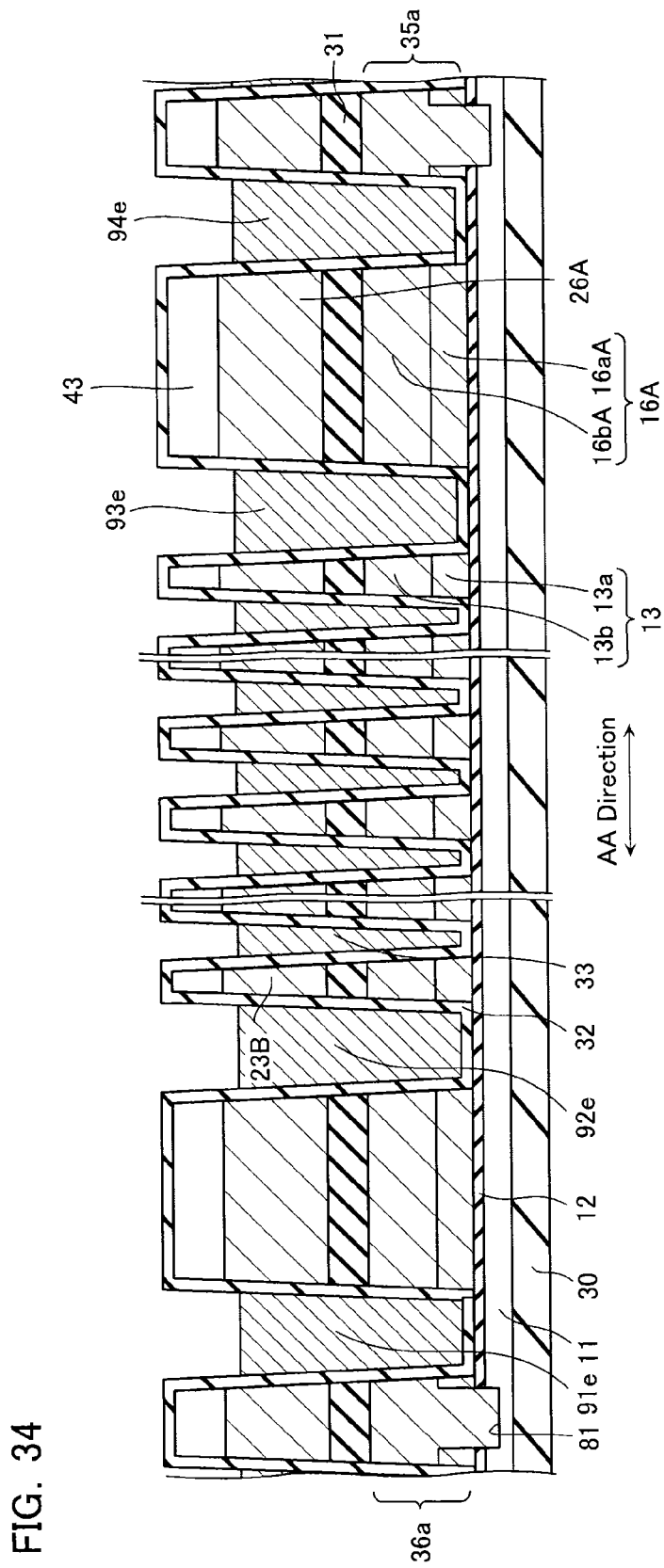
FIG. 34 is a cross-sectional diagram illustrating a step of manufacturing the memory cell array.
Figure 35:
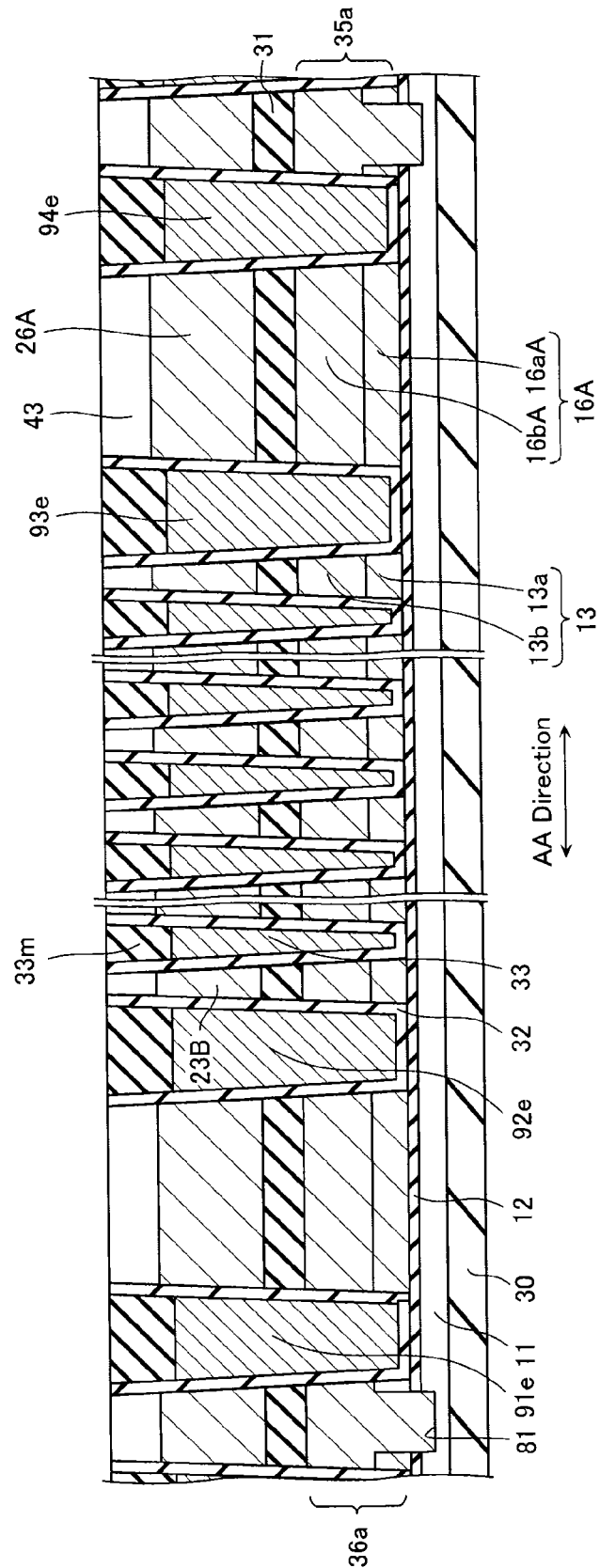
FIG. 35 is a cross-sectional diagram illustrating a step of manufacturing the memory cell array.
Figure 36:
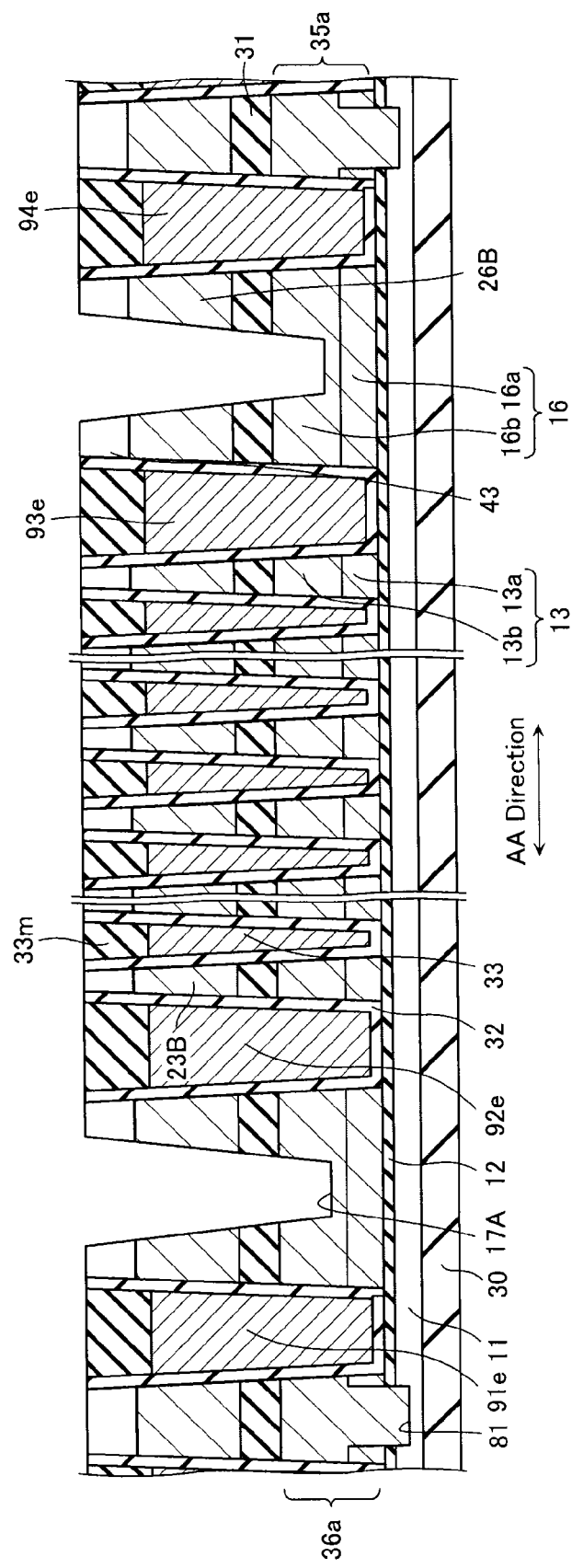
FIG. 36 is a cross-sectional diagram illustrating a step of manufacturing the memory cell array.

Next, as shown in FIG. 34, the control gate forming layer 33A is etched back by RIE to form the control gates 33 and the auxiliary gates 91e to 94e. Then, as shown in FIG. 35, a mask material 33m made of a CVD oxide film, a coated oxide film, or the like are filled on the control gates 33, and the uppermost surface is planarized by CMP using the mask 43 made of SiN as a stopper. After this, in order to form the select gate forming layers 16A and 26A and transistors of an unillustrated row decoder region, select gate trenches equivalent to EI (Etching Inter Poly) trenches are formed by RIE or the like. As a result, fourth trenches 17A which reach down to the second select gate forming layer 26B, the first insulating film 31, and the first select gate 16 are formed as shown in FIG. 36.

Figure 37:
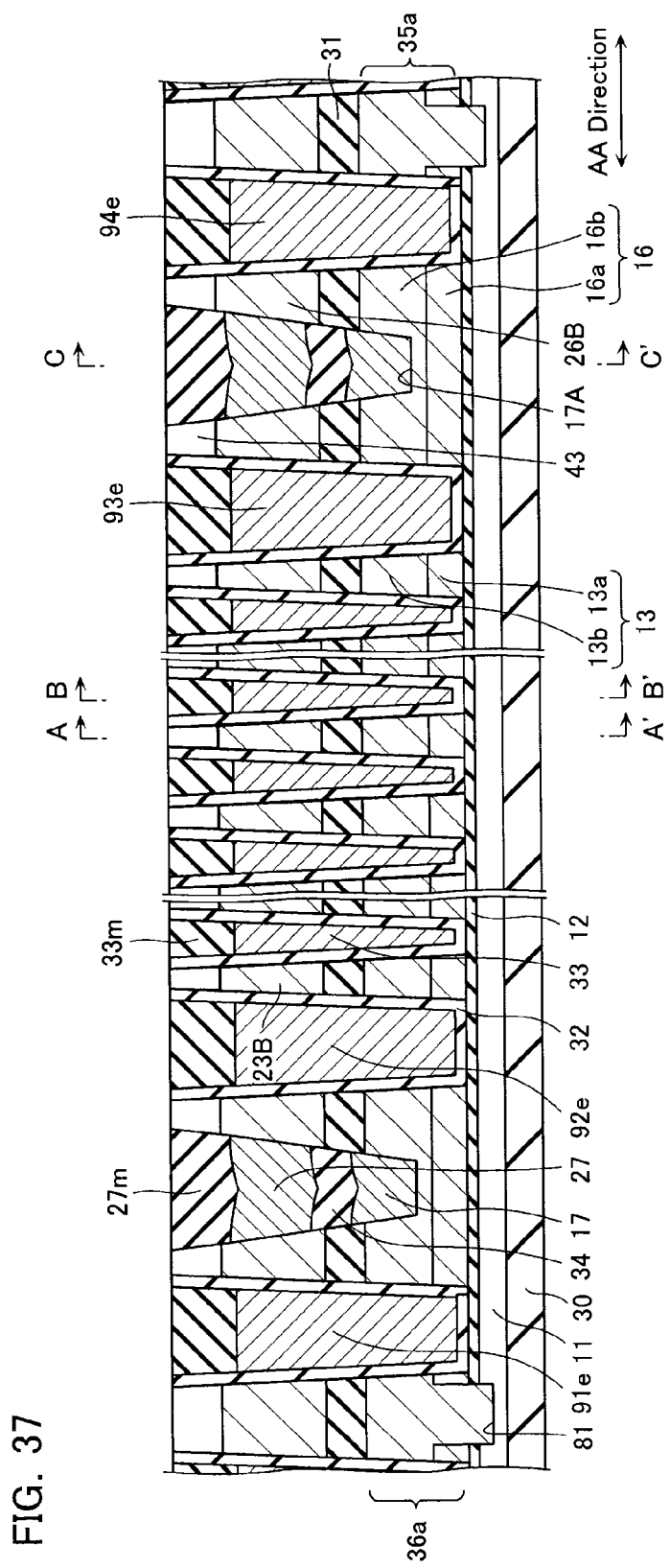
FIG. 37 is a cross-sectional diagram illustrating a step of manufacturing the memory cell array.
Figure 38C:
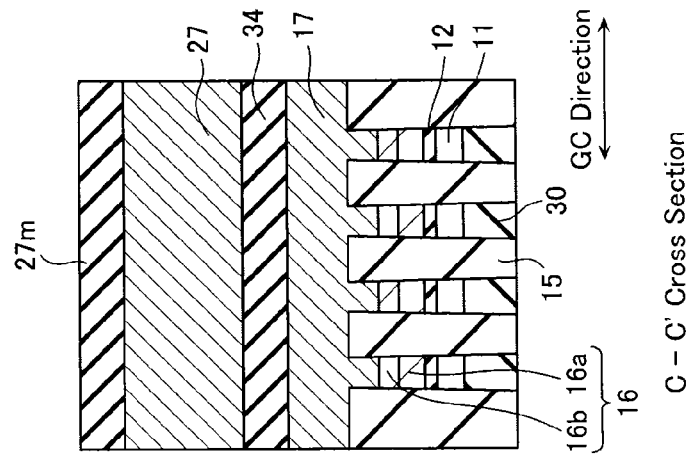
FIGS. 38A to 38C are cross-sectional diagrams illustrating a step of manufacturing the memory cell array.
Figure 38B:
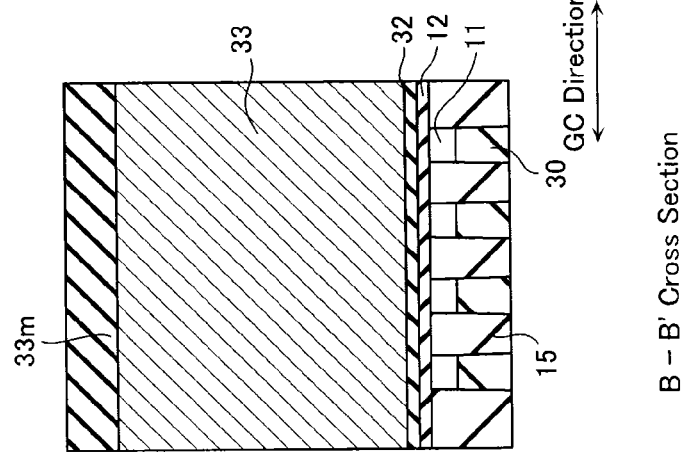
Figure 38A:
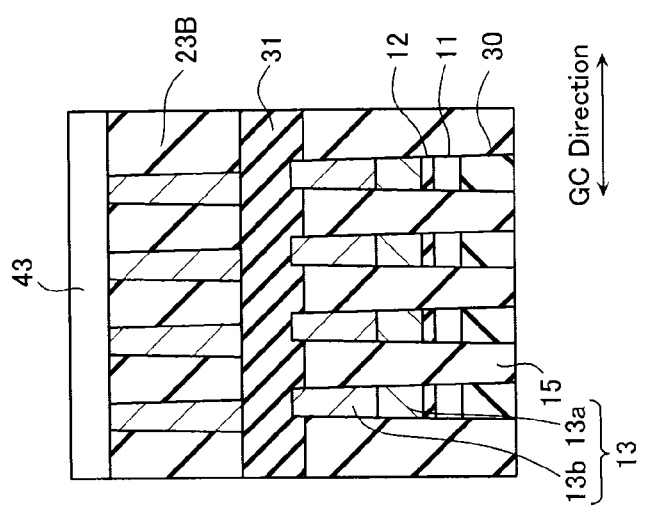

Next, in order to form select gate transistors S11 to S22 independently for lower cells and upper cells, a first select gate line 17, a second insulating film 34, and a second select gate line 27 are sequentially formed in the select gate trenches 17A by repeating embedding and etch back as illustrated in FIG. 37. Like the control gates 33 and auxiliary gates 91e to 94e, the select gate lines 17, 27 may be made of polysilicon or metal (W, etc.), metal silicide (WSi, etc.). A cap insulating film 27m is filled in the etched-back portion of the second select gate line 27, and the upper surface of the cap insulating film 27m is planarized by CMP using the mask material 43 as a stopper. FIGS. 38A, 38B, 38C are a cross section taken along A-A', a cross section taken along B-B', a cross section taken along C-C' of FIG. 37, respectively.

Figure 39:
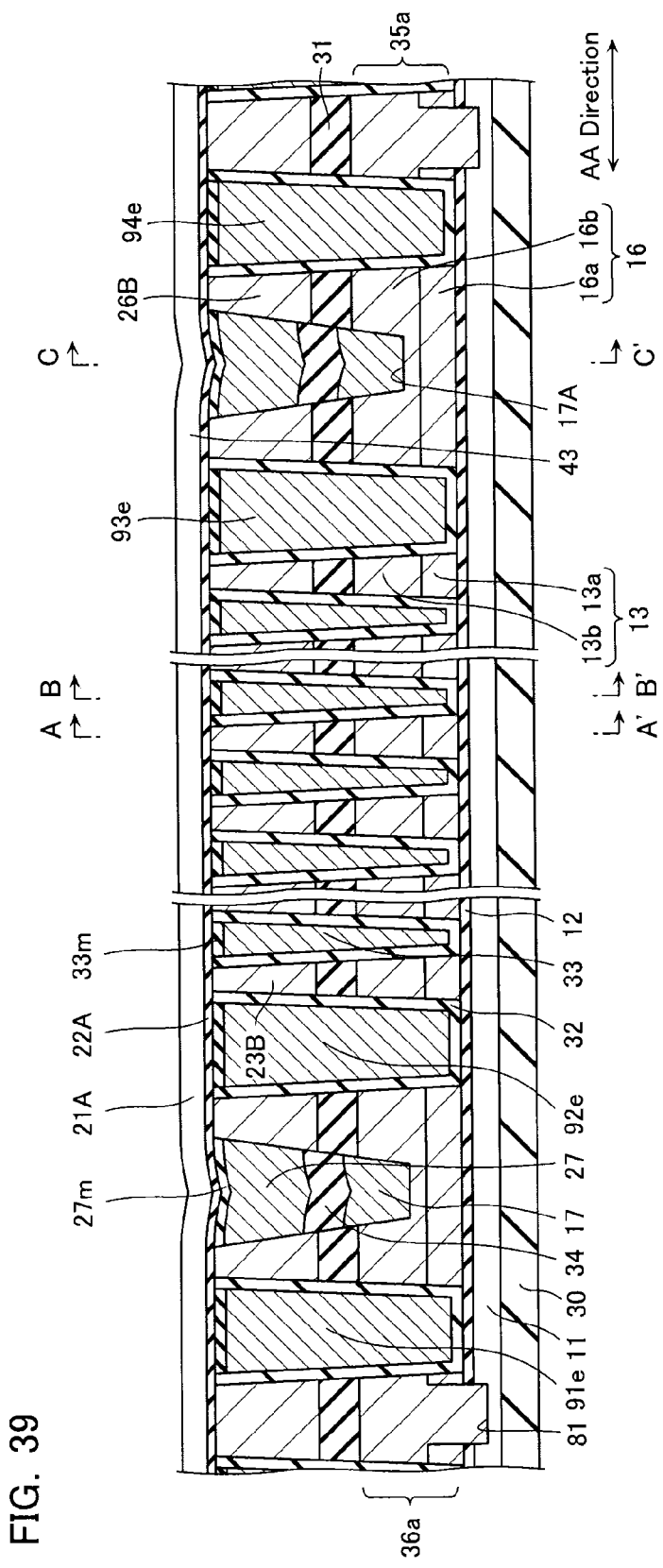
FIG. 39 is a cross-sectional diagram illustrating a step of manufacturing the memory cell array.

Next, as shown in FIG. 39, planarization is carried out by CMP using the third gate forming layer 23B as the stopper, and a second gate insulating film 22A made of S1O2 and a second semiconductor layer 21A made of polysilicon are sequentially formed on the planarized surface. It should be noted that the CMP may be performed using the control gates 33 as a stopper. FIGS. 40A, 40B, 40C are a cross section taken along A-A', a cross section taken along B-B', a cross section taken along C-C' of FIG. 39, respectively.

Figure 41:
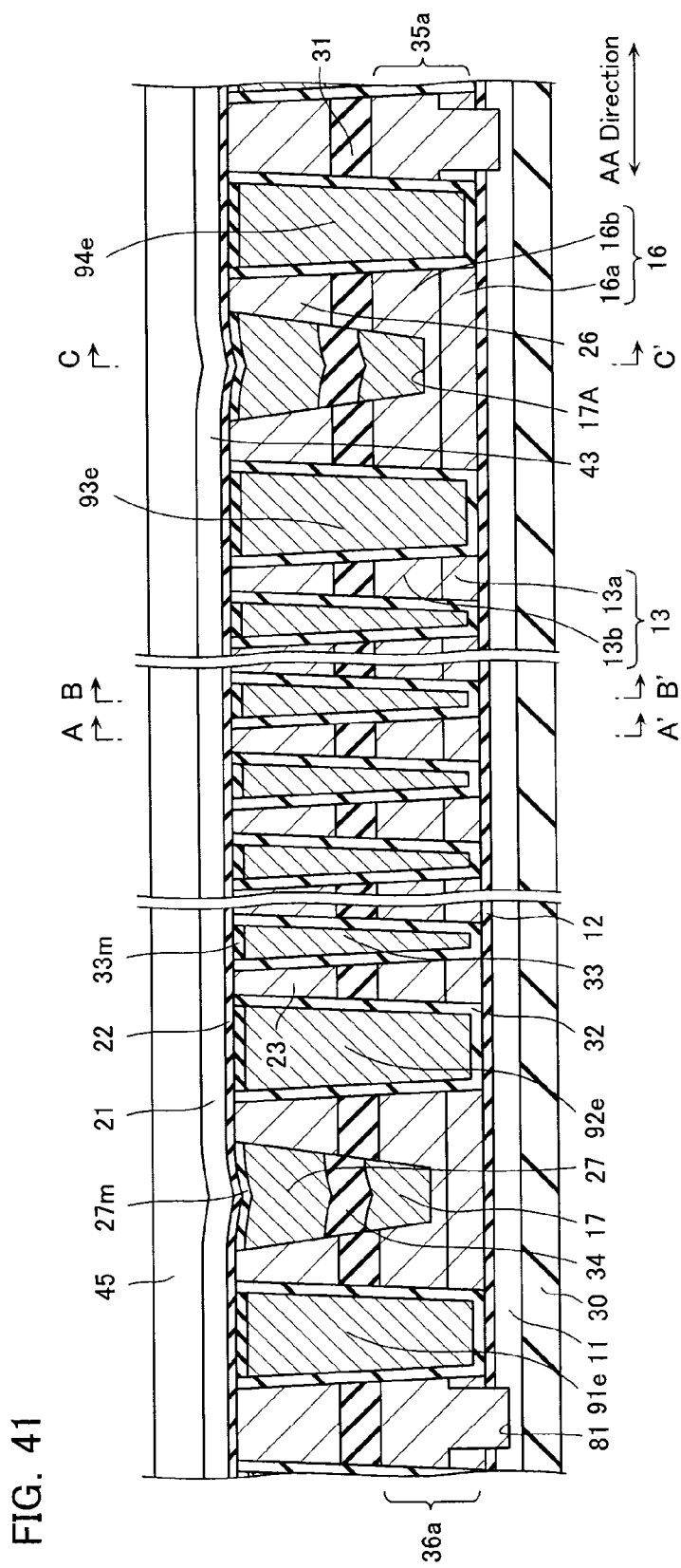
FIG. 41 is a cross-sectional diagram illustrating a step of manufacturing the memory cell array.
Figure 42C:
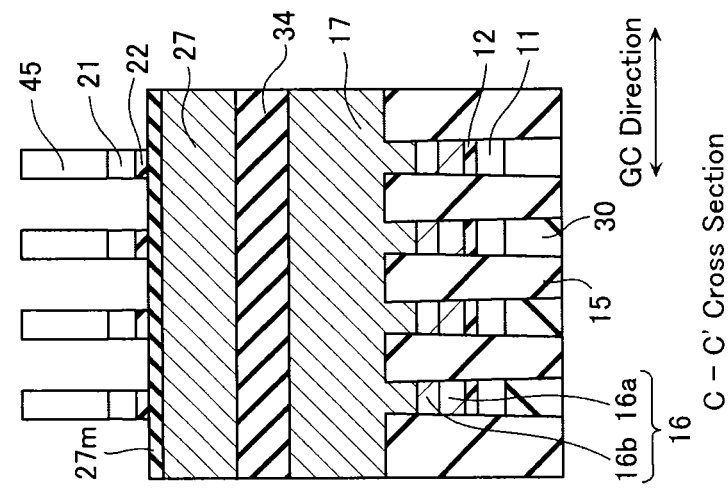
FIGS. 42A to 42C are cross-sectional diagrams illustrating a step of manufacturing the memory cell array.
Figure 42B:
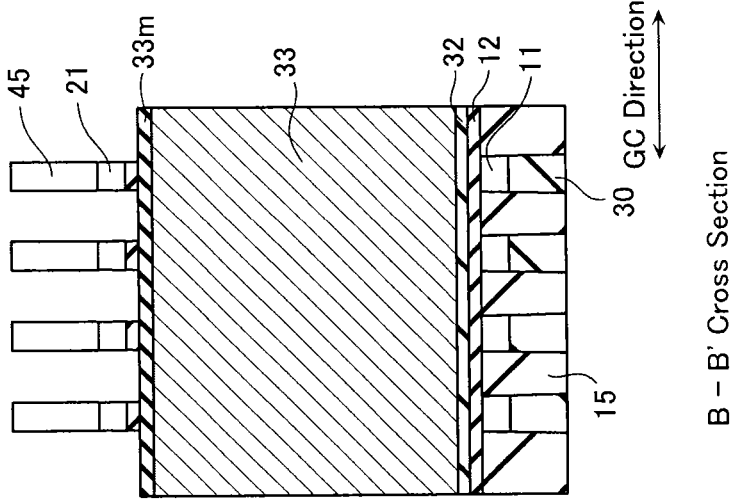
Figure 42A:
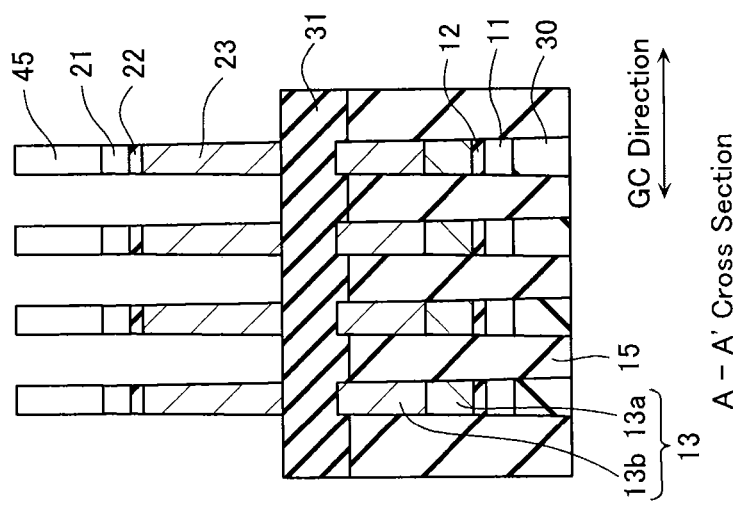

Subsequently, as illustrated in FIG. 41, in order to form AA pattern into the second semiconductor layer 21A, the second gate insulating film 22A, the third gate forming layer 23B, and the second select gate forming layer 26B of the upper layer, a mask material 45 for AA pattern formation is patterned onto the second semiconductor layer 21A, and RIE is carried out to form the AA pattern. FIGS. 42A, 42B, 42C are a cross section taken along A-A', a cross section taken along B-B', a cross section taken along C-C' of FIG. 41, respectively. Through the above steps, the second floating gate 23 is formed, and at the same time, the second gate insulating film 22 and the second semiconductor layer 21 are formed self-aligned with the second floating gate 23.

Figure 43:
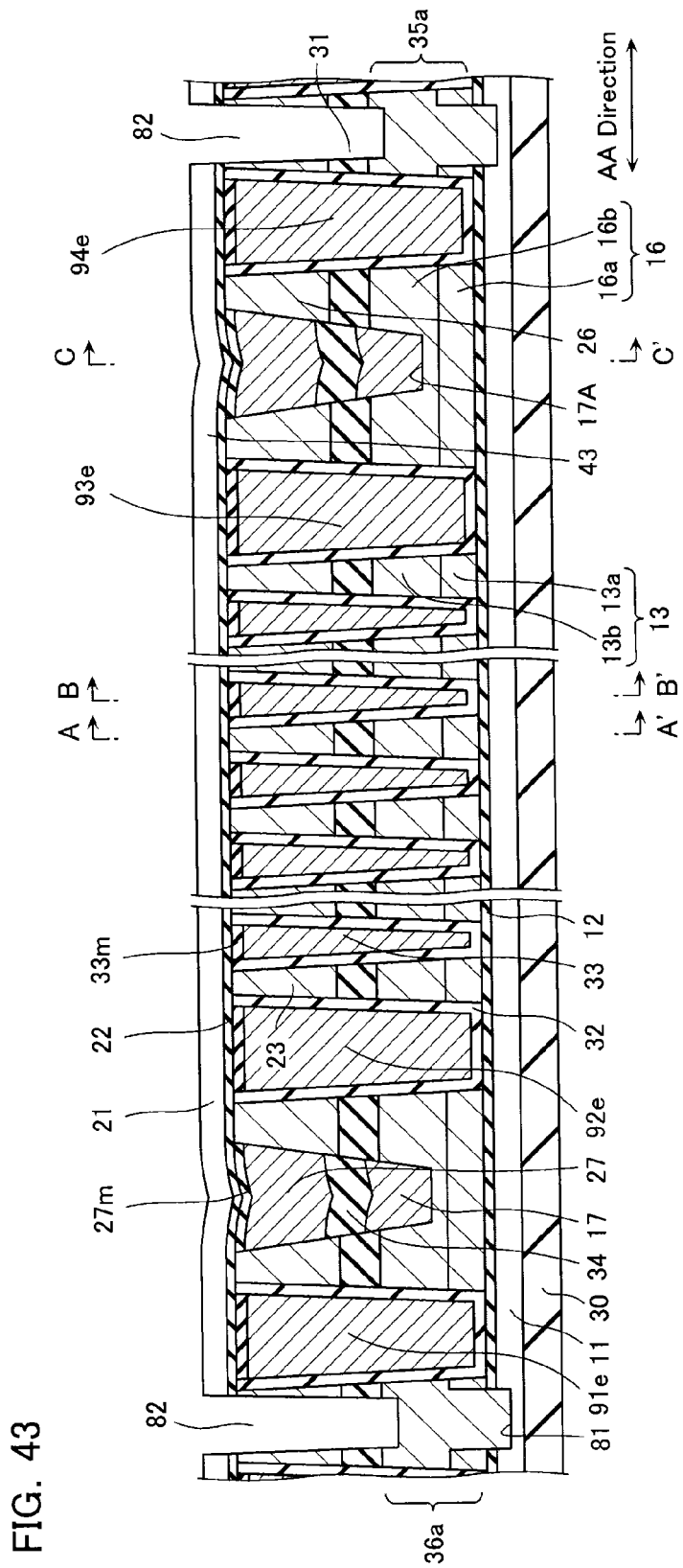
FIG. 43 is a cross-sectional diagram illustrating a step of manufacturing the memory cell array.

Then, a second element isolating insulating layer 25 (FIGS. 4, 6) is filled in the trenches of the upper layer AA pattern. Finally, as illustrated in FIG. 43, via holes 82 are formed in the second semiconductor layer 21, the second gate insulating film 22, the upper contact layer 37, the first insulating film 31, and lower contacts 35a, 36a, and the upper contacts 35b, 36b are filled in the via holes 82 thus formed. At the formation of the via contacts, the via holes 82 are provided so that the via holes 82 penetrate through the first insulating film 31 and the upper surfaces of the lower contacts 35a, 36a are exposed.

Like the present embodiment, the same steps as the steps for forming the control gate line 33 can be used to form the auxiliary gates 91e and 94e, and the number of steps of manufacturing can be reduced.

According to such contact formation method, the lower contacts 35a, 36a themselves can be formed by the process for forming the first floating gate 13, and are self-aligned in the CG direction, and the sizes of the upper surfaces thereof are large. Therefore, as compared with the method for providing via holes penetrating the layers from the second semiconductor layer 21 to the first semiconductor layer 11 all at once, it is not necessary to perform precise alignment, and it is easy to form the via holes. This kind of method for forming the contacts can be said to be a method suitable for further stacking. This feature will be explained in detail in the third embodiment below.

2. Second Embodiment

Figure 44:
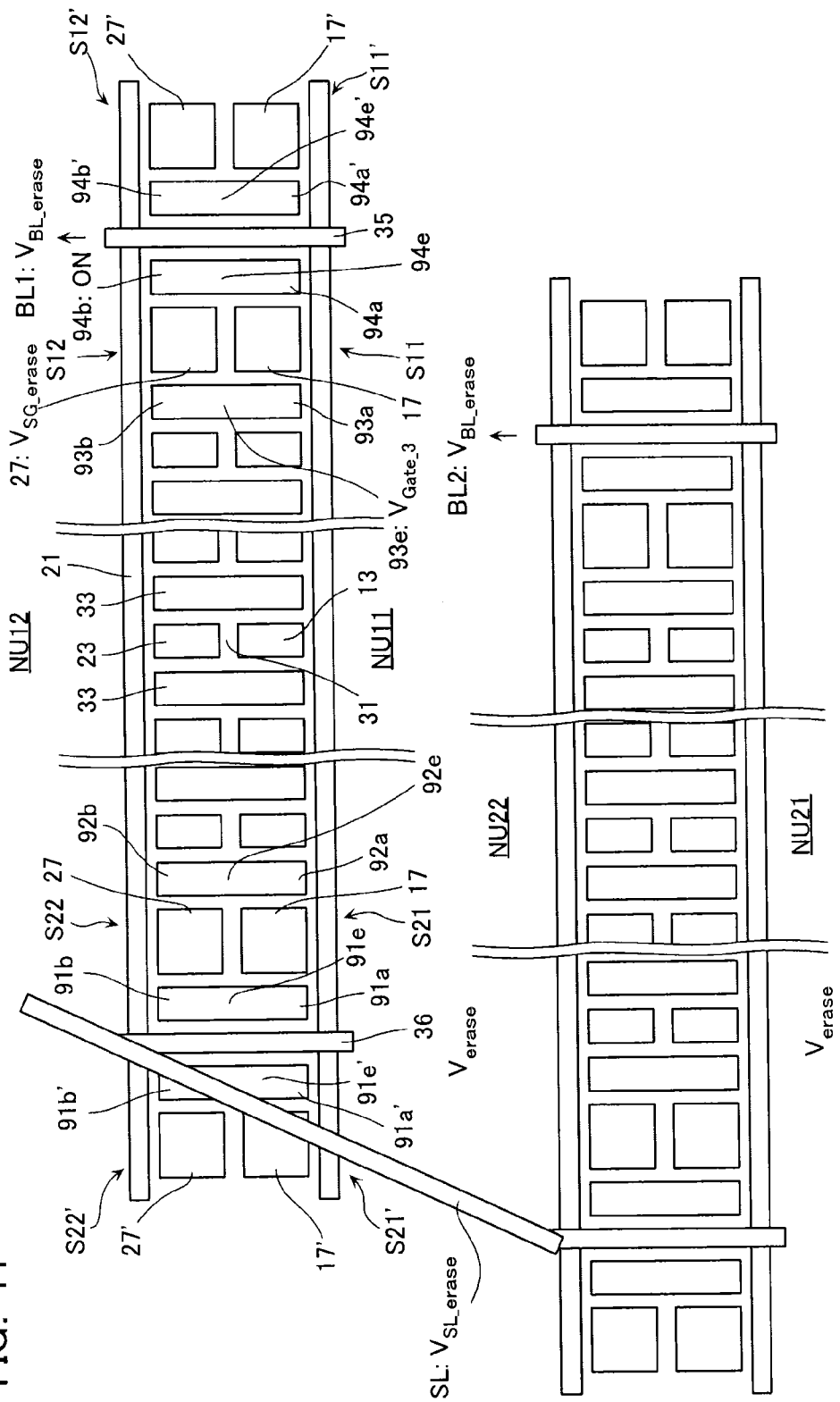
FIG. 44 is a schematic view illustrating erase operation of a nonvolatile semiconductor memory device according to a second embodiment.
Figure 45:
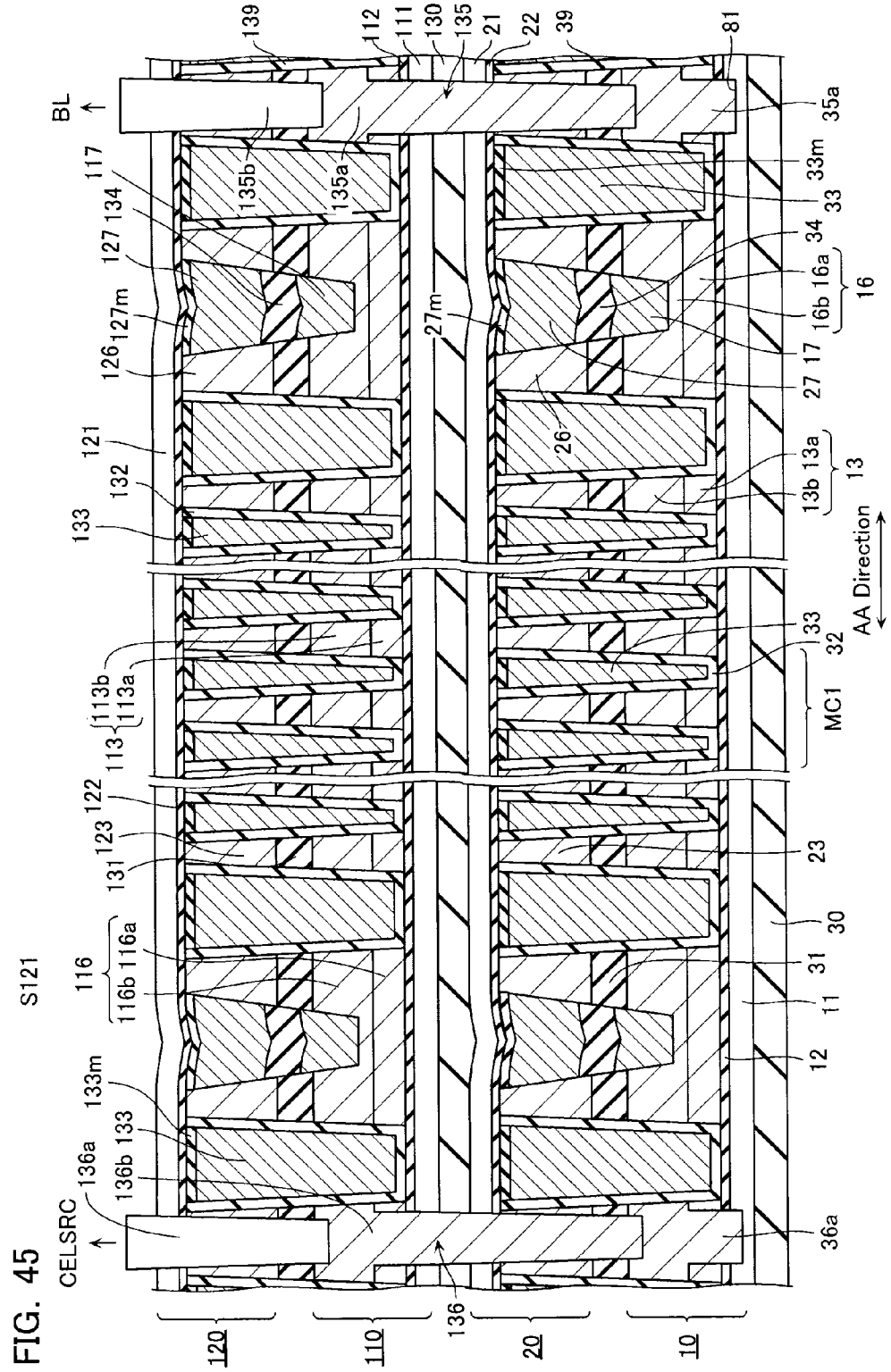
FIG. 45 is a cross-sectional diagram illustrating a structure, taken in a GC direction, of a memory cell array of a nonvolatile semiconductor memory device according to the second embodiment.
Figure 46:
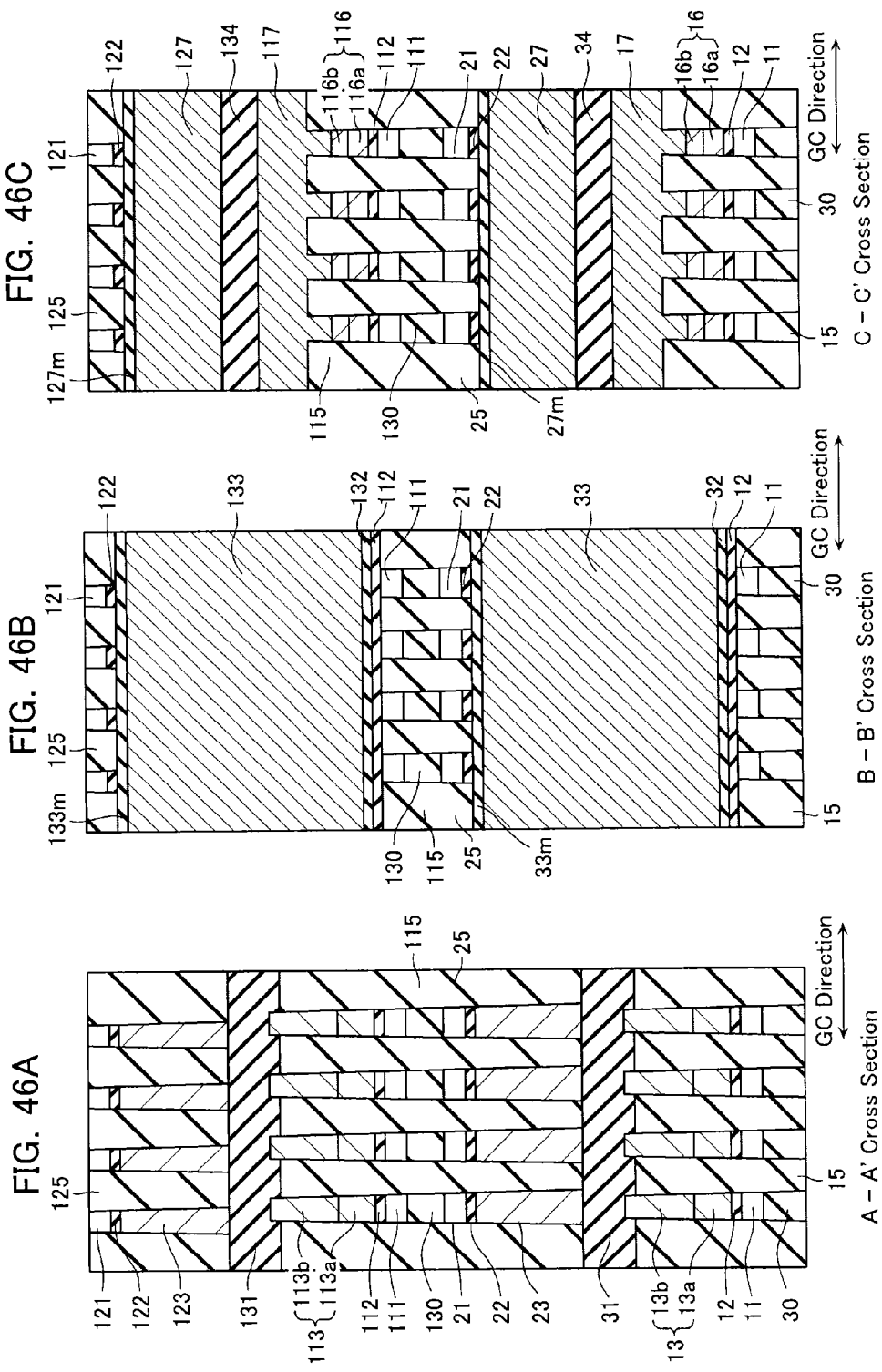
FIGS. 46A to 46C are cross-sectional diagrams taken along A-A', B-B', and C-C' of FIG. 45.

Subsequently, erase operation performed by a nonvolatile semiconductor memory device according to the second embodiment will be explained. FIG. 44 is a schematic view for explaining erase operation performed by the nonvolatile semiconductor memory device according to the present embodiment. The erase operation of the nonvolatile semiconductor memory device according to the present embodiment is basically the same as the first embodiment, but is different in the following features. More specifically, in the present embodiment, the fourth upper auxiliary transistor 94b is made into conductive state, and a voltage VSG_erase lower than the erase voltage VBL_erase is applied to the second bit line side select gate line 27, so that GIDL is caused, and the potential of the second semiconductor layer 21 is raised by holes h+ generated by the GIDL. It should be noted that the voltage VSG_erase is set at such a value that no dielectric breakdown occurs between the second select gate line 27 and the second semiconductor layer 21 and between the second select gate line 27 and the first select gate line 17.

3. Third Embodiment

3-1. Memory Cell Array Structure According to the Third Embodiment

Subsequently, the memory cell array structure according to the third embodiment will be explained. In the first embodiment, the NAND cell units NU1 and NU2 are stacked upside down, but as illustrated in FIGS. 45 and 46A to 46C, a plurality of layers of memory cell arrays may further be stacked. In the nonvolatile semiconductor memory device according to the present embodiment, the memory cell arrays as illustrated in the first embodiment are stacked via an insulating film 130. In FIGS. 45 and 46A to 46C, a third memory cell array layer 110 and a fourth memory cell array layer 120 are stacked above the first memory cell array layer 10 and the second memory cell array layer 20. In addition, a plurality of layers may further be stacked.

3-2. Method for Manufacturing Memory Cell Array Structure According to the Third Embodiment Subsequently, a method for manufacturing the memory cell array structure according to the present embodiment will be explained.

Figure 47:
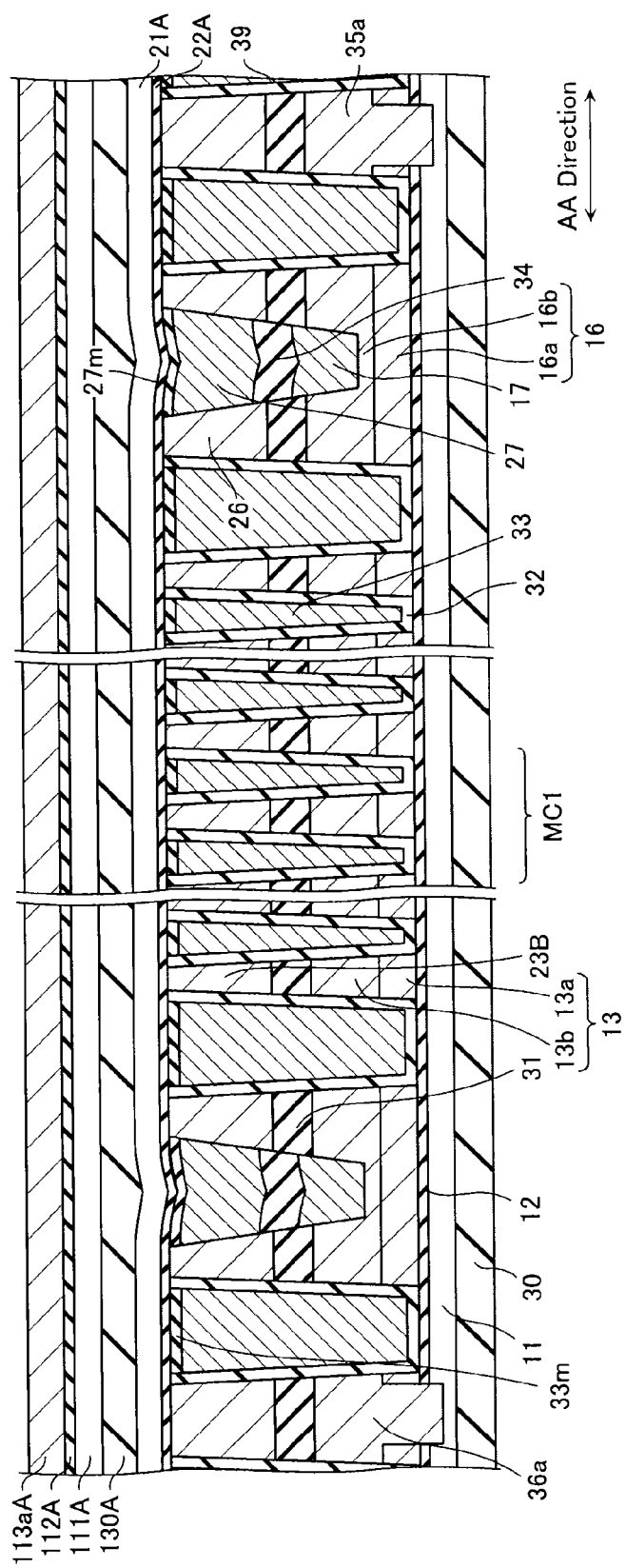
FIG. 47 is a cross-sectional diagram illustrating a step of manufacturing a memory cell array of a nonvolatile semiconductor memory device according to a third embodiment.

The method for manufacturing the memory cell array according to the present embodiment is the same as the first embodiment up to the step as illustrated in FIGS. 39 and 40A to 40C. After the structure as shown in FIGS. 39 and 40A to 40C is manufactured, an insulating film 130A made of SiO2 is formed on the second semiconductor layer 21A as illustrated in FIG. 47. On the insulating film 130A, the following layers, i.e. a third semiconductor layer 111A made of polysilicon, a third gate insulating film 112A made of SiO2, and a fourth gate forming layer 113aA made of polysilicon are stacked sequentially. The third semiconductor layer 111A to become a channel (body) is basically made of polysilicon, but may be made of monocrystal silicon. Since formation of the gate insulating film 112A is carried out by using not a thermally-oxidized film, but a CVD (Chemical Vapor Deposition) or an ALD (Atomic Layer Deposition) oxide film, just like the case where the gate insulating film 12A is formed.

In this embodiment, the bit line contact 135 includes a lower contact 35a, an intermediate contact 135a, and an upper contact 135b. The source contact 136 includes a lower contact 36a, an intermediate contact 136a, and an upper contact 136b.

Figure 48:
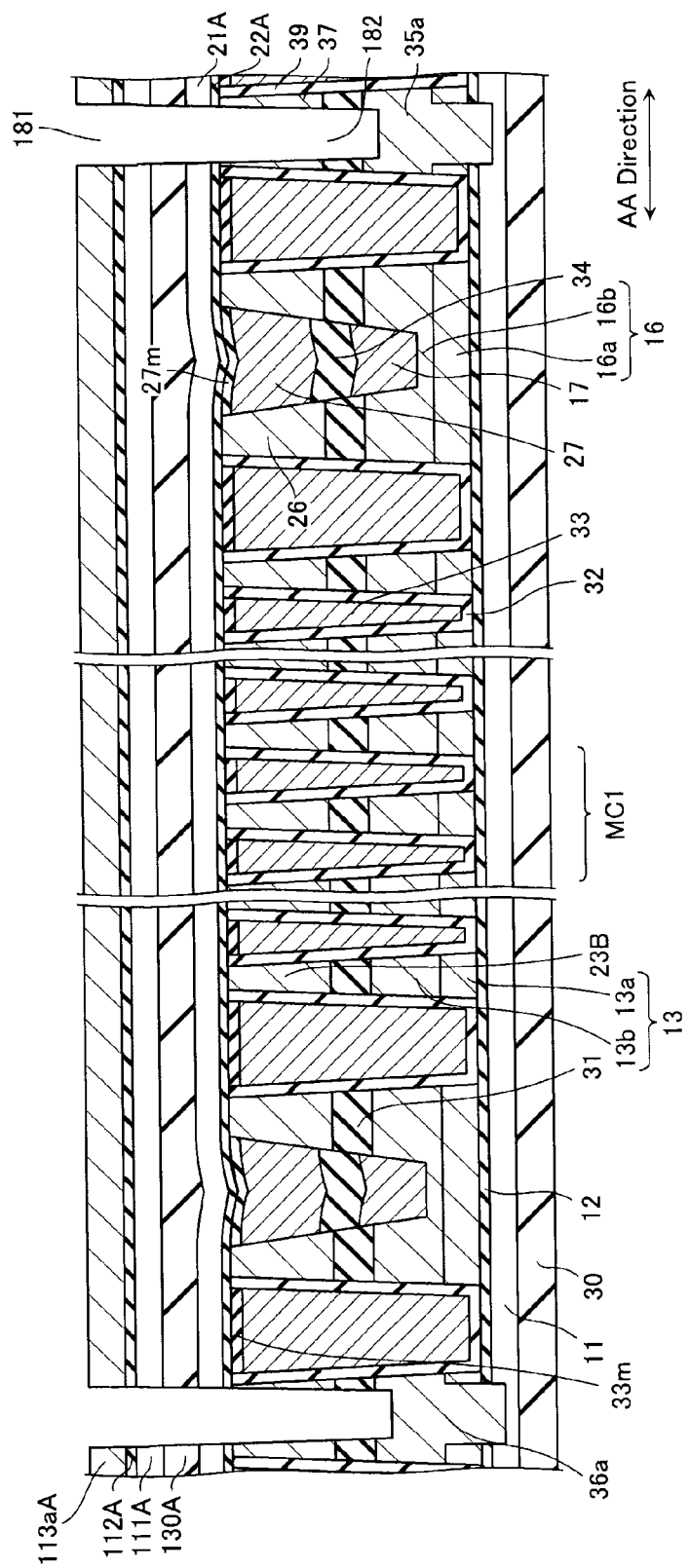
FIG. 48 is a cross-sectional diagram illustrating a step of manufacturing the memory cell array.
Figure 49:
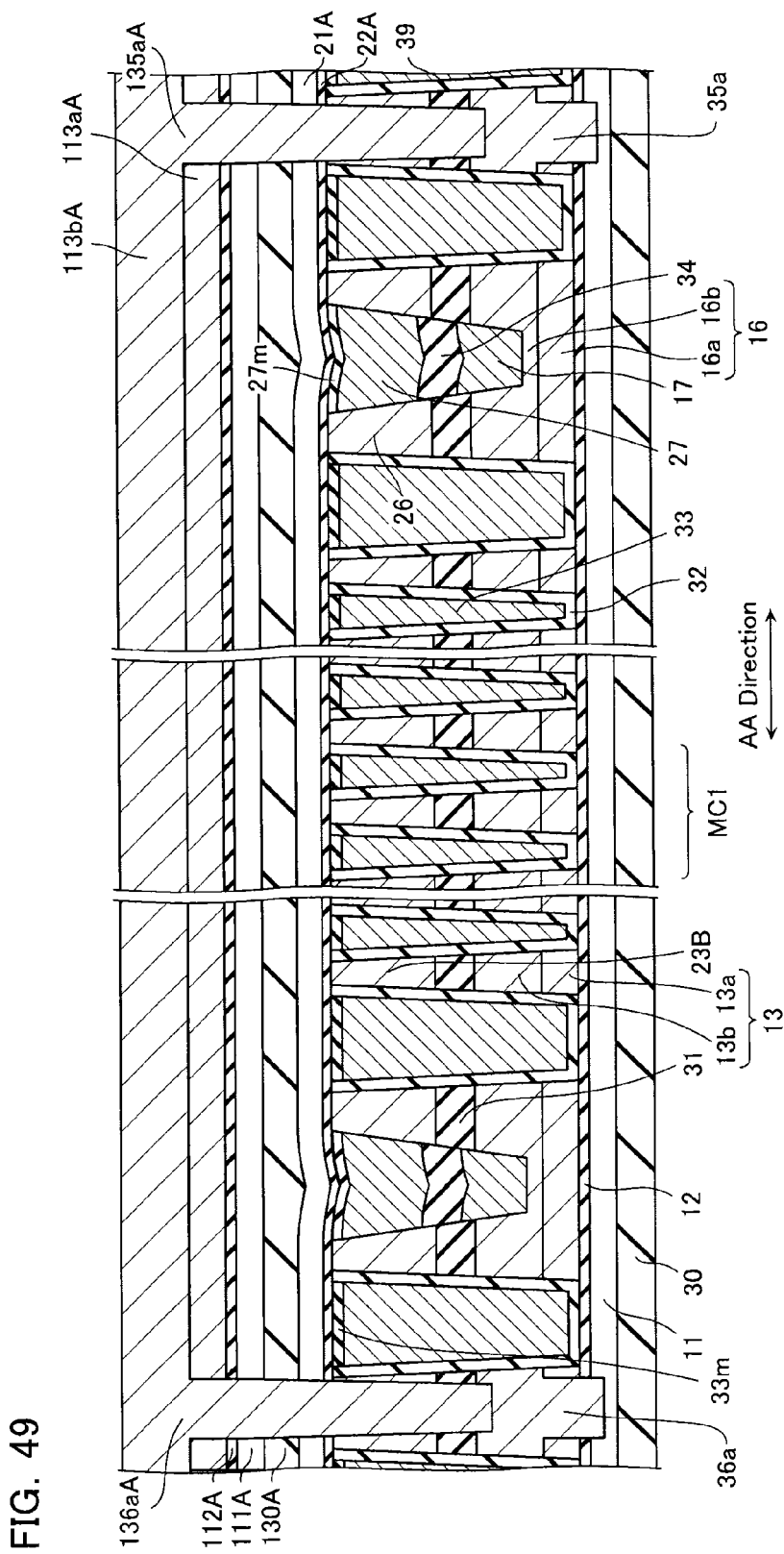
FIG. 49 is a cross-sectional diagram illustrating a step of manufacturing the memory cell array.

Subsequently, as illustrated in FIG. 48, fifth trenches 181 extending in the GC direction are formed through the surfaces of the fourth gate forming layer 113aA, the third gate insulating film 112A, and the third semiconductor layer 111A, and further, a via hole 182 is formed on the bottom surface of the fifth trench 181. At this occasion, the via holes 182 are provided so that the via holes 182 penetrate through the insulating film 130A, the second semiconductor layer 21A, the second gate insulation film 22A, the upper contact layer 37, and first insulating film 31, and the upper surfaces of the lower contacts 35a, 36a are exposed. Subsequently, as illustrated in FIG. 49, a fifth gate forming layer 113bA is formed in a portion of the surface of the fourth floating gate forming layer 113aA and the third semiconductor layer 111A that is exposed by the fifth trench 181 and a portion of the lower contacts 35a, 36a that is exposed by the via hole 182. In the fifth gate forming layer 113bA, a portion filled in the via hole 182 and a portion filled in the fifth trench 181 are denoted as intermediate contacts 135aA, 136aA, respectively.

Figure 50:
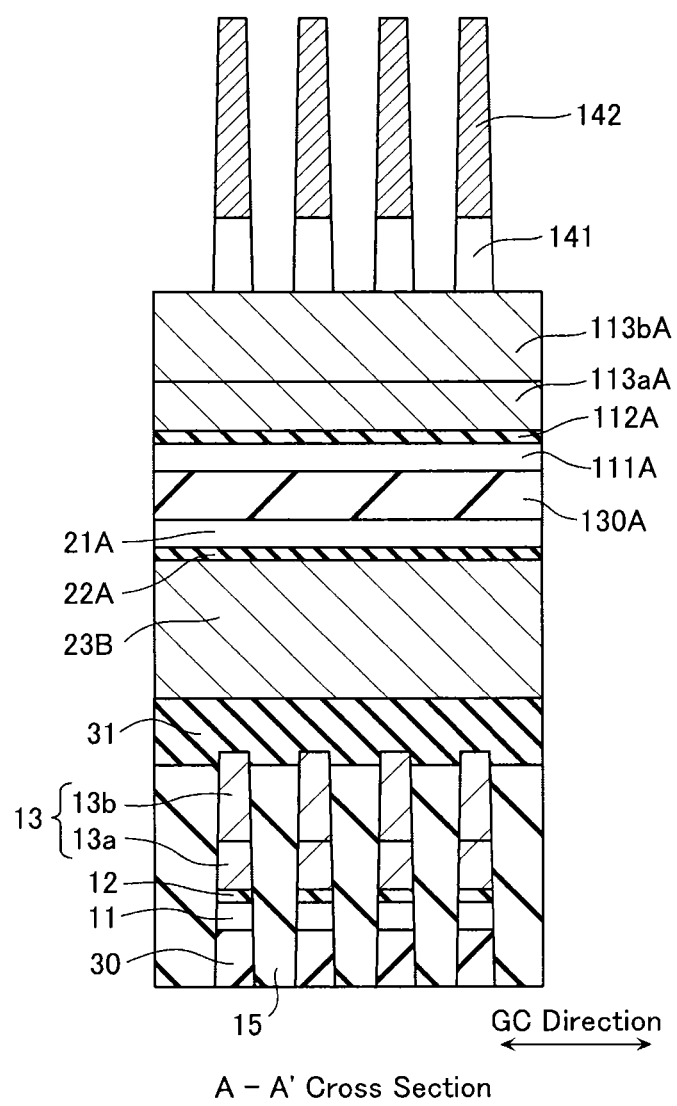
FIG. 50 is a cross-sectional diagram illustrating a step of manufacturing the memory cell array.
Figure 51:
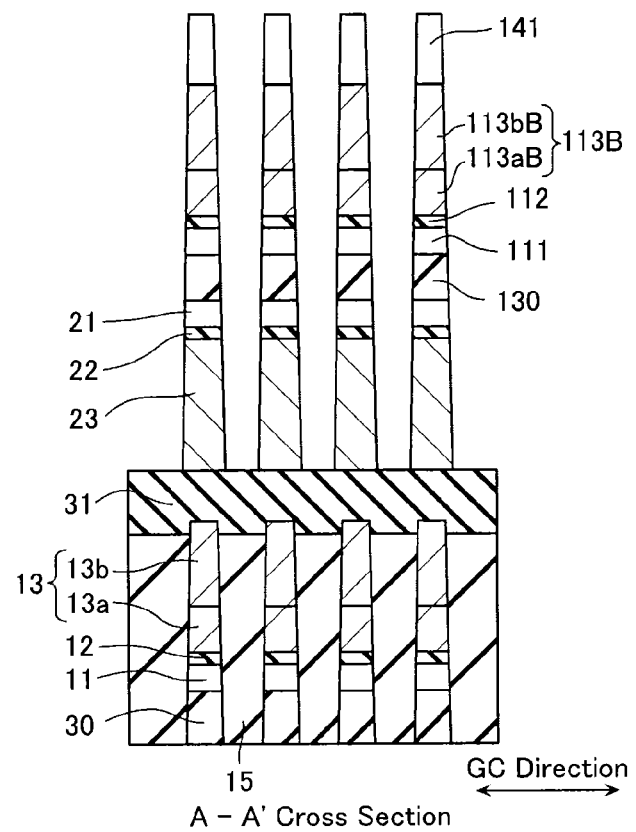
FIG. 51 is a cross-sectional diagram illustrating a step of manufacturing the memory cell array.

After the layers up to the fifth gate forming layer 113bA are formed, mask materials 141, 142 for AA pattern formation made of, e.g., SiN and SiO2 are patterned onto the fifth gate forming layer 113bA, just as shown in FIG. 50. Subsequently, RIE (Reactive Ion Etching) using the mask materials 141 and 142 is carried out to selectively etch the stack of layers to the bottom of the third floating gate forming layer 23B to form sixth trenches, thereby forming the AA pattern as shown in FIG. 51. As a result, the fifth gate forming layer 113B, the third gate insulating film 112, the third semiconductor layer 111, the insulating film 130, the second semiconductor layer 21, the second insulating film 22, the second floating gate 23, and the intermediate contacts 135aB, 136aB are formed.

Figure 52:
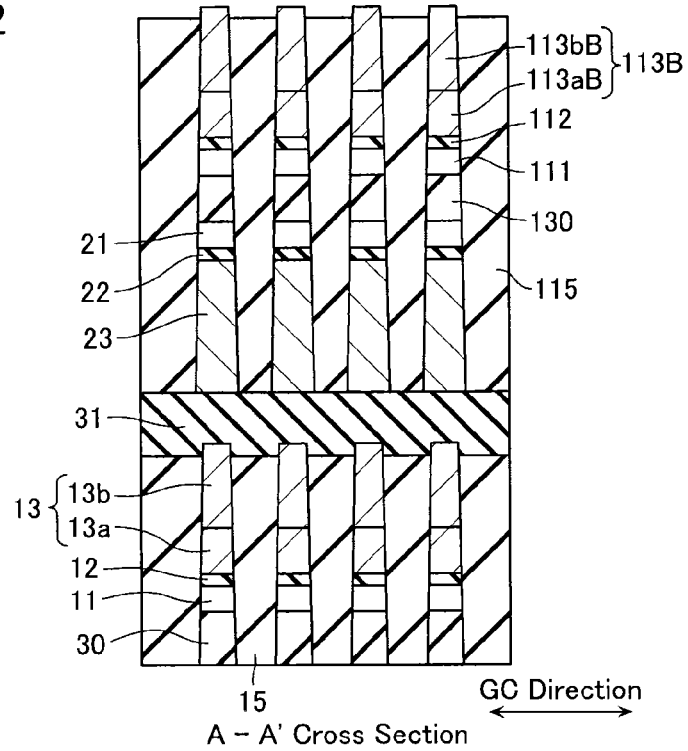
FIG. 52 is a cross-sectional diagram illustrating a step of manufacturing the memory cell array.
Figure 53:
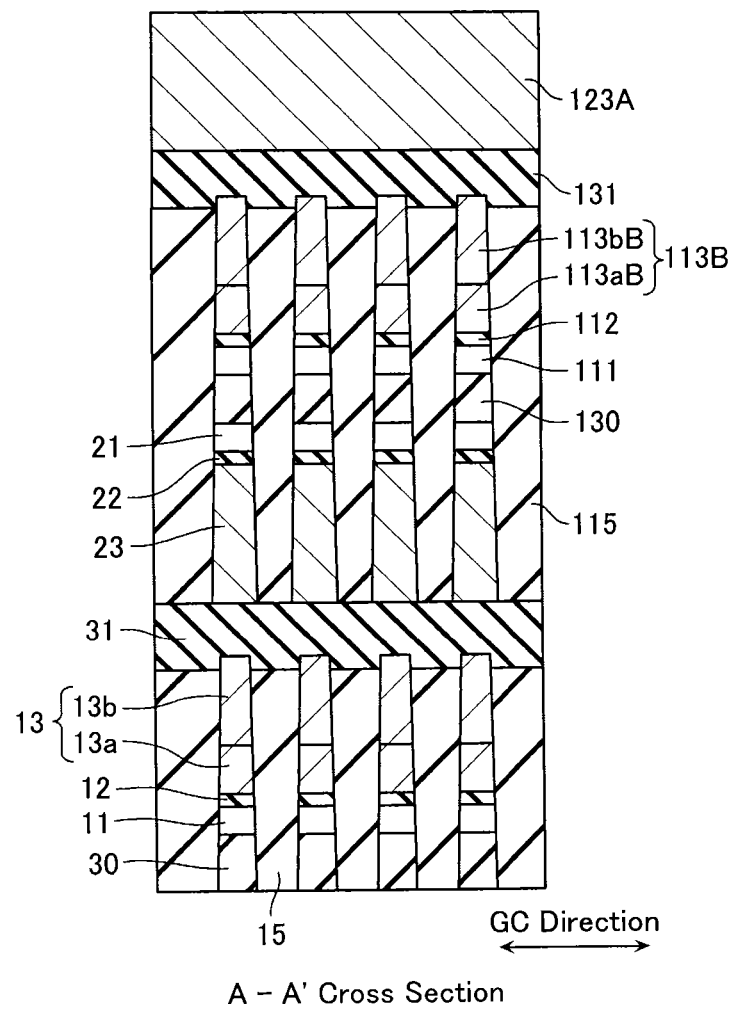
FIG. 53 is a cross-sectional diagram illustrating a step of manufacturing the memory cell array.

Subsequently, as illustrated in FIG. 52, the sixth trenches formed by the AA pattern formation are filled with the third element isolating insulating film 115 made of SiO2, and using the polysilicon forming the fifth gate forming layer 113B as a stopper, planarizing process is performed with CMP (Chemical Mechanical Polishing). Further, the upper surface of the third element isolating insulating film 115 is setback by etch back. Subsequently, as illustrated in FIG. 53, a third insulating film 131 for isolating the upper layer from the lower layer is formed above the third element isolating insulating film 115 and the fifth gate forming layer 113B, and a sixth gate forming layer 123A made of polysilicon is formed above the third insulating film 131.

Figure 54:
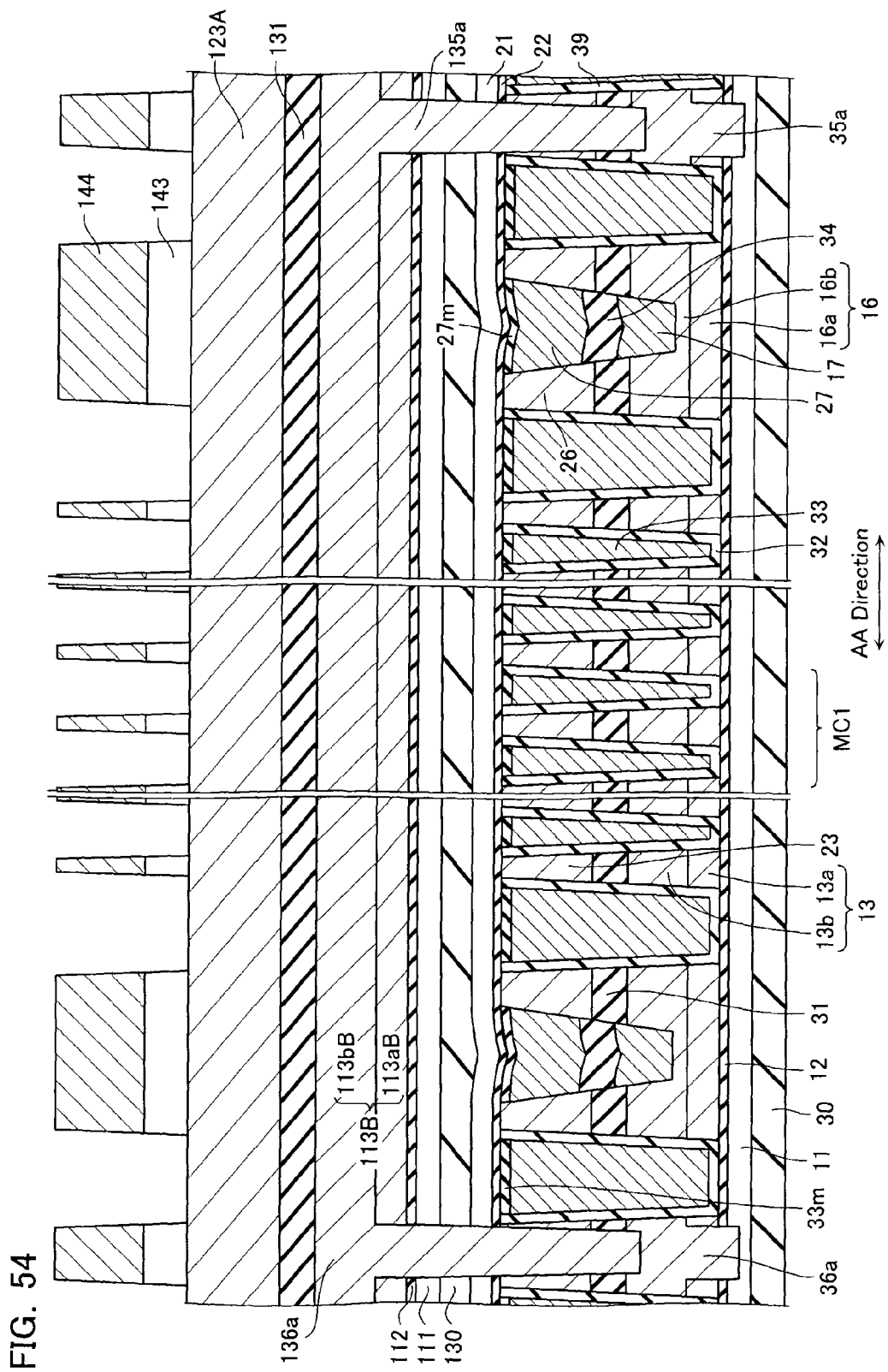
FIG. 54 is a cross-sectional diagram illustrating a step of manufacturing the memory cell array.
Figure 55:
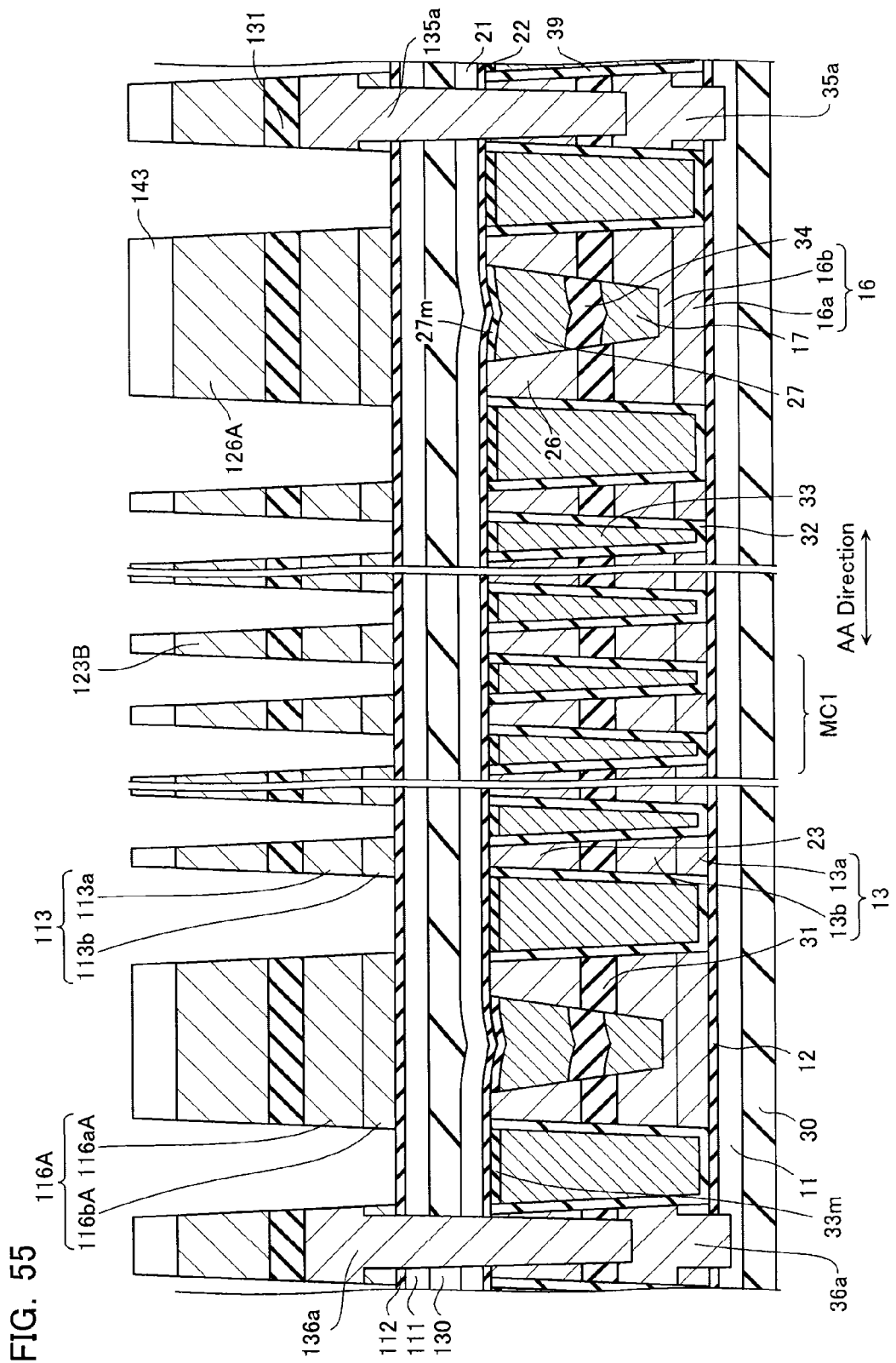
FIG. 55 is a cross-sectional diagram illustrating a step of manufacturing the memory cell array.

Then, as shown in FIG. 54, mask materials 143 and 144 for GC pattern formation made of, e.g., SiN and SiO2 are patterned onto the sixth gate forming layer 123A. Then, as shown in FIG. 55, the stack of layers is selectively etched to the top of the third gate insulating film 112 by RIE using the mask materials 143 and 144, to form the GC pattern. As a result, the third floating gate 113, the sixth gate forming layer 123B, the third select gate forming layer 116A, the fourth select gate forming layer 126A, and the intermediate contact 135a, 136a are formed. It is preferred that this GC pattern formation be carried out by an etching process having a high selectivity toward the third gate insulating film 112 and that the third semiconductor layer 111 be not etched.

Figure 56:
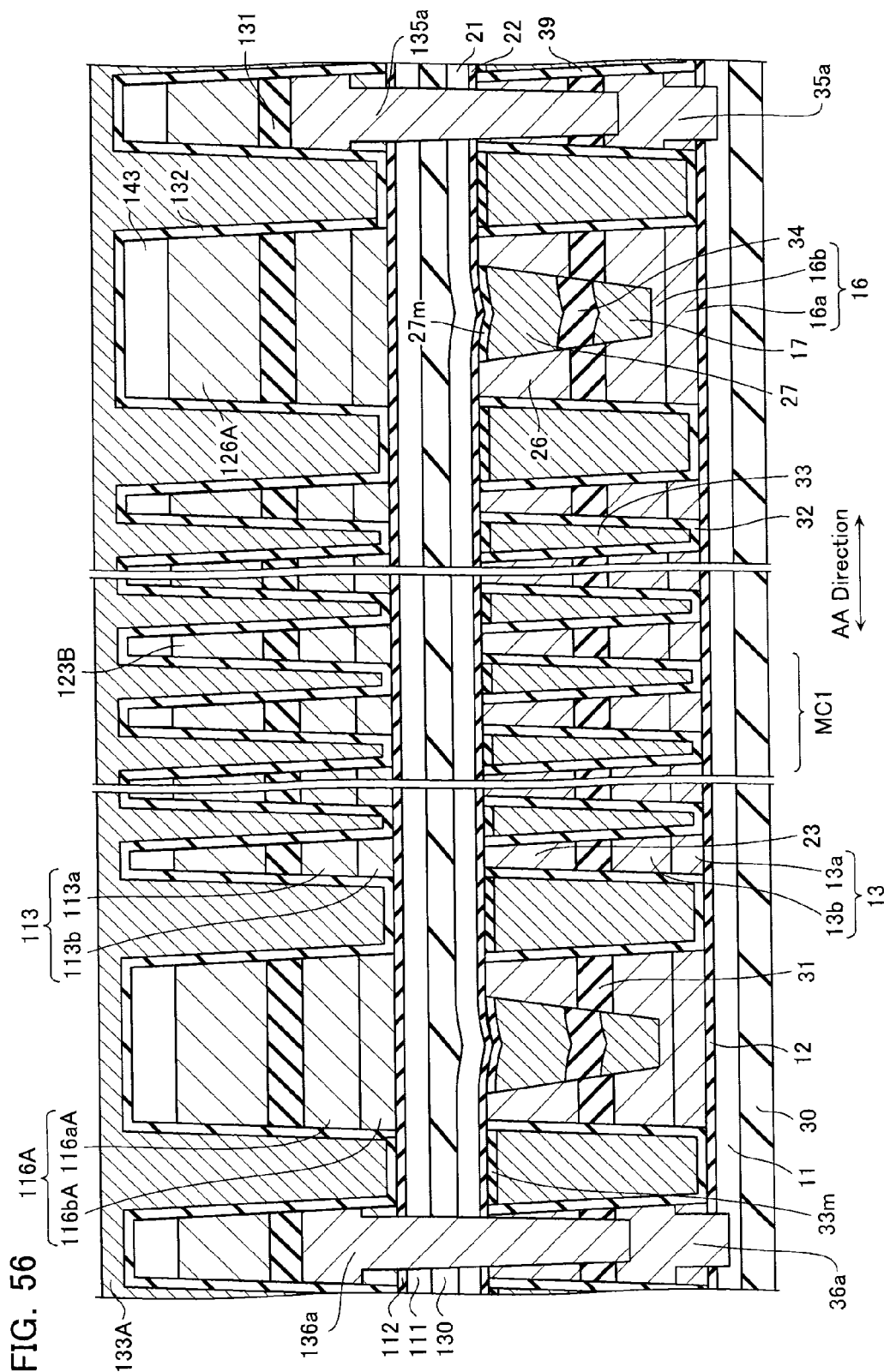
FIG. 56 is a cross-sectional diagram illustrating a step of manufacturing the memory cell array.

Then, as shown in FIG. 56, after an inter-gate insulating film (IPD) 132 made of SiO2 is formed, the trenches of the GC pattern are filled with a control gate forming layer 133A.

The control gate forming layer 133A may be made of polysilicon or metal (W, etc.), metal silicide (WSi, etc.).

Figure 57:
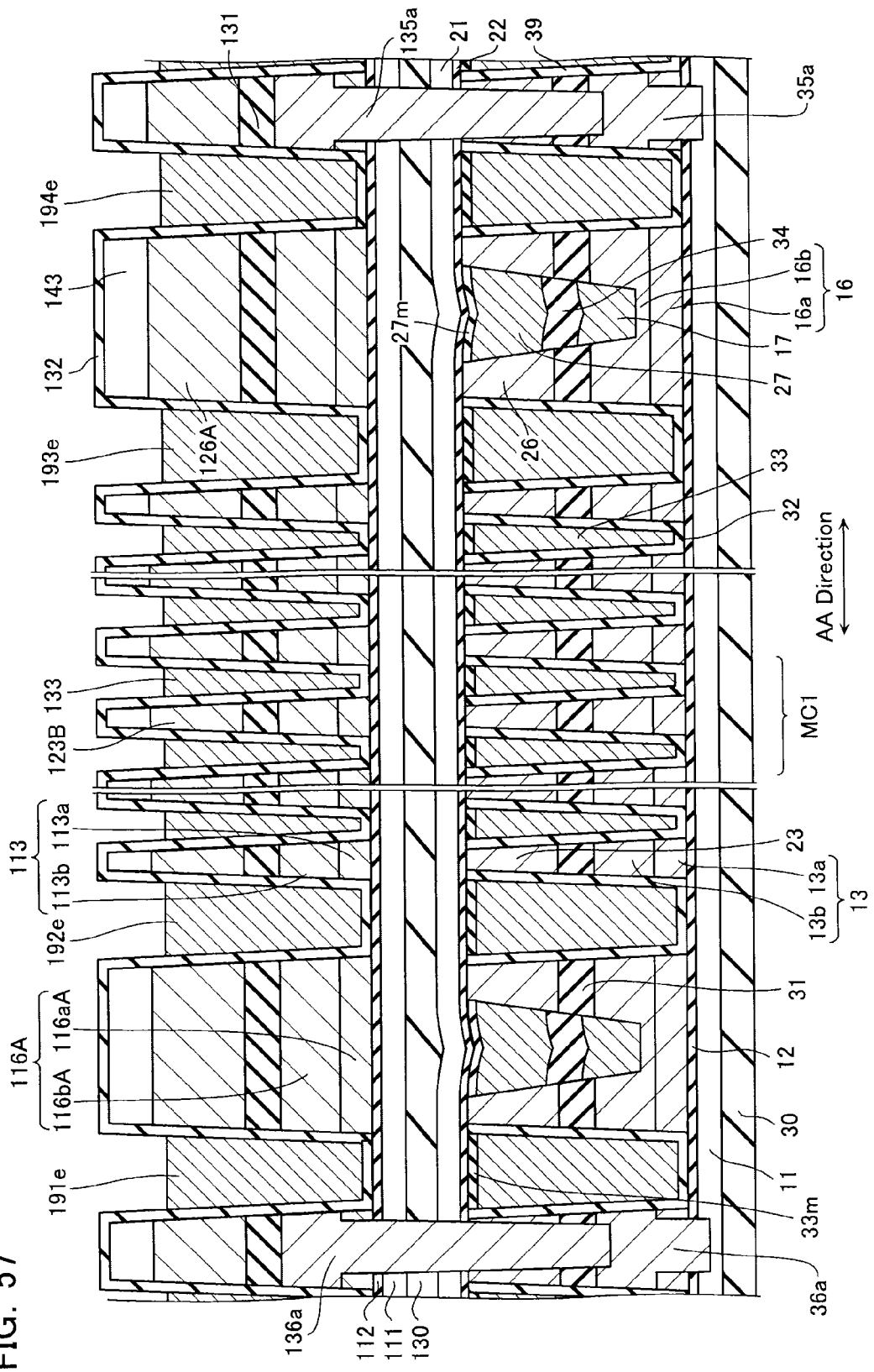
FIG. 57 is a cross-sectional diagram illustrating a step of manufacturing the memory cell array.
Figure 58:
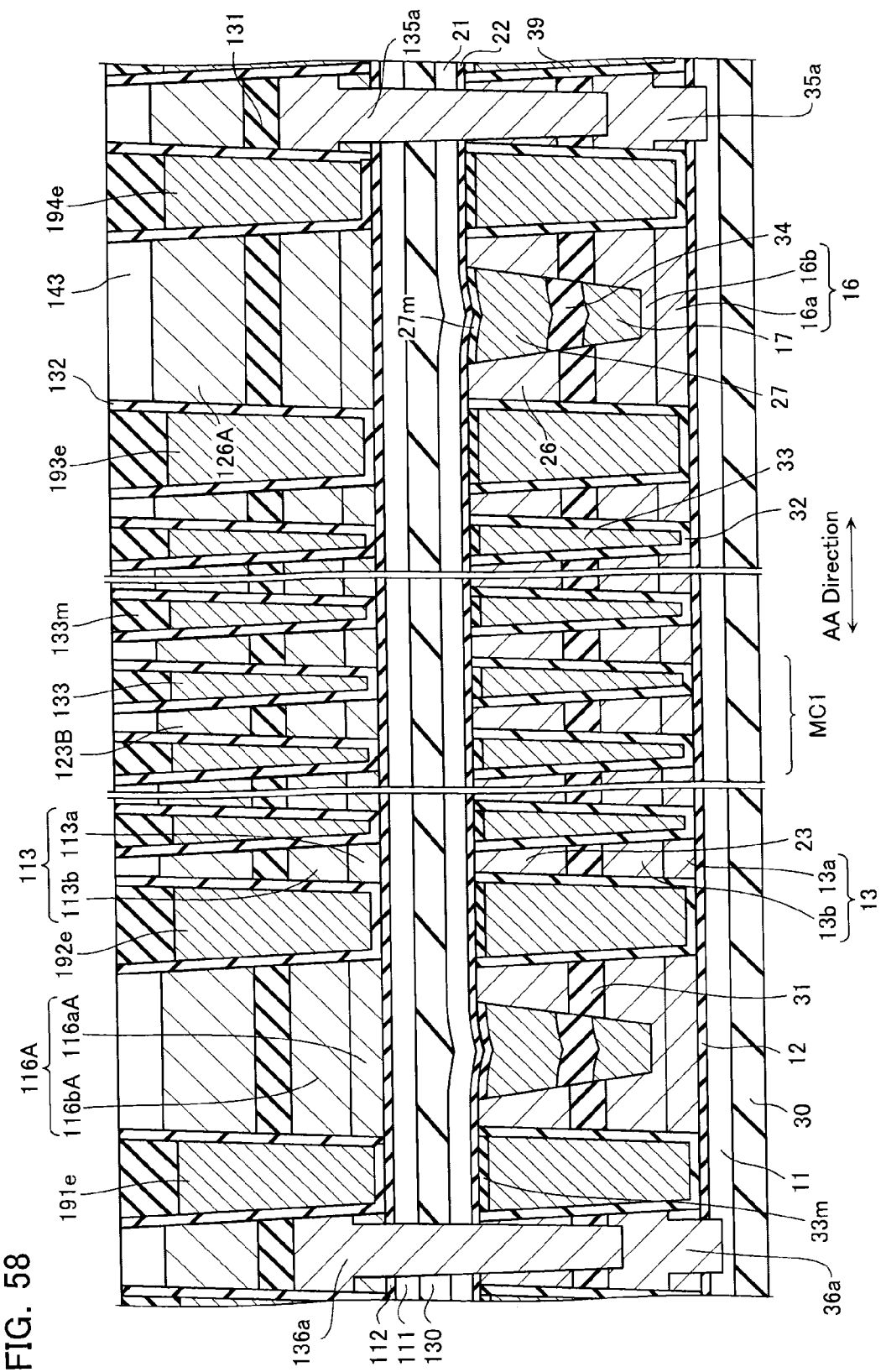
FIG. 58 is a cross-sectional diagram illustrating a step of manufacturing the memory cell array.
Figure 59:
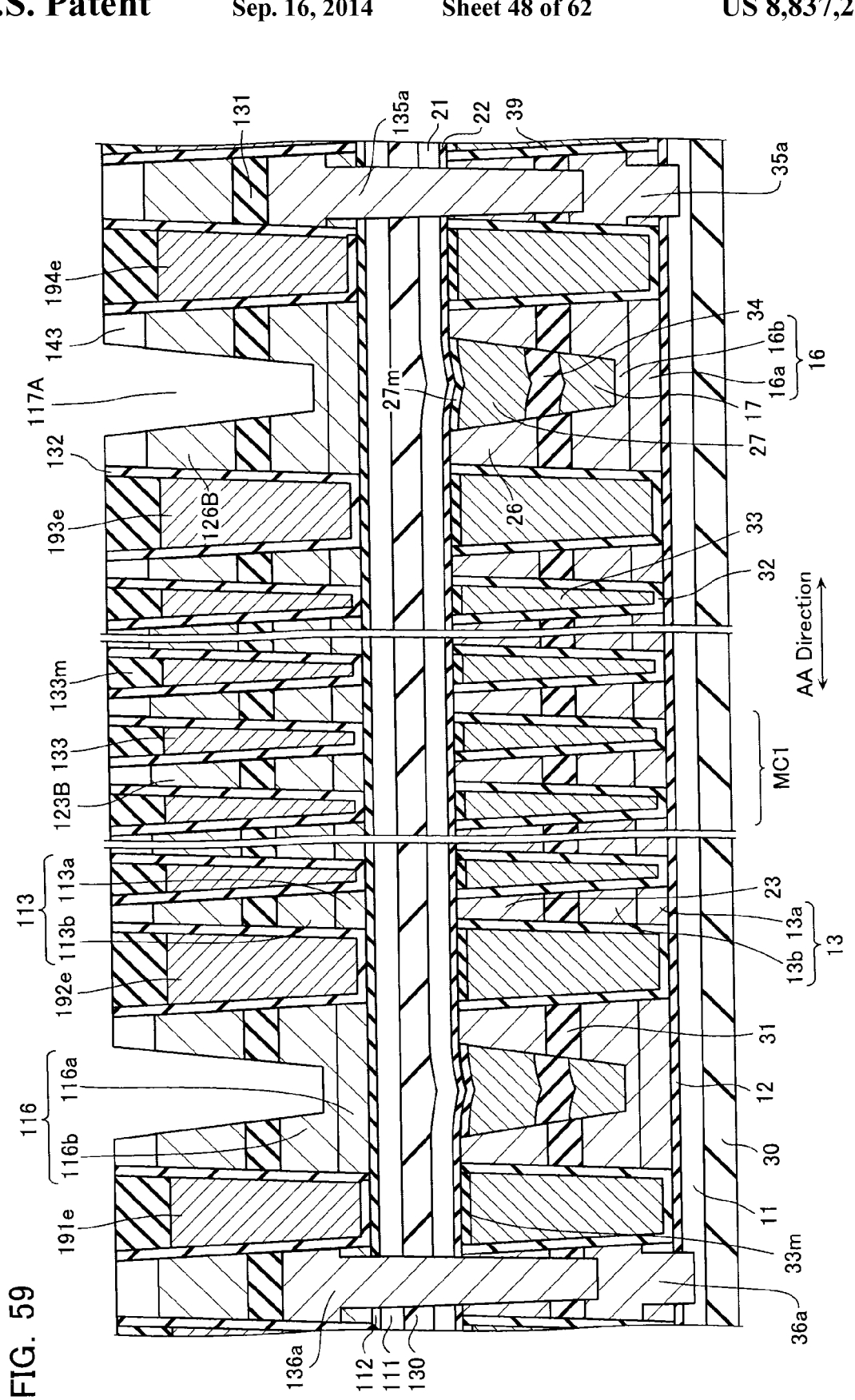
FIG. 59 is a cross-sectional diagram illustrating a step of manufacturing the memory cell array.

Next, as shown in FIG. 57, the control gate forming layer 133A is etched back by RIE to form the control gates 133 and auxiliary gates 191e to 194e. Then, as shown in FIG. 58, a mask material 133m made of a CVD oxide film, a coated oxide film, or the like are filled above the control gates 133, and the uppermost surface is planarized by CMP using the mask 143 made of SiN as a stopper. After this, in order to form the select gate forming layers 116A, 126A, select gate trenches equivalent to EI (Etching Inter Poly) trenches are formed by RIE or the like. As a result, eighth trenches 117A which reach down to the fourth select gate forming layer 126A, the third insulation film 131, and the third select gate forming layer 116A are formed as shown in FIG. 59. With this step, the fourth select gate forming layer 126B and the third select gate 116 are formed.

Figure 60:
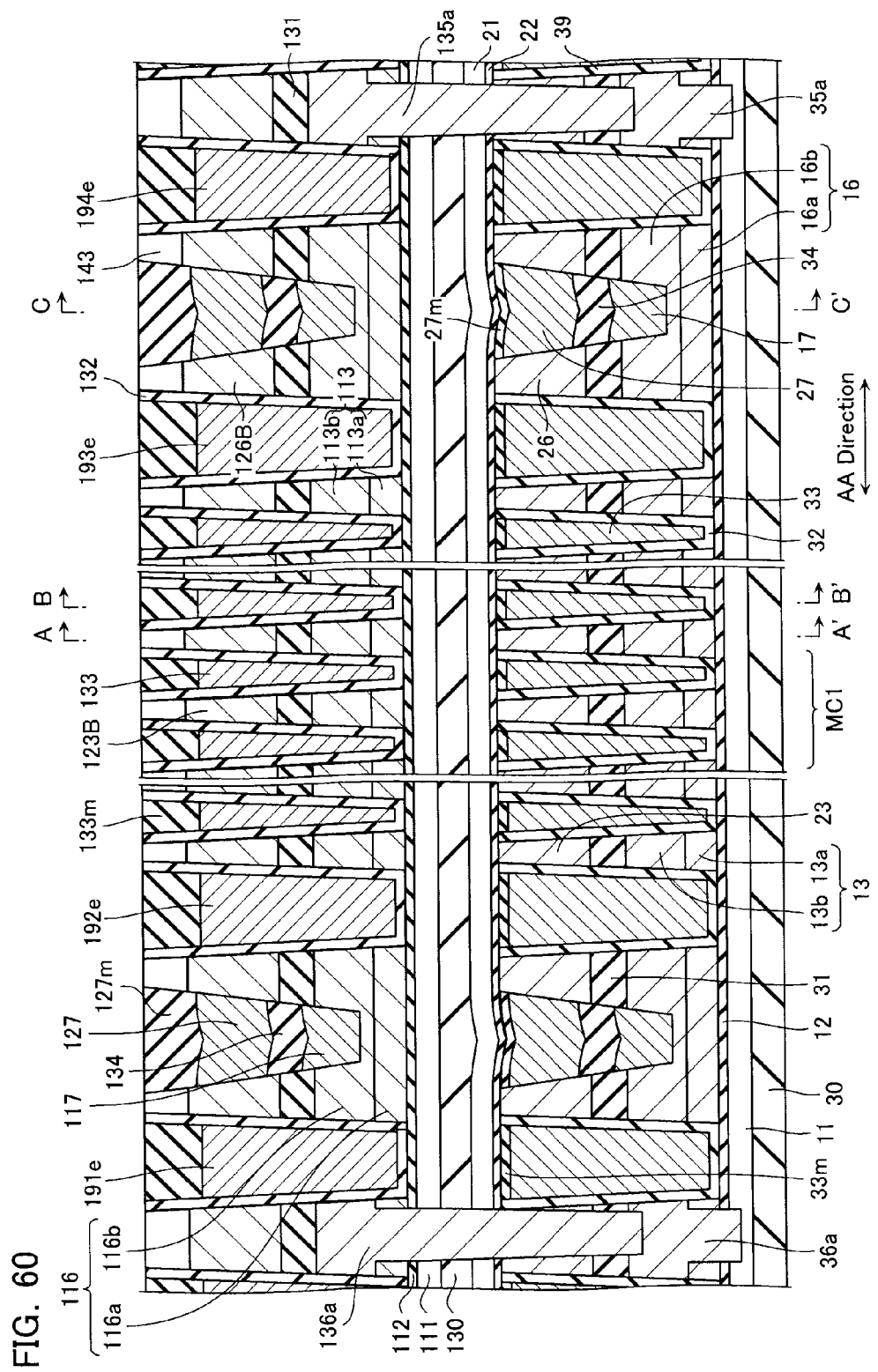
FIG. 60 is a cross-sectional diagram illustrating a step of manufacturing the memory cell array.
Figure 61C:
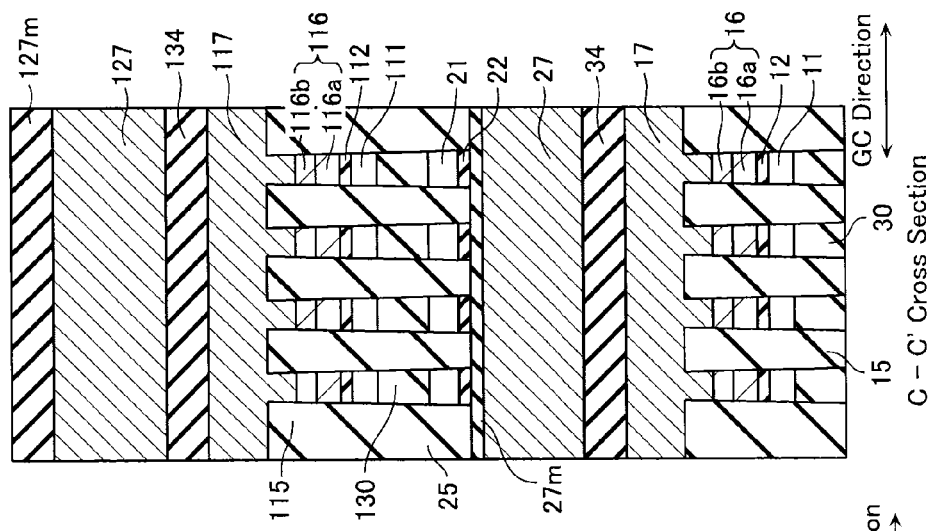
FIGS. 61A to 61C are cross-sectional diagrams illustrating a step of manufacturing the memory cell array.
Figure 61B:
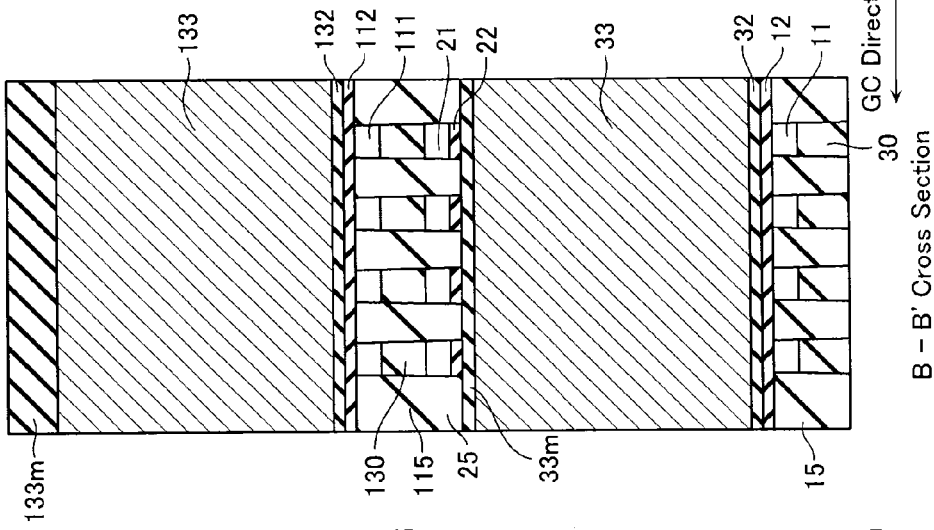
Figure 61A:
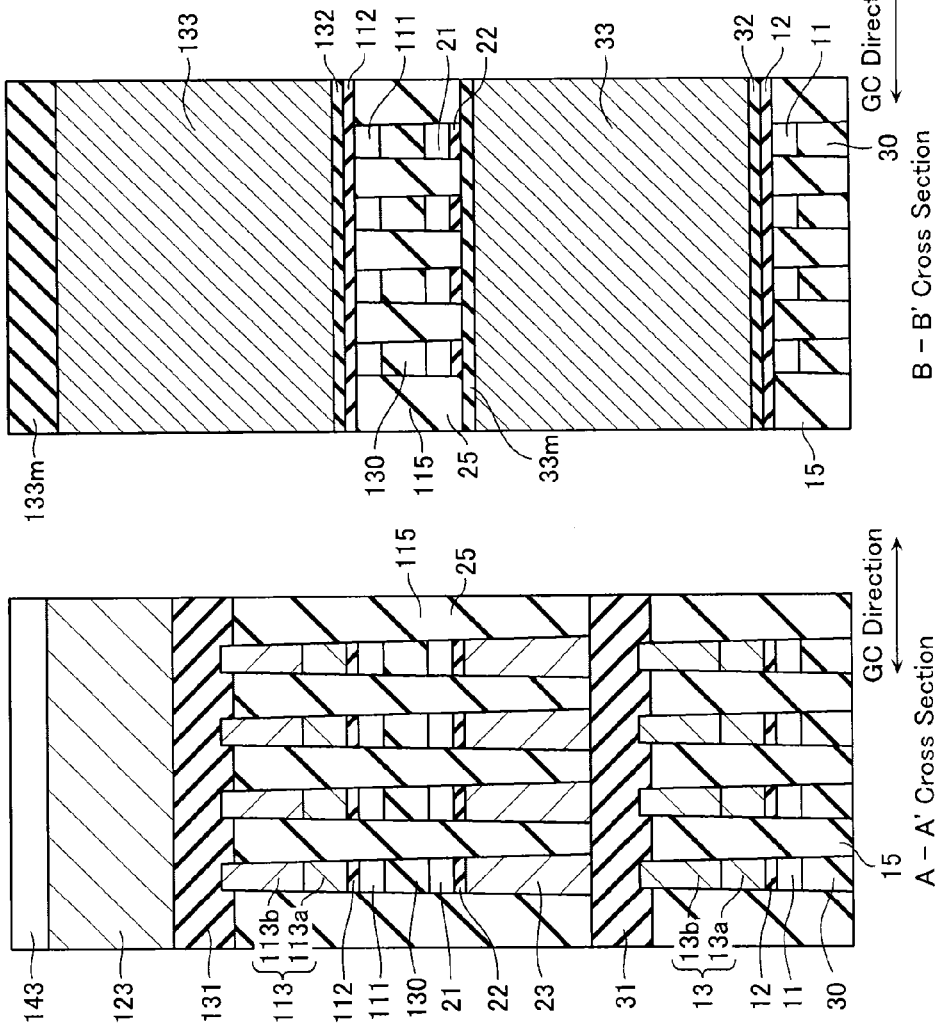

Next, in order to form select gate transistors independently for lower cells and upper cells, a third select gate line 117, an inter layer isolating insulating film 134, and a fourth select gate line 127 are sequentially formed in the eighth trenches 117A by repeating embedding and etch back as illustrated in FIG. 60. Like the control gates 133 and the auxiliary gates 191e to 194e, the select gate lines 117, 127 may be made of polysilicon or metal (W, etc.), metal silicide (WSi, etc.). A cap insulating film 127m is filled in the etched-back portion of the fourth select gate line 127, and the upper surface of the cap insulating film 127m is planarized by CMP using the mask material 143 as a stopper. FIGS. 61A, 61B, 61C are a cross section taken along A-A', a cross section taken along B-B', a cross section taken along C-C' of FIG. 60, respectively.

Figure 62:
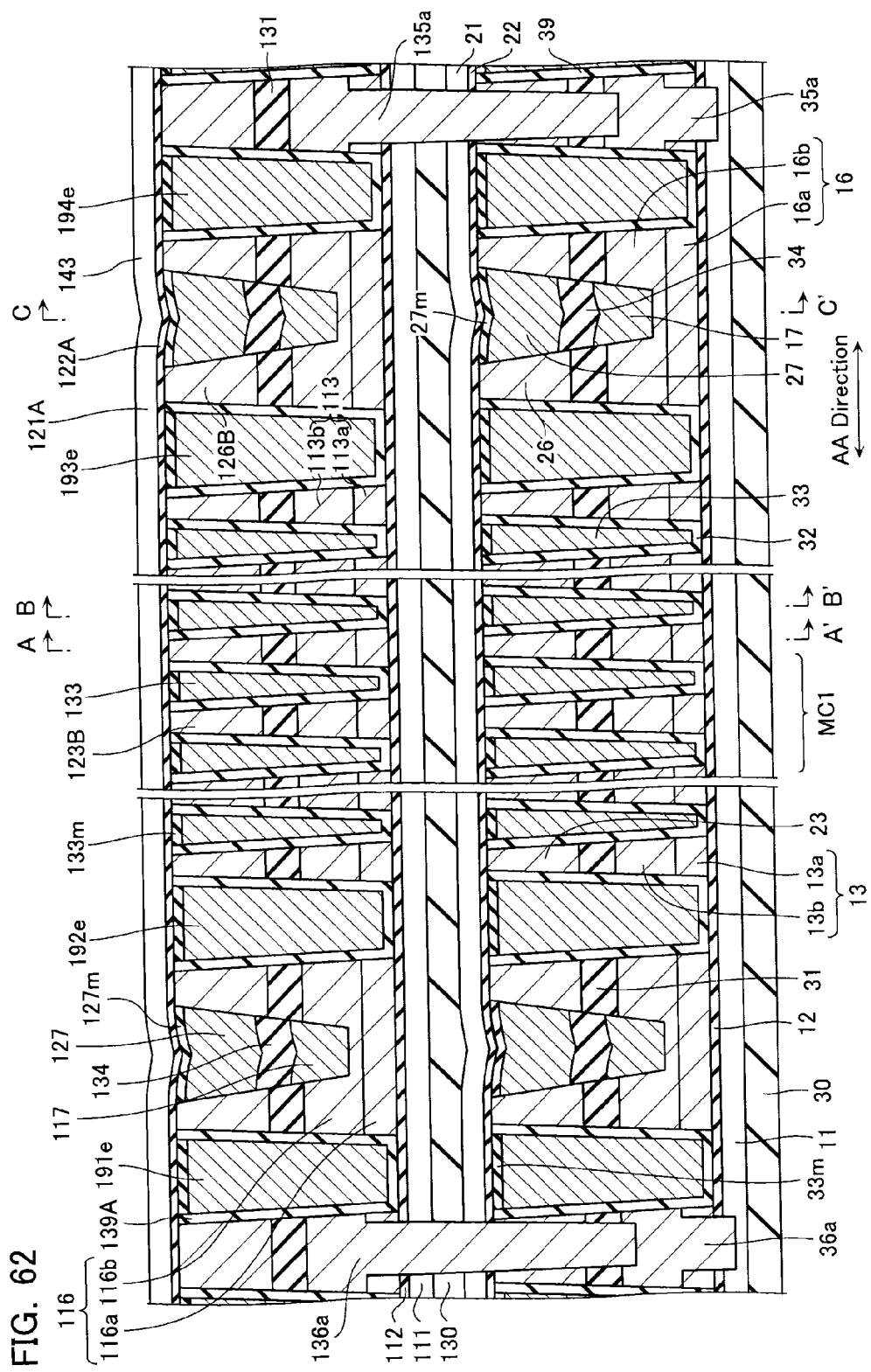
FIG. 62 is a cross-sectional diagram illustrating a step of manufacturing the memory cell array.
Figure 63A:
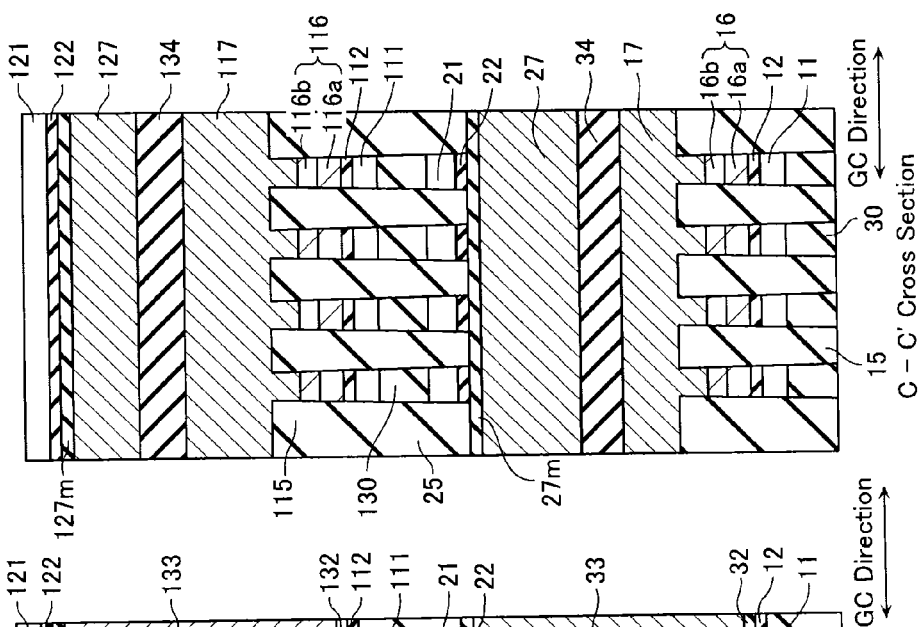
FIGS. 63A to 63C are cross-sectional diagrams illustrating a step of manufacturing the memory cell array.
Figure 63B:
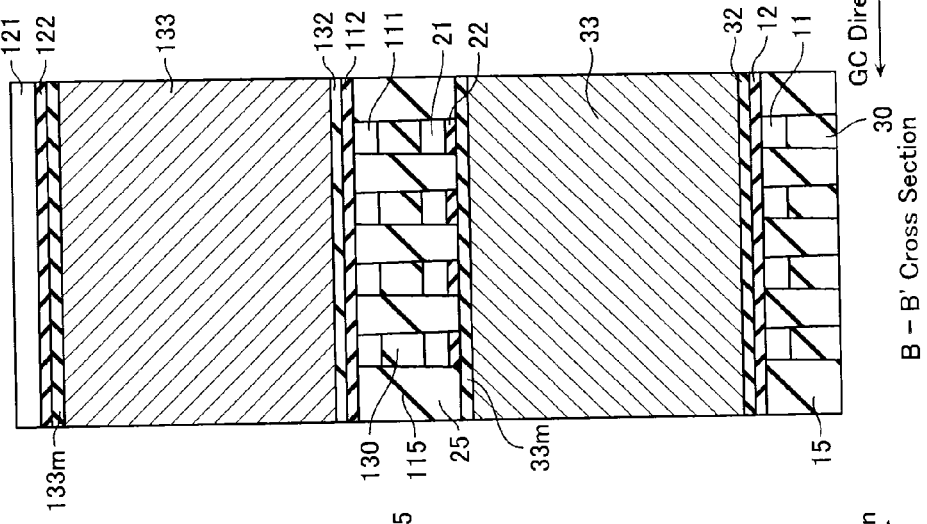
Figure 63C:
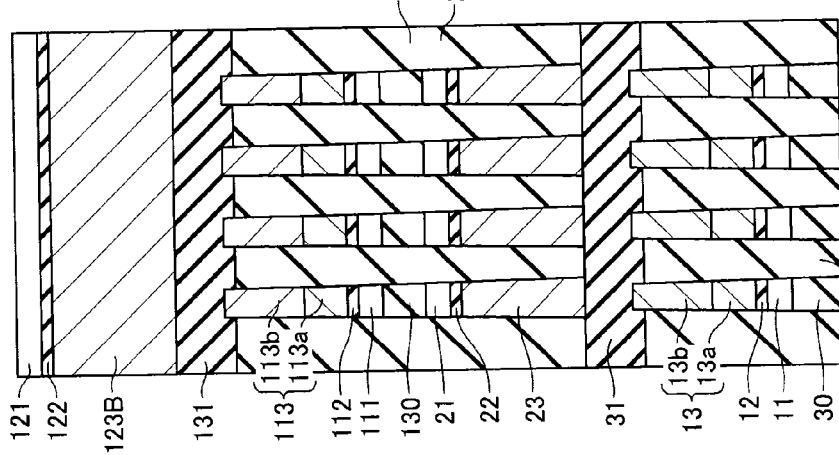

Next, as shown in FIG. 62, planarization is carried out by CMP using the sixth gate forming layer 123B as the stopper, and a fourth gate insulating film 122A made of SiO2 and a fourth semiconductor layer 121A made of polysilicon are sequentially formed on the planarized surface. FIGS. 63A, 63B, 63C are a cross section taken along A-A', a cross section taken along B-B', a cross section taken along C-C' of FIG. 62, respectively.

Figure 64:
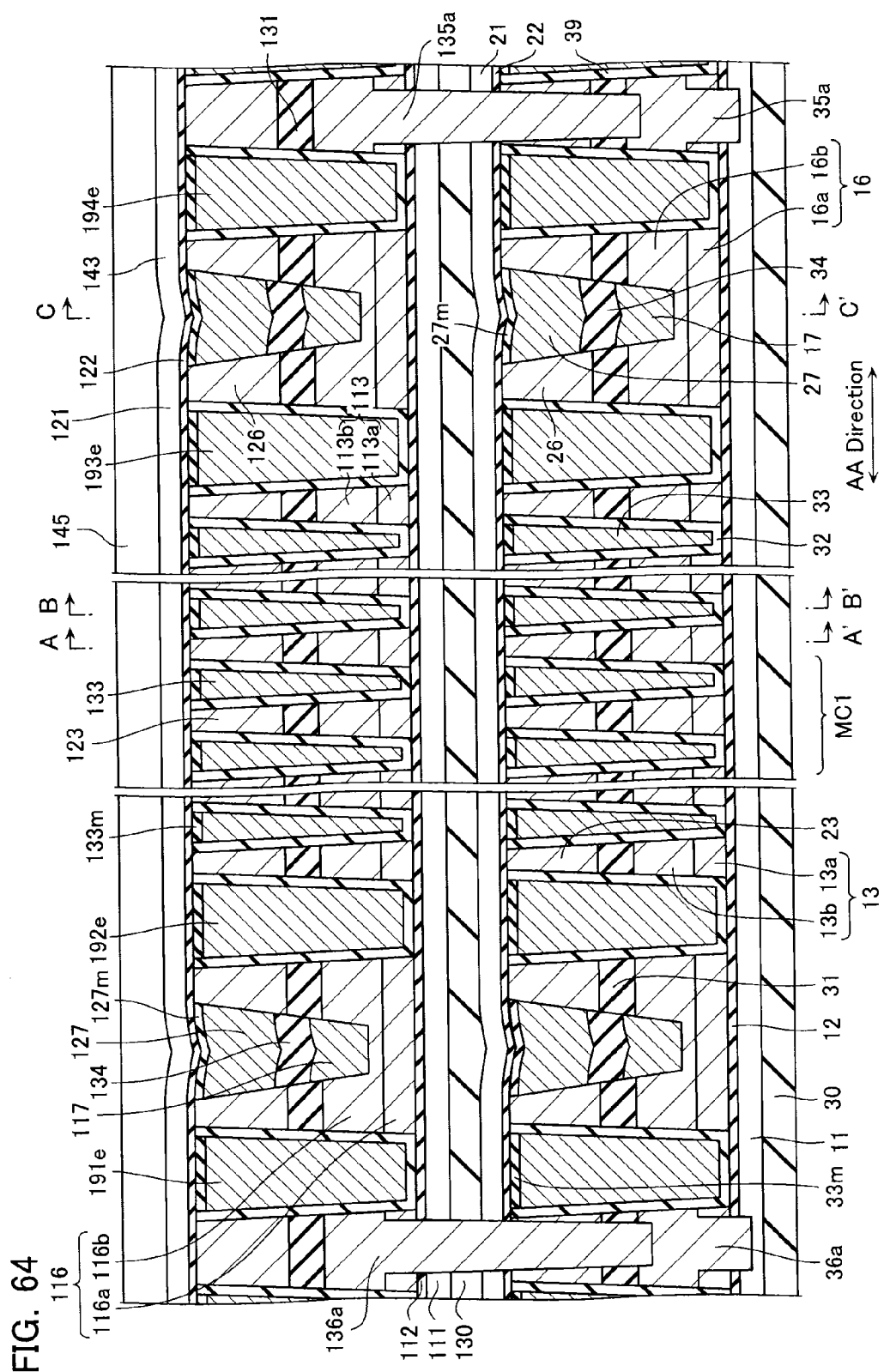
FIG. 64 is a cross-sectional diagram illustrating a step of manufacturing the memory cell array.
Figure 65:
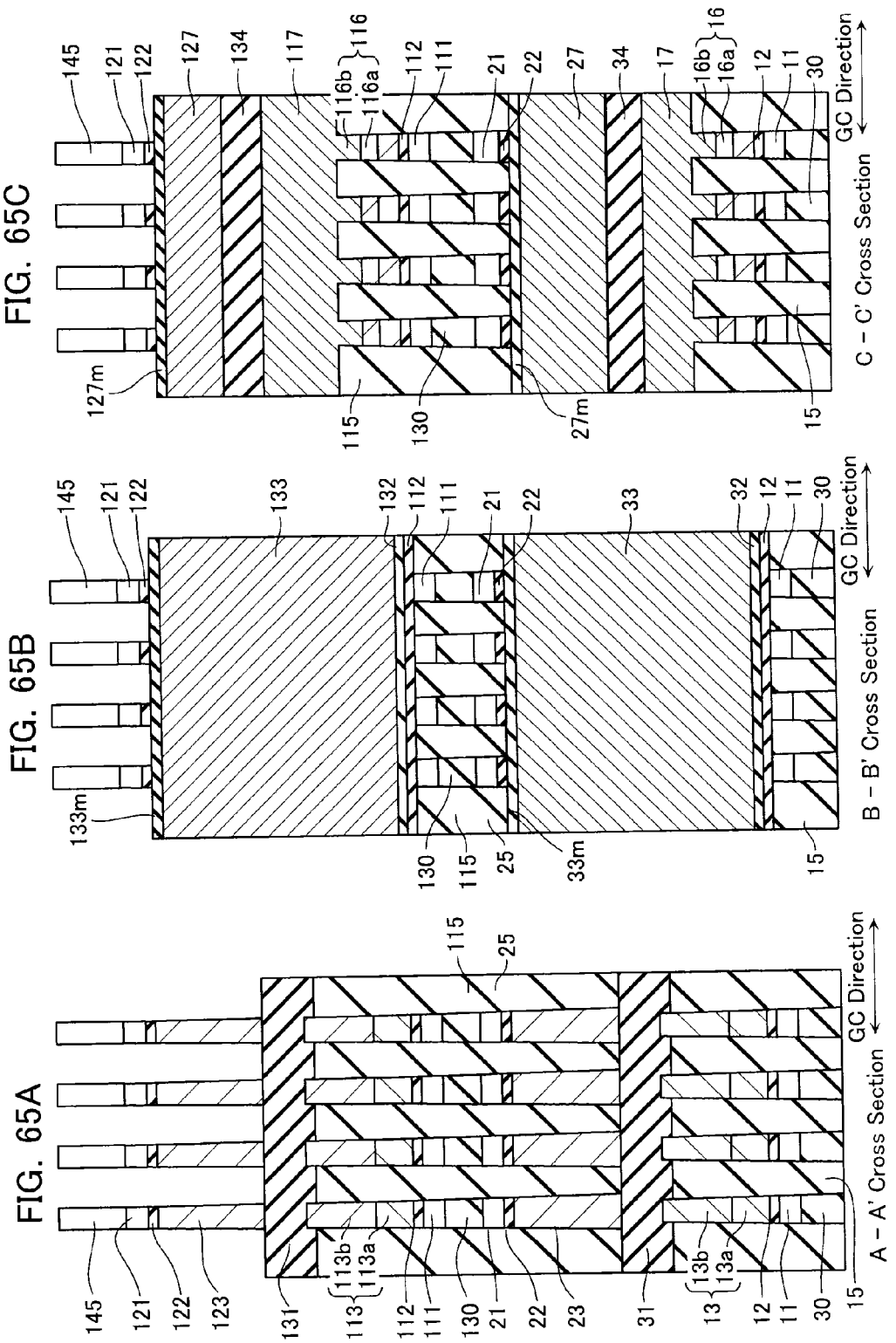
FIGS. 65A to 65C are cross-sectional diagrams illustrating a step of manufacturing the memory cell array.

Subsequently, as illustrated in FIG. 64, in order to form AA pattern into the fourth semiconductor layer 121A, the fourth gate insulating film 122A, the sixth gate forming layer 123B, and the fourth select gate forming layer 126B of the upper layer, a mask material 145 made of SiN for AA pattern formation is patterned onto the fourth semiconductor layer 121A, and RIE is carried out to form the AA pattern. FIGS. 65A, 65B, 65C are a cross section taken along A-A', a cross section taken along B-B', a cross section taken along C-C' of FIG. 64, respectively. Through the above steps, the fourth floating gate 123 is formed, and at the same time, the first gate insulating film 122 and the fourth semiconductor layer 121 are formed self-aligned with the fourth floating gate 123. Then, a fourth element isolating insulating film 125 (FIGS. 46A to 46C) is filled in the trenches of the upper layer AA pattern.

Figure 66:
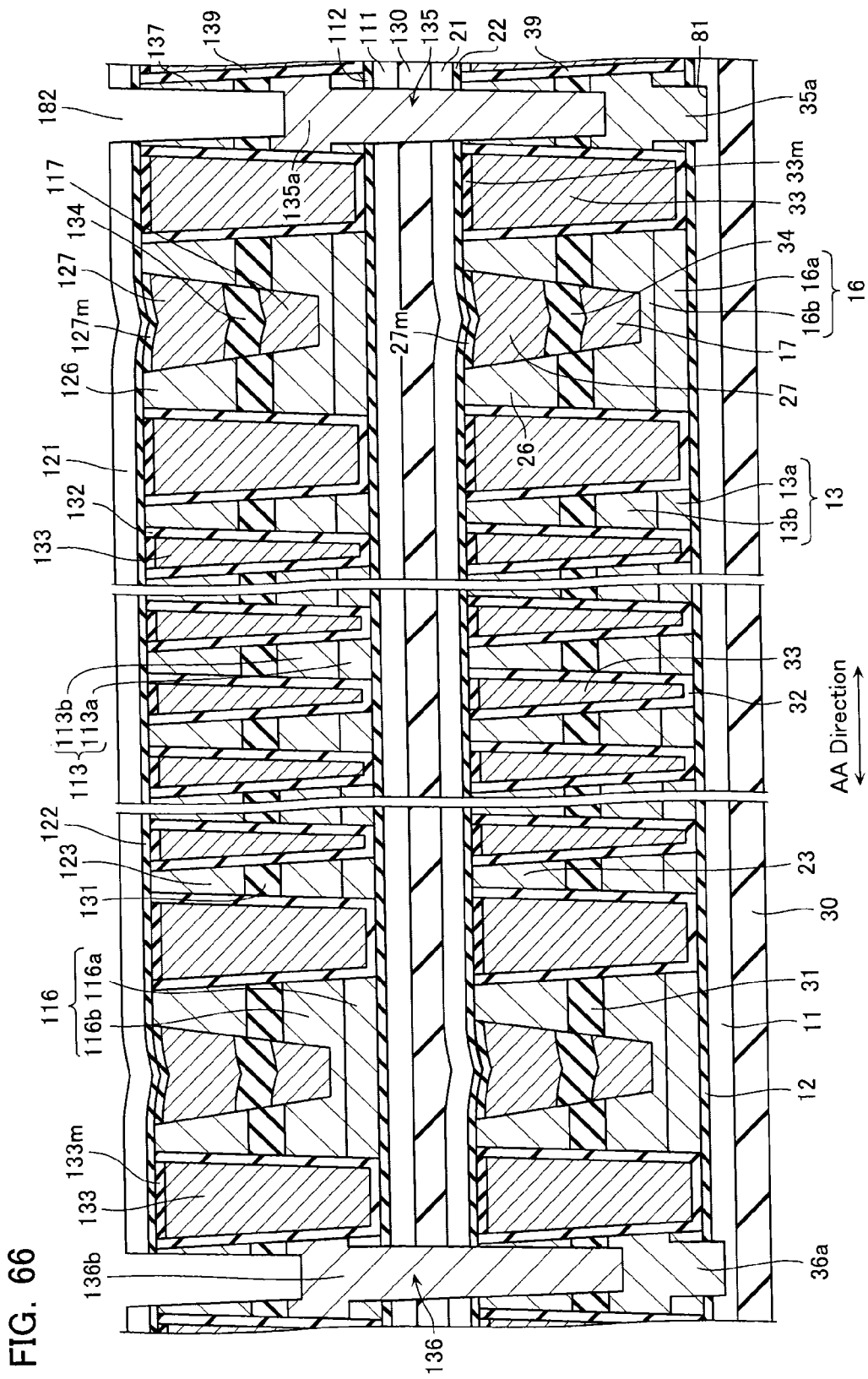
FIG. 66 is a cross-sectional diagram illustrating a step of manufacturing the memory cell array.
Figure 67:
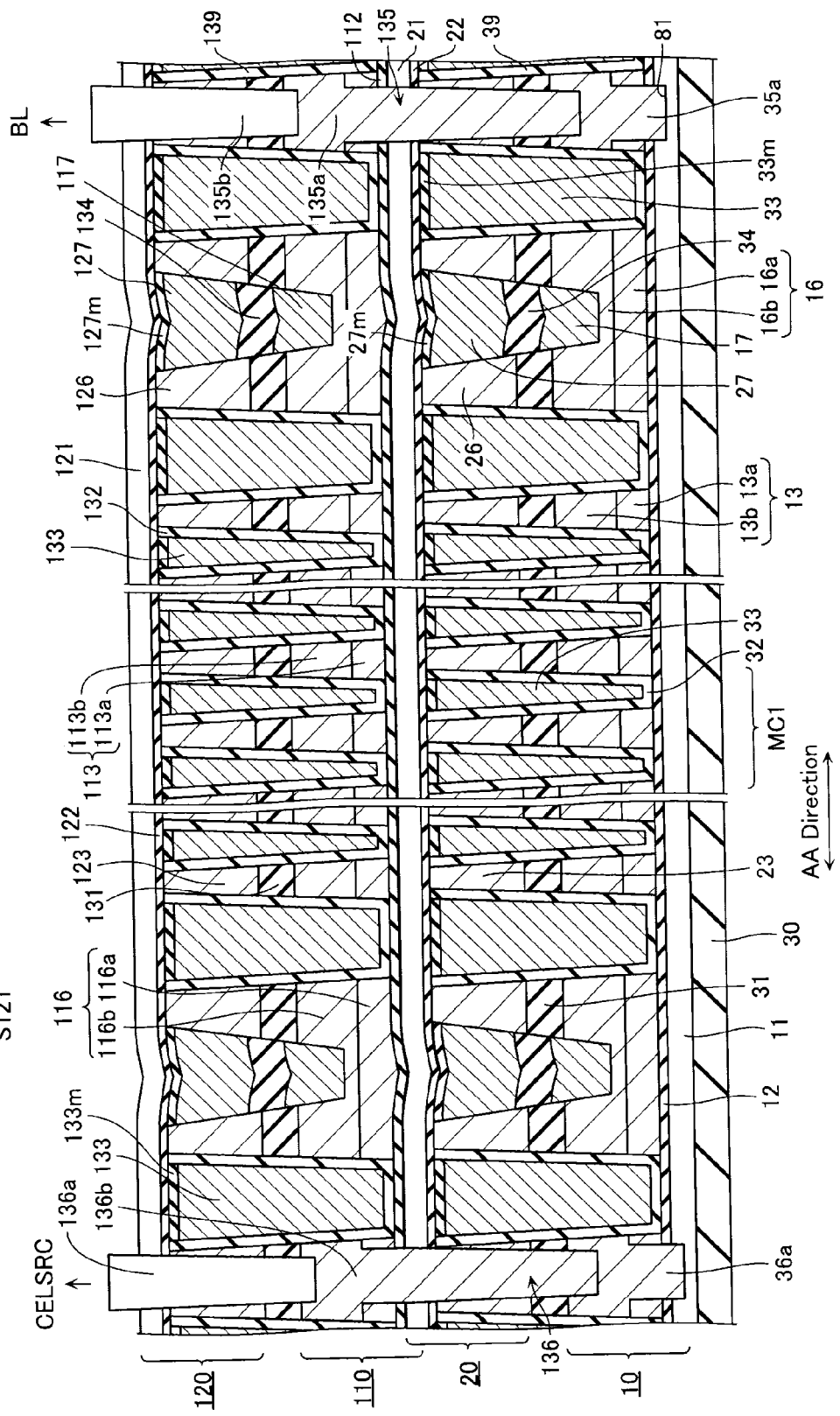
FIG. 67 is a cross-sectional diagram illustrating a structure, taken in a GC direction, of a memory cell array of a nonvolatile semiconductor memory device according to a fourth embodiment.
Figure 68C:
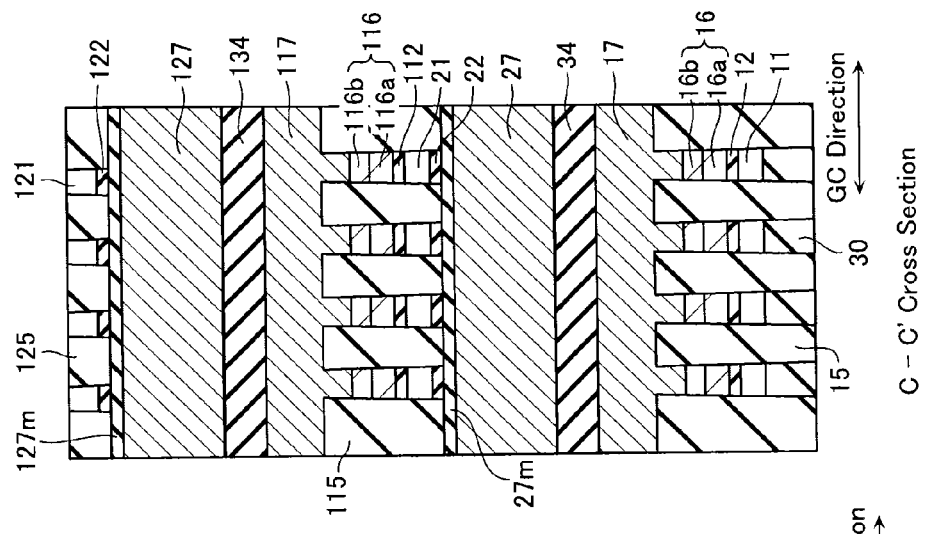
FIGS. 68A to 68C are cross-sectional diagrams taken along A-A', B-B', and C-C' of FIG. 67.
Figure 68B:
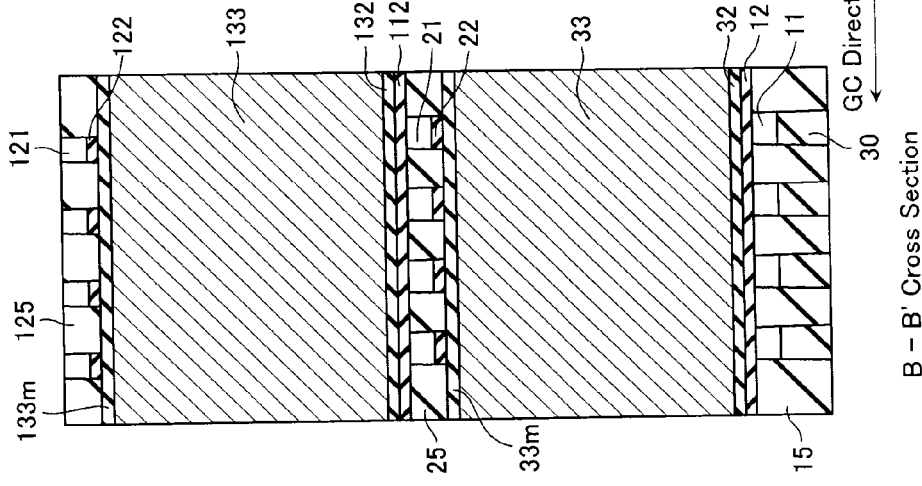
Figure 68A:
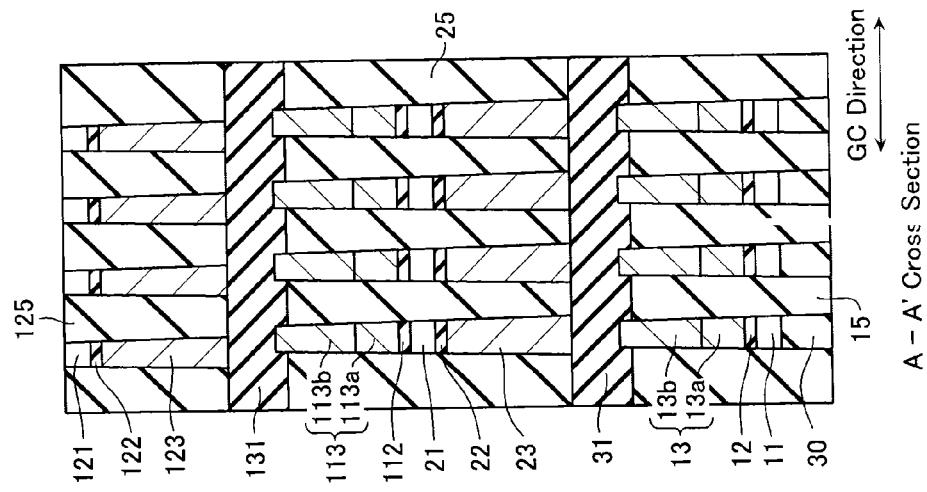

Finally, as illustrated in FIG. 66, via holes 182 are formed in the fourth semiconductor layer 121, the fourth gate insulating film 122, the upper contact layer 137, the third insulating film 131, and the intermediate contacts 135a, 136a, and the upper contacts 135b, 136b are filled in the via holes 182 thus formed. At the formation of the via contacts, the via holes 182 are provided so that the via holes 182 penetrate through the third insulating film 131 and the upper surfaces of the intermediate contacts 135a, 136a are exposed.

When a plurality of layers of memory cell arrays are stacked, the method for providing the via holes simply penetrating through the layers all at once makes it still more difficult to have the accuracy of alignment and the formation of the via contacts. In the present embodiment, the via contacts are formed in each layer, and therefore, the memory cell arrays can be easily manufactured. In the memory cell array manufactured according to the above method, the upper contact 35b and 36b of the second cell array layer 20, which are called in the first embodiment, are formed as the lower portion of the intermediate contacts 135a and 136a, and the lower contacts 35a and 36a of the third cell array layer 110, which are called in the first embodiment, are formed as the upper portion of the intermediate contacts 135a and 136a. Therefore, as compared with the method for simply forming the via contacts successively for each of all the layers, manufacturing can be achieved with a less number of steps.

When a plurality of layers of memory cell arrays are further formed, the structure as illustrated in FIGS. 62 and 63A to 63C may be manufactured, and further, the step explained using FIG. 47 to the steps explained using FIGS. 62 and 63A to 63C may be repeatedly performed 4. Fourth Embodiment 4-1. Memory Cell Array Structure According to the Fourth Embodiment Subsequently, the memory cell array structure according to the fourth embodiment will be explained. The third embodiment has such a structure that a plurality of layers of memory cell arrays according to the first embodiment are stacked via the insulating film, but as illustrated in FIGS. 67, 68A to 68C, the following configuration may also be possible: the insulating film is not used, and the third semiconductor layer 21 is shared with the third cell array layer 110, so that it may also be used as the third semiconductor layer. It is to be understood that three or more layers of memory cell arrays according to the present embodiment can also be stacked.

4-2. Method for Manufacturing Memory Cell Array Structure According to the Fourth Embodiment Subsequently, a method for manufacturing the memory cell array structure according to the present embodiment will be explained.

Figure 69:
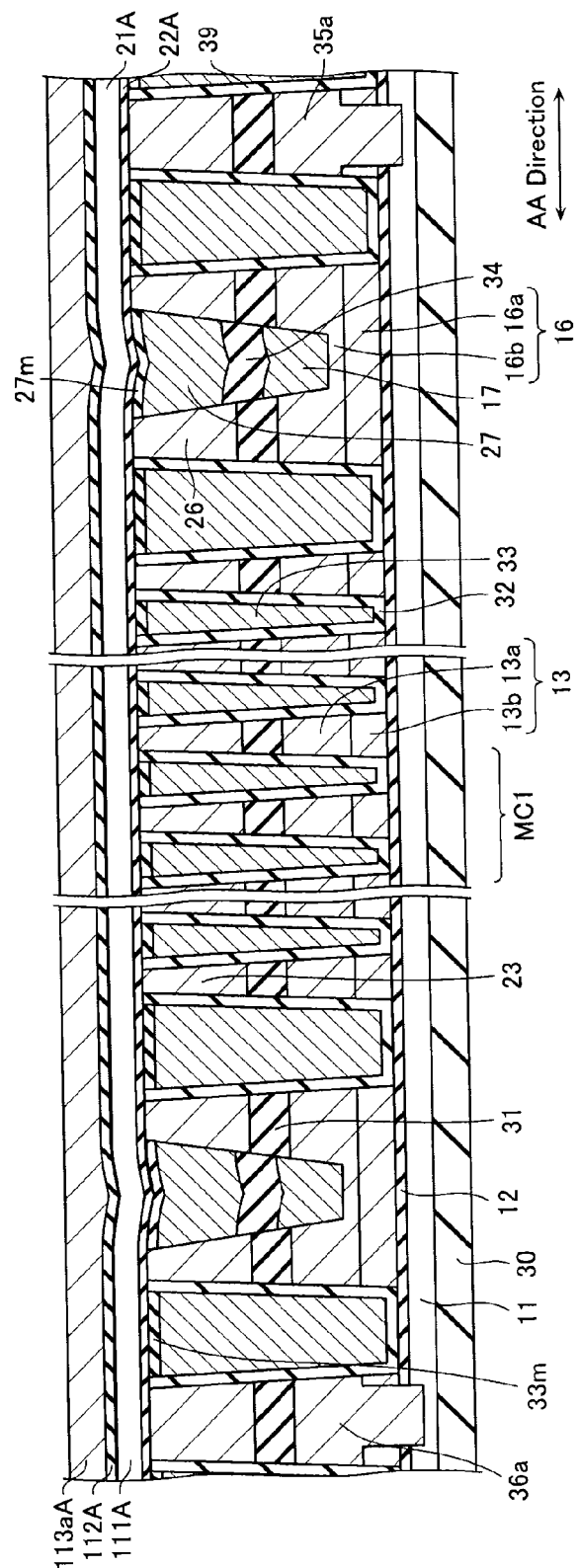
FIG. 69 is a cross-sectional diagram illustrating a step of manufacturing the memory cell array.

The method for manufacturing the memory cell array according to the present embodiment is the same as the first embodiment up to the steps as illustrated in FIGS. 39 and 40A to 40C. After the structure as shown in FIGS. 39 and 40A to 40C is manufactured, a third gate insulating film 112A made of SiO2 and a fourth gate forming layer 113aA made of polysilicon are stacked sequentially on the second semiconductor layer 21A as illustrated in FIG. 69. The formation of the gate insulating film 112A is carried out by using not a thermally-oxidized film, but a CVD (Chemical Vapor Deposition) or an ALD (Atomic Layer Deposition) oxide film, just like the first and third embodiments.

In the present embodiment, a bit line contact 135 includes a lower contact 35a, an intermediate contact 135a, and an upper contact 135b, like the third embodiment. A source contact 136 includes a lower contact 36a, an intermediate contact 136a, and an upper contact 136b.

Figure 70:
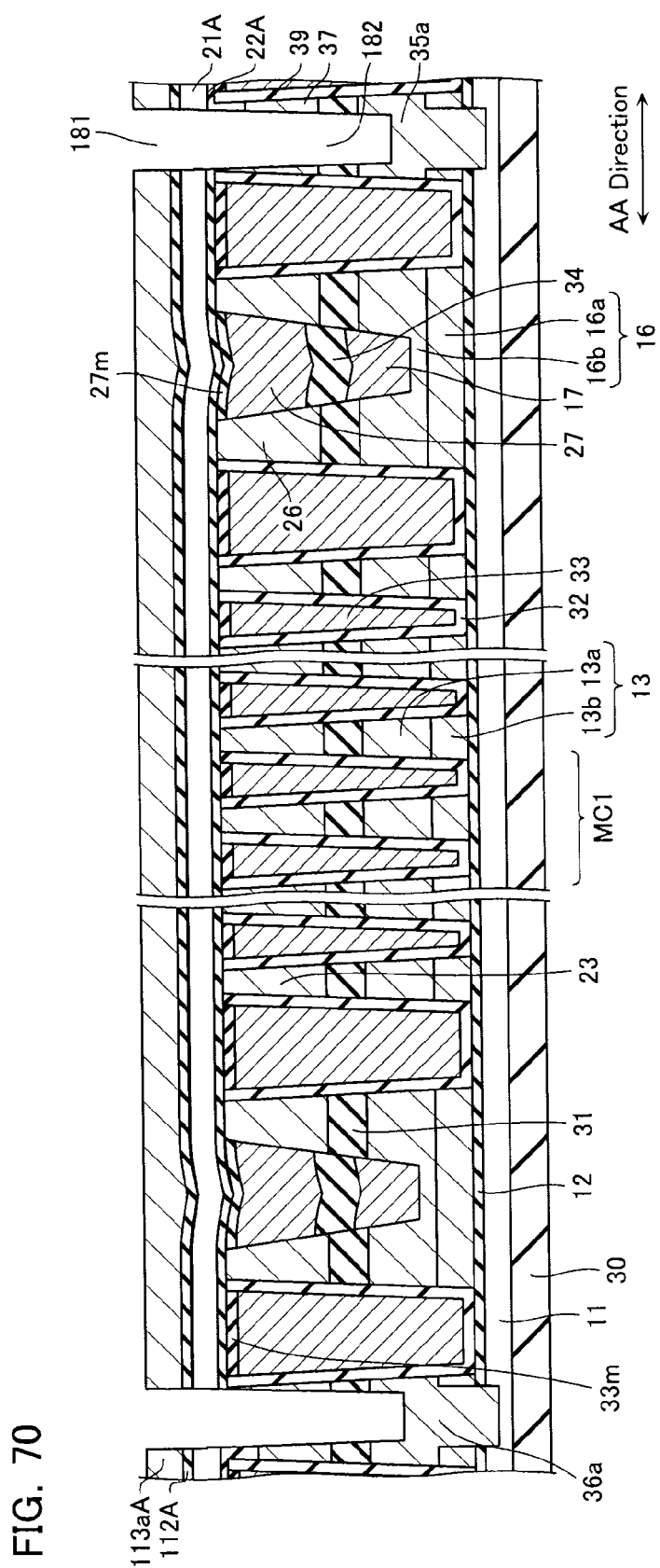
FIG. 70 is a cross-sectional diagram illustrating a step of manufacturing the memory cell array.
Figure 71:
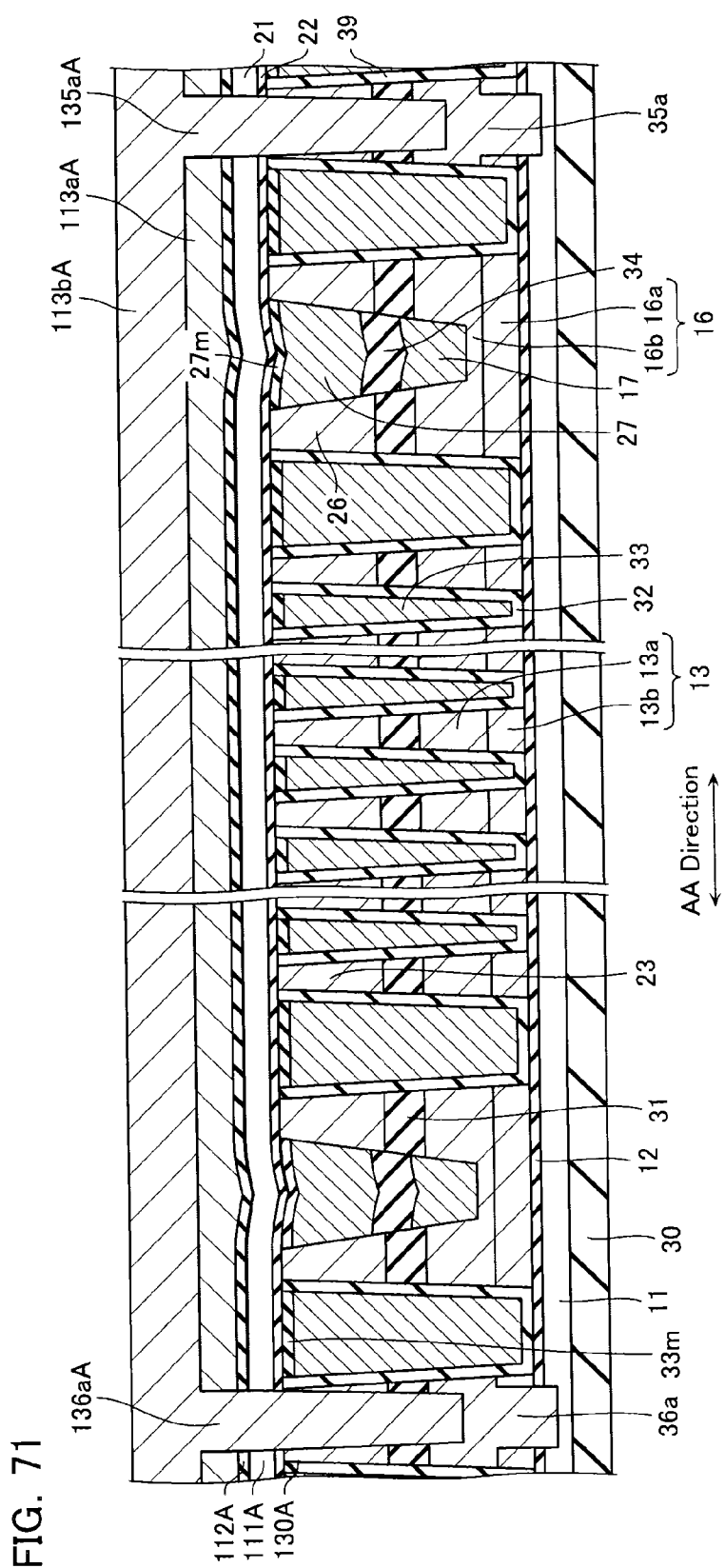
FIG. 71 is a cross-sectional diagram illustrating a step of manufacturing the memory cell array.

Subsequently, as illustrated in FIG. 70, fifth trenches 181 extending in the GC direction are formed through the surfaces of the fourth gate forming layer 113aA, the third gate insulating film 112A, and the second semiconductor layer 21A. The fifth trenches 181 extending in the GC direction are formed, and further, a via hole 182 is formed on the bottom surface of the fifth trench 181. The via holes 182 are provided so that the via holes 182 penetrate through the first insulating film 31 and the upper surfaces of the lower contacts 35a, 36a are exposed. Subsequently, as illustrated in FIG. 71, a fifth gate forming layer 113bA is formed in a portion of the surface of the fourth floating gate forming layer 113aA and the second semiconductor layer 21A that is exposed by the fifth trench 181 and a portion of the contacts 35a, 36a that is exposed by the via hole 182.

Figure 72:
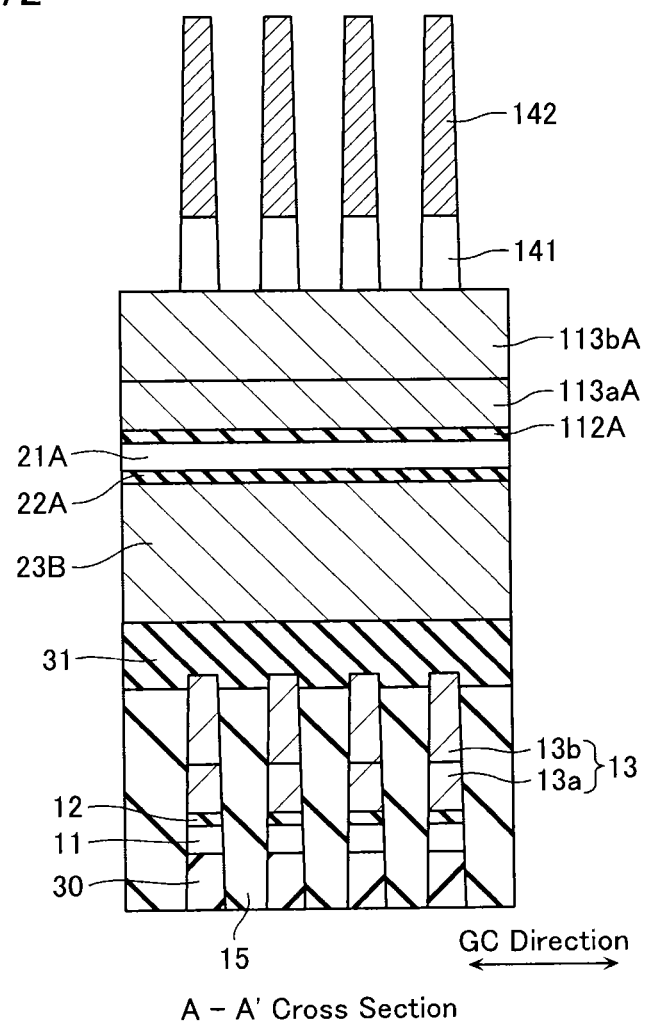
FIG. 72 is a cross-sectional diagram illustrating a step of manufacturing the memory cell array.
Figure 73:
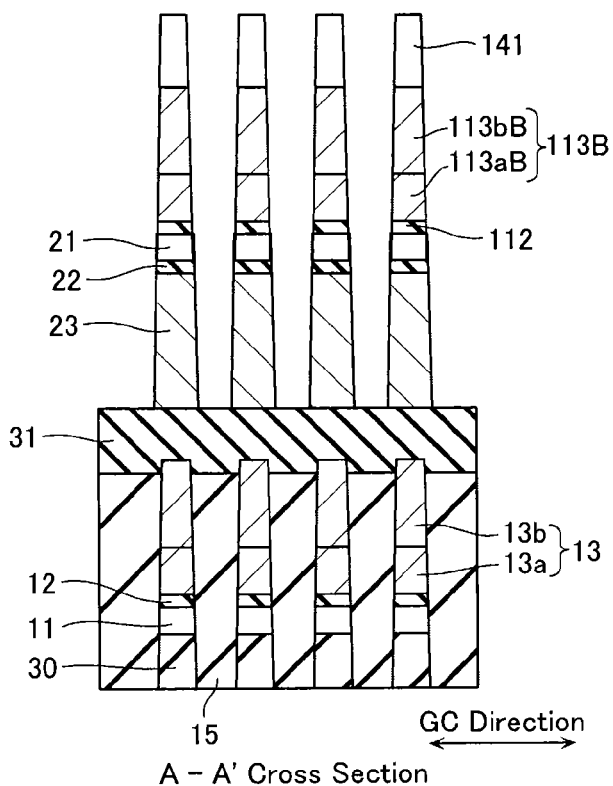
FIG. 73 is a cross-sectional diagram illustrating a step of manufacturing the memory cell array.

After the layers up to the fifth gate forming layer 113bA are formed, mask materials 141, 142 for AA pattern formation made of, e.g., SiN and SiO2 are patterned onto the fifth gate forming layer 113bA, just as shown in FIG. 72. Subsequently, RIE (Reactive Ion Etching) using the mask materials 141 and 142 is carried out to selectively etch the stack of layers to the bottom of the third floating gate forming layer 23B to form sixth trenches, thereby forming the AA pattern as shown in FIG. 73. As a result, the fifth gate forming layer 113B, the third gate insulating film 112, the second semiconductor layer 21, the second insulating film 22, and the second floating gate 23 are formed.

Figure 74:
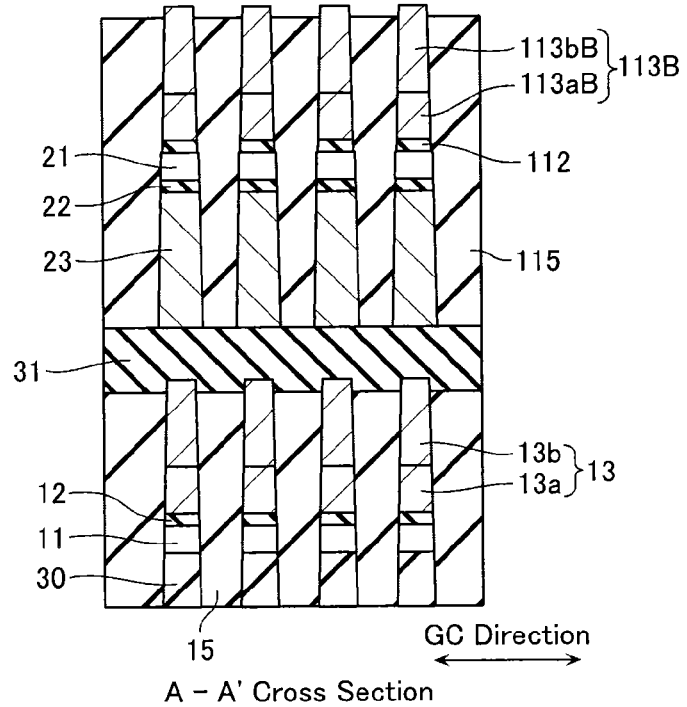
FIG. 74 is a cross-sectional diagram illustrating a step of manufacturing the memory cell array.

Subsequently, as illustrated in FIG. 74, the sixth trenches formed by the AA pattern formation are filled with the third element isolating insulating film 115 made of SiO2, and using the polysilicon forming the fifth gate forming layer 113B as a stopper, planarizing process is performed with CMP (Chemical Mechanical Polishing). Further, the upper surface of the third element isolating insulating film 115 is set back by etch back. Thereafter, the manufacturing process is done according to substantially the same steps as a portion of the steps of manufacturing according to the second embodiment which has been explained using FIGS. 53 to 63A to 63C.

According to the above method, the contacts can be easily formed between the cell array layers even in the memory cell arrays having the stacked structure.

5. Others

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell array in which a plurality of NAND cell units are arranged in a second direction intersecting a first direction, the NAND cell units including a plurality of memory cells connected in series in the first direction, source line side select gate transistors which are connected between the plurality of memory cells and the source line, and bit line side select gate transistors which are connected between the plurality of memory cells and the bit line, the memory cell including a semiconductor layer, a gate insulating film formed on the semiconductor layer, a charge accumulation layer formed on the gate insulating film, and a control gate which extends in the second direction and which faces the charge accumulation layer via an inter-gate insulating film; and
    a control circuit for writing data to the memory cell in units of pages, the plurality of memory cells being arranged in the second direction as a page,
    during write operation to the plurality of memory cells in units of pages, the control circuit adjusts a write condition of each of the memory cells in accordance with write data to each of the memory cells and write data to a memory cell adjacent to each of the memory cells in a page to be written.

2. The nonvolatile semiconductor memory device according to claim 1, wherein
    the control circuit further includes a comparator for detecting write data of the plurality of selected memory cells included in the page to which the data are written and
    the control circuit adjusts the write condition in accordance with an output of the comparator.

3. The nonvolatile semiconductor memory device according to claim 2,
    wherein the control circuit measures a write speed of the memory cell, and in accordance with a result thereof, the memory cell is divided into a plurality of groups, and in accordance with the groups, the write condition is adjusted.

4. The nonvolatile semiconductor memory device according to claim 3,
    wherein a writing voltage assigned when a piece of data is written to a memory cell which belongs to one group overlaps with the writing voltage assigned when another piece of data is written to a memory cell which belongs to another group.

5. The nonvolatile semiconductor memory device according to claim 1,
    wherein during the write operation to the plurality of memory cells in units of pages, the control circuit adjusts a verify condition of each of the memory cells in accordance with write data to a memory cell adjacent to each of the memory cells within a page to be written.

6. The nonvolatile semiconductor memory device according to claim 1,
    wherein the control gate is provided at both sides of the charge accumulation layer in the first direction via the inter-gate insulating film.

7. The nonvolatile semiconductor memory device according to claim 5,
    wherein when a threshold value level of write data to a memory cell adjacent to the selected memory cell in the second direction is higher, the control circuit reduces a write verification level of the selected memory cell.

8. A nonvolatile semiconductor memory device comprising:
    a first memory cell array layer including first NAND cell units having a plurality of first memory cells connected in series in a first direction, the first memory cell including a first semiconductor layer, a first gate insulating film formed on the first semiconductor layer, and a first charge accumulation layer formed on the first gate insulating film;
    a first insulating film formed on the first memory cell array layer;
    a second memory cell array layer formed on the first insulating film and including second NAND cell units having a plurality of second memory cells connected in series in the first direction, and the second memory cell including a second charge accumulation layer, a second gate insulating film formed on the second charge accumulation layer, and a second semiconductor layer formed on the second gate insulating film;

control gates formed via an inter-gate insulating film at both sides, in the first direction, of the first and second charge accumulation layers positioned the latter above the former via the first insulating film, the control gate extending in a second direction intersecting the first direction;

lower contacts located at both ends of the first NAND cell unit, the lower contacts being formed in a same layer as the first charge accumulation layer, and being connected to the first semiconductor layer; and upper contacts located at both ends of the second NAND cell unit, the second semiconductor layer and the lower contact being connected by the upper contact.

9. The nonvolatile semiconductor memory device according to claim 8, wherein the lower contact is connected to the first semiconductor layer via a first trench extending in the second direction and provided, in the first gate insulating film and in surfaces of the first semiconductor layer, the lower contacts are formed with a same cycle and in a same linear manner as the first semiconductor layer via a first element isolating insulating film for isolating the first NAND cell units from each other in the second direction, and the lower contact is formed using a same material as the first charge accumulation layer.

10. The nonvolatile semiconductor memory device according to claim 9, wherein one or more other NAND cell units are stacked on the second NAND cell unit, and the upper contact is connected to the first semiconductor layer of the other NAND cell unit.

11. A method for manufacturing a nonvolatile semiconductor device comprising:

forming a first gate insulating film and a first gate forming layer on a first semiconductor layer;

forming a first trench, which extends in a second direction intersecting a first direction, in the first gate forming layer, the first gate insulating film, and the first semiconductor layer;

forming a second gate forming layer on a surface of the first gate forming layer and a surface of the first semiconductor layer exposed from the first trench;

forming second trenches, extending in the first direction with a certain cycle in the second direction, in the second gate forming layer, the first gate forming layer, the first gate insulating film, and the first semiconductor layer;

filling a first element isolating insulating film in the second trenches, and forming a first insulating film on the first gate forming layer and the first element isolating insulating film;

forming a third gate forming layer on the first insulating film;

forming a plurality of third trenches, extending in the second direction, in the third gate forming layer, the first insulating film, the second gate forming layer, and the first gate forming layer, and forming a first charge accumulation layer, a first select gate, and a lower contact in the first and second gate forming layers; and filling control gates in the third trenches after an inter-gate insulating film is formed in the third trenches.

12. The method for manufacturing a nonvolatile semiconductor device according to claim 11, wherein after the control gates are filled in the third trenches, the following steps are performed:

forming fourth trenches, extending in the second direction, in the third gate forming layer, the first insulating film, and the second gate forming layer at a position corresponding to the first select gate, so that the first gate forming layer remains between the first gate insulating film and the fourth trenches;

successively filling a first select gate line, a second insulating film, and a second select gate line in the fourth trenches so that the first insulating film and the second insulating film are continuous in the first direction;

forming a second gate insulating film and a second semiconductor layer above the third gate forming layer and the control gates;

forming fifth trenches, extending in the first direction with a predetermined cycle in the second direction, in the second semiconductor layer, the second gate insulating film, and the third gate forming layer, and forming a second charge accumulation layer, a second select gate, and an upper contact layer in the third gate forming layer;

forming via holes in the second semiconductor layer, the second gate insulating film, the upper contact layer, the first insulating film, and the lower contact; and filling the via holes with upper contacts.

13. A nonvolatile semiconductor memory device comprising:

a first memory cell array layer including first NAND cell units having a plurality of first memory cells connected in series in a first direction, first source line side select gate transistors which are connected between the plurality of first memory cells and the source line, and first bit line side select gate transistors which are connected between the plurality of first memory cells and the bit line, the first memory cell including a first semiconductor layer, a first gate insulating film formed on the first semiconductor layer, and a first charge accumulation layer formed on the first gate insulating film, the first source line side select gate transistor and the first bit line side select gate transistor including the first semiconductor layer, the first gate insulating film, and a first select gate formed on the first gate insulating film;

a first insulating film formed on the first memory cell array layer;

a second memory cell array layer formed on the first insulating film and including second NAND cell units having a plurality of second memory cells connected in series in the first direction, second source line side select gate transistors which are connected between the plurality of second memory cells and the source line, and second bit line side select gate transistors which are connected between the plurality of second memory cells and the bit line, the second memory cell including a second charge accumulation layer, a second gate insulating film formed on the second charge accumulation layer, and a second semiconductor layer formed on the second gate insulating film, the second source line side select gate transistor and the second bit line side select gate transistor including the second select gate, the second gate insulating film, the second semiconductor layer formed on the second gate insulating film;

control gates formed via an inter-gate insulating film at both sides, in the first direction, of the first and second charge accumulation layers positioned the latter above the former via the first insulating film, the control gate extending in a second direction intersecting the first direction; and an auxiliary gate formed via the inter-gate insulating film at both sides, in the first direction, of the first and second select gates positioned the latter above the former via the first insulating film, the control gate extending in the second direction, a auxiliary transistor being constituted by the first and second semiconductor layers, the first and second gate insulating films, and the auxiliary gate.

14. The nonvolatile semiconductor memory device according to claim 13,
wherein the auxiliary gate includes:
a first auxiliary gate serving as a gate of a first auxiliary transistor, the first auxiliary gate formed via an inter-gate insulating film between the source line and the first and second select gates at the side of the source line, and extending in the second direction;
a second auxiliary gate serving as a gate of a second auxiliary transistor, the second auxiliary gate formed via the inter-gate insulating film between the first and second select gates at the side of the source line and the plurality of first and second memory cells, and extending in the second direction;
a third auxiliary gate serving as a gate of a third auxiliary transistor, the third auxiliary gate formed via the inter-gate insulating film between the plurality of first and second memory cells and the first and second select gates at the side of the bit line, and extending in the second direction; and
a fourth auxiliary gate serving as a gate of a fourth auxiliary transistor, the fourth auxiliary gate formed via the inter-gate insulating film between the first and second select gates at the side of the bit line and the bit line, and extending in the second direction.

15. The nonvolatile semiconductor memory device according to claim 14,
wherein during write operation, a first voltage is applied to the first auxiliary gate so as to turnoff the first auxiliary transistor, a second voltage is applied to the third and fourth auxiliary gates to turn on the third and fourth auxiliary transistors, and a voltage between the first voltage and the second voltage is applied to the second auxiliary gate.

16. The nonvolatile semiconductor memory device according to claim 14,
wherein during read operation or write operation, a first auxiliary transistor of a NAND cell unit adjacent to a NAND cell unit to be subjected to the read operation or the write operation via the source line is changed to OFF state.

17. The nonvolatile semiconductor memory device according to claim 13, comprising:
lower contacts located at both ends of the first NAND cell unit, and formed in a same layer as the first charge accumulation layer, the lower contacts being connected to the first semiconductor layer; and
upper contacts located at both ends of the second NAND cell unit, the upper contacts connecting between the second semiconductor layer and the lower contacts.

18. A method for manufacturing a nonvolatile semiconductor memory device comprising:
forming a first gate insulating film and a charge accumulation layer forming layer on a first semiconductor layer;
forming trenches extending, in a first direction with a certain interval in a second direction intersecting the first direction, in the charge accumulation layer forming layer, the first gate insulating film, and the first semiconductor layer, and filling a first element isolating insulating film;
forming a first insulating film on the charge accumulation layer forming layer and the first element isolating insulating film;

further forming a charge accumulation layer forming layer on the first insulating film;
forming a plurality of trenches, extending in the second direction, in the first insulating film and the charge accumulation layer forming layer formed via the first insulating film, and covering the trenches with an inter-gate insulating film; and
filling a control gate and an auxiliary gate into the inter-gate insulating film.

19. The method for manufacturing a nonvolatile semiconductor device according to claim 18,
wherein a charge accumulation layer forming layer formed on the first semiconductor layer together with the first gate insulating film includes the first gate forming layer and the second gate forming layer which are made by:
forming a first gate forming layer on the first gate insulating film;
forming a first trench, extending in a second direction perpendicular to the first direction, in the first gate forming layer, the first gate insulating film, and the first semiconductor layer; and
forming a second gate forming layer on a surface of the first gate forming layer and a surface of the first semiconductor layer exposed from the first trench,
wherein the trenches formed in a charge accumulation layer forming layer formed on the first semiconductor layer together with the first gate insulating film are second trenches, extending in the first direction formed with a certain cycle in the second direction, in the second gate forming layer, the first gate forming layer, the first gate insulating film, and the first semiconductor layer,
when a charge accumulation layer forming layer formed on the first insulating film is a third gate forming layer, the trenches formed in the first insulating film and the third gate forming layer are a plurality of third trenches formed in the third gate forming layer, the first insulating film, the second gate forming layer, and the first gate forming layer and extending in the second direction, and
a control gate and an auxiliary gate are filled into the inter-gate insulation film.

20. The method for manufacturing a nonvolatile semiconductor device according to claim 19,
wherein after control gates are filled in the third trenches, forming a fourth trench, extending in the second direction, in the third gate forming layer, the first insulating film, and the second gate forming layer at a position corresponding to a first select gate, so that the first gate forming layer remains between the first gate insulating film and the fourth trench;
successively filling a first select gate line, a second insulating film, and a second select gate line in the fourth trenches so that the first insulating film and the second insulating film are continuous in the first direction;
forming a second gate insulating film and a second semiconductor layer above the third gate forming layer and the control gates;
forming fifth trenches, extending in the first direction with a predetermined cycle in the second direction, in the second semiconductor layer, the second gate insulating film, and the third gate forming layer, and forming a second charge accumulation layer, a second select gate, and an upper contact layer in the third gate forming layer; and
forming via holes in the second semiconductor layer, the second gate insulating film, the upper contact layer, the first insulating film, and lower contacts, and filling the via holes with upper contacts.

* * * * *